US012632718B2

(12) United States Patent
Ohshita et al.

(10) Patent No.: US 12,632,718 B2
(45) Date of Patent: May 19, 2026

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Satoru Ohshita, Kanagawa (JP); Hiromichi Godo, Kanagawa (JP); Yoshiyuki Kurokawa, Kanagawa (JP); Yuto Yakubo, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 17 days.

(21) Appl. No.: 18/855,907

(22) PCT Filed: Apr. 14, 2023

(86) PCT No.: PCT/IB2023/053817
§ 371 (c)(1),
(2) Date: Oct. 10, 2024

(87) PCT Pub. No.: WO2023/209485
PCT Pub. Date: Nov. 2, 2023

(65) Prior Publication Data
US 2025/0232167 A1 Jul. 17, 2025

(30) Foreign Application Priority Data

Apr. 29, 2022 (JP) ................................. 2022-075581

(51) Int. Cl.
*G06N 3/065* (2023.01)
*H01L 25/065* (2023.01)
(Continued)

(52) U.S. Cl.
CPC ......... *G06N 3/065* (2023.01); *H01L 25/0657* (2013.01); *H03K 17/6871* (2013.01);
(Continued)

(58) Field of Classification Search
CPC ...... H03K 17/51; H03K 17/56; H03K 17/687; H03K 17/6871; H01L 25/00; H01L 25/03;
(Continued)

(56) References Cited

U.S. PATENT DOCUMENTS 10,733,946 B2 8/2020 Kurokawa
11,404,016 B2 8/2022 Kurokawa
(Continued)

FOREIGN PATENT DOCUMENTS

JP 2018-036639 A 3/2018
JP 2019-046375 A 3/2019

OTHER PUBLICATIONS

International Search Report (Application No. PCT/IB2023/053817) Dated Jun. 20, 2023.
(Continued)

*Primary Examiner* — Long Nguyen
(74) *Attorney, Agent, or Firm* — NIXON PEABODY LLP; Jeffrey L. Costellia

(57) ABSTRACT

A semiconductor device with a small circuit scale and reduced power consumption is provided. The semiconductor device includes first to fifth circuits. Each of the first to fourth circuits includes first and second cells, a sixth circuit, first and second current generation circuits, a first input terminal, and a second output terminal. The first circuit to the fourth circuit are electrically connected to each other in a ring, and the first circuit is electrically connected to the fifth circuit. In each of the first to fourth circuits, the first cell is electrically connected to the second cell through the first
(Continued)

wiring, the first current generation circuit, and the third wiring, and is electrically connected to the first input terminal and the sixth circuit through the second wiring. The second cell is electrically connected to the first output terminal through the second current generation circuit. Note that the first current generation circuit functions as a current mirror circuit, and the second current generation circuit functions as an arithmetic circuit of a function system. The first cell performs an arithmetic operation of a product, and the second cell retains the result of the arithmetic operation.

15 Claims, 34 Drawing Sheets

(51) Int. Cl.
| | |
|---|---|
| *H03K 17/687* | (2006.01) |
| *H10D 80/20* | (2025.01) |
| *H10D 62/80* | (2025.01) |

(52) U.S. Cl.
CPC ......... *H10D 80/215* (2025.01); *H10D 80/251* (2025.01); *H10D 62/875* (2025.01)

(58) Field of Classification Search
CPC ..... H01L 25/04; H01L 25/041; H01L 25/042; H01L 25/065; H01L 25/0652; H01L 25/0655; H01L 25/00657; H10D 62/875; H10D 80/215; H10D 80/251; G06N 3/06; G06N 3/063; G06N 3/065; H10B 12/00; H10B 41/70; G06F 12/00; G06G 7/26; G06G 7/60; G11C 5/02; G11C 5/04; G11C 11/54
See application file for complete search history.

(56) References Cited

U.S. PATENT DOCUMENTS

| | | | | |
|---|---|---|---|---|
| 2023/0326491 A1* | 10/2023 | Aoki | ........................ | G11C 5/10 |
| | | | | 365/65 |
| 2025/0280531 A1* | 9/2025 | Ohshita | ................... | G06F 12/00 |

OTHER PUBLICATIONS

Written Opinion (Application No. PCT/IB2023/053817) Dated Jun. 20, 2023.

Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.

Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

Seo.J et al., "ARCHON: A 332.7TOPS/W 5b Variation-Tolerant Analog CNN Processor Featuring Analog Neuronal Computation Unit and Analog Memory", ISSCC 2022 (Digest of Technical Papers. IEEE International Solid-State Circuits Conference), Feb. 20, 2022, pp. 258-259.

* cited by examiner

FIG. 8A
CS1
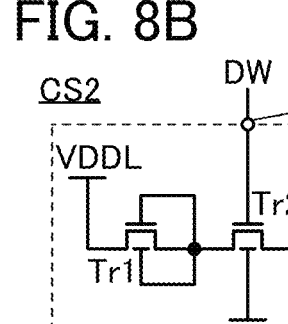
FIG. 8B
CS2
FIG. 8C
CS3
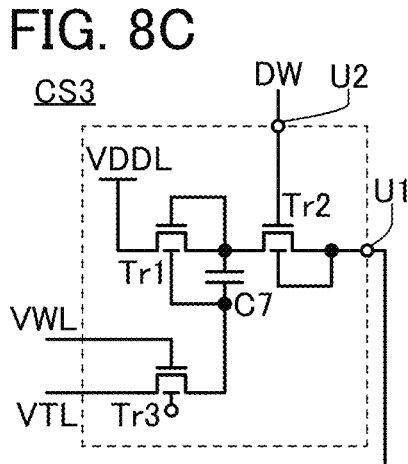
FIG. 8D
CS4
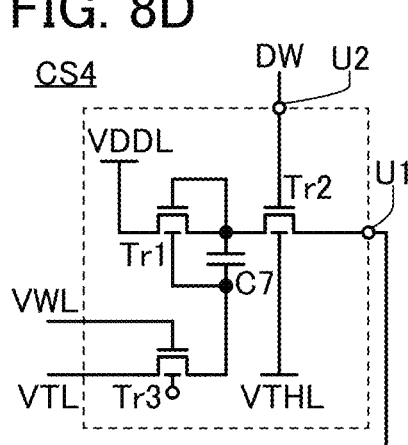

CDV

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus (including a liquid crystal display apparatus), a light-emitting apparatus, a power storage device, an image capturing device, a memory device, a signal processing device, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate the brain mechanism as electronic circuits and include circuits corresponding to "neurons" and "synapses" of the human brain. Such integrated circuits may therefore be referred to as "neuromorphic", "brain-morphic", or "brain-inspired" circuits, for example. The integrated circuits have a non-von Neumann architecture and are expected to be able to perform parallel processing with extremely low power consumption as compared with a von Neumann architecture, which consumes higher power with increasing processing speed.

An information processing model that imitates a biological neural network including "neurons" and "synapses" is referred to as an artificial neural network (ANN). For example, Non-Patent Document 1 and Non-Patent Document 2 each disclose an arithmetic device including an artificial neural network constructed using an SRAM (Static Random Access Memory).

An attempt has been made to use an arithmetic device in which an artificial neural network is constructed, for example, for correction of images to be displayed by a display apparatus. For example, in a display apparatus disclosed in Patent Document 1, an arithmetic circuit in which an artificial neural network is constructed is used to adjust the luminance, tone, and the like of displayed images in accordance with the preference of the person who watches the images.

REFERENCES

Patent Document

[Patent Document 1] Japanese Published Patent Application No. 2018-36639

Non-Patent Documents

[Non-Patent Document 1] M. Kang et al., "IEEE Journal Of Solid-State Circuits", 2018, Volume 53, No. 2, p. 642-655.

[Non-Patent Document 2] J. Zhang et al., "IEEE Journal Of Solid-State Circuits", 2017, Volume 52, No. 4, p. 915-924.

SUMMARY OF THE INVENTION

Problems to be Solved by the Invention

Examples of an arithmetic circuit in which an artificial neural network is constructed include an arithmetic circuit (hereinafter sometimes referred to as analog product-sum operation circuit) that performs a product-sum operation by yielding the sum of analog currents each corresponding to the product of a weight coefficient and input data. Since the arithmetic circuit uses analog currents for an arithmetic operation, the circuit scale can be smaller than that of an arithmetic circuit formed of a digital circuit, and the circuit area can be small. Furthermore, the arithmetic circuit can have lower power consumption when designed such that the analog current used in the arithmetic operation becomes lower.

On another note, in the case of using the above-described analog product-sum operation circuit, digital data to be input to the analog product-sum operation circuit needs to be converted into an analog current. Since the arithmetic operation result of the analog product-sum operation circuit is output as analog data, the analog data needs to be converted into digital data in the case where the arithmetic operation result is used by a digital circuit. That is, using the analog product-sum operation circuit necessitates a digital-analog converter circuit (a digital voltage (signal)-analog current converter circuit, IDAC) and an analog-digital converter circuit (ADC).

In particular, since an artificial neural network sometimes performs a product-sum operation a plurality of times, digital-analog conversion and analog-digital conversion are performed every time a product-sum operation is performed. Thus, the conversion processing may consume high power. In the case where a product-sum operation is performed a plurality of times, a plurality of analog product-sum operation circuits are preferably used, in which case, however, as many digital-analog converter circuits and as many analog-digital converter circuits as the analog product-sum operation circuits are needed, and thus, the circuit area is increased in some cases.

An object of one embodiment of the present invention is to provide a semiconductor device with reduced power consumption. Another object of one embodiment of the present invention is to provide a semiconductor device with a small circuit area. Another object of one embodiment of the present invention is to provide a semiconductor device capable of performing arithmetic operations successively. Another object of one embodiment of the present invention is to provide a novel semiconductor device. Another object of one embodiment of the present invention is to provide an electronic device that includes the above semiconductor device.

Note that the objects of one embodiment of the present invention are not limited to the above objects. The above objects do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the above objects and the other objects. Note that one embodiment of the present invention does not necessarily achieve all of the above objects and the other objects.

Means for Solving the Problems (1)

One embodiment of the present invention is a semiconductor device including a first circuit, a second circuit, a third circuit, a fourth circuit, and a fifth circuit. Each of the first circuit, the second circuit, the third circuit, and the fourth circuit includes a first cell, a second cell, a sixth circuit, a first current generation circuit, a second current generation circuit, a first input terminal, and a first output terminal. The first current generation circuit includes a second input terminal and a second output terminal. The second current generation circuit includes a third input terminal and a third output terminal. The fifth circuit includes a fourth input terminal and a fourth output terminal. The first circuit includes a fifth output terminal.

The first output terminal of the first circuit is electrically connected to the first input terminal of the second circuit. The first output terminal of the second circuit is electrically connected to the first input terminal of the third circuit. The first output terminal of the third circuit is electrically connected to the first input terminal of the fourth circuit. The first output terminal of the fourth circuit is electrically connected to the first input terminal of the first circuit. The fifth output terminal of the first circuit is electrically connected to the fourth input terminal of the fifth circuit.

In each of the first circuit, the second circuit, the third circuit, and the fourth circuit, the first cell is electrically connected to the second input terminal of the first current generation circuit through the first wiring. The first cell is also electrically connected to the sixth circuit and the first input terminal through the second wiring. The second cell is electrically connected to the second output terminal of the first current generation circuit and the third input terminal of the second current generation circuit through the third wiring. The third output terminal of the second current generation circuit is electrically connected to the first output terminal.

In each of the first circuit, the second circuit, the third circuit, and the fourth circuit, the sixth circuit has a function of generating a first current and outputting the first current to the second wiring. The first cell has a function of retaining a potential corresponding to first data. The first cell has a function of generating a third current with an amount corresponding to a product of a value of the first data and a value corresponding to the first current flowing from the sixth circuit to the second wiring or a second current flowing from the first input terminal to the second wiring and outputting the third current to the first wiring. The first current generation circuit has a function of outputting, as a current mirror circuit, to the second output terminal, a fourth current with an amount corresponding to the amount of the third current flowing through the second input terminal. The second cell has a function of retaining a first potential corresponding to the fourth current. The second cell has a function of generating a fifth current corresponding to the first potential and outputting the fifth current to the third wiring. The second current generation circuit has a function of outputting, as an arithmetic circuit of a function system, to the third output terminal, a sixth current with an amount corresponding to an amount of the fifth current flowing through the third input terminal.

The fifth circuit has a function of outputting, to the fourth output terminal, a digital potential corresponding to an amount of a current flowing through the fourth input terminal. In the first circuit, the second cell is electrically connected to the fifth output terminal through the third wiring.

(2)

Another embodiment of the present invention may have the structure of (1) above in which each of the first circuit, the second circuit, the third circuit, and the fourth circuit includes a first switching circuit, and the first circuit includes a second switching circuit.

Specifically, the first switching circuit preferably includes a first terminal, a second terminal, and a third terminal. The second switching circuit preferably includes a fourth terminal, a fifth terminal, and a sixth terminal.

In each of the first circuit, the second circuit, the third circuit, and the fourth circuit, it is preferable that the first terminal of the first switching circuit be electrically connected to the second wiring, the second terminal of the first switching circuit be electrically connected to the sixth circuit, and the third terminal of the first switching circuit be electrically connected to the first input terminal.

In the first circuit, it is preferable that the fourth terminal of the second switching circuit be electrically connected to the third wiring, the fifth terminal of the second switching circuit be electrically connected to the third input terminal of the second current generation circuit, and the sixth terminal of the second switching circuit be electrically connected to the fifth output terminal.

(3)

Another embodiment of the present invention may have the structure of (2) above in which each of the first circuit, the second circuit, the third circuit, and the fourth circuit includes a seventh circuit. In particular, in each of the first circuit, the second circuit, the third circuit, and the fourth circuit, it is preferable that the seventh circuit be electrically connected to the first wiring. It is preferable that the seventh circuit have a function of making a seventh current corresponding to the first data flow to the first cell.

(4)

Another embodiment of the present invention may have the structure of (3) above including a first substrate and a second substrate positioned below the first substrate. In particular, it is preferable that the first circuit and the third circuit be positioned over the first substrate, and the second circuit and the fourth circuit be positioned over the second substrate. It is preferable that the second circuit overlap with part of the first circuit and part of the third circuit, and the fourth circuit overlap with part of the first circuit and part of the third circuit.

(5) Another embodiment of the present invention may have the structure of (4) above in which each of the first circuit, the second circuit, the third circuit, and the fourth circuit includes a first layer and a second layer positioned above the first layer. In particular, it is preferable that in each of the first circuit, the second circuit, the third circuit, and the fourth circuit, the first layer include the sixth circuit, the first current generation circuit, and the second current generation circuit, and the second layer include the first cell and the second cell.

(6)

Another embodiment of the present invention may have the structure of (5) above including a third cell. In particular, it is preferable that each of the first cell and the third cell include a first transistor, a second transistor, and a first capacitor.

In particular, in each of the first cell and the second cell, it is preferable that one of a source and a drain of the first transistor be electrically connected to a gate of the second transistor, one of a source and a drain of the second transistor be electrically connected to one of the source and the drain of the first transistor, and one of a pair of terminals of the first capacitor be electrically connected to the gate of the second transistor.

In the first cell, it is preferable that the other of the source and the drain of the first transistor be electrically connected to the first wiring, and the other of the pair of terminals of the first capacitor be electrically connected to the second wiring. In the third cell, it is preferable that the other of the source and the drain of the first transistor be electrically connected to the second wiring, and the other of the pair of terminals of the first capacitor be electrically connected to the second wiring.

A channel formation region of each of the first transistor and the second transistor preferably includes a first oxide semiconductor. The first oxide semiconductor preferably includes one or more selected from indium, zinc, and an element M. The element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony.

(7)

Another embodiment of the present invention may have the structure of (6) above in which the second cell includes a third transistor, a fourth transistor, a fifth transistor, and a second capacitor.

In particular, in the second cell, it is preferable that one of a source and a drain of the third transistor be electrically connected to a gate of the fourth transistor, one of a source and a drain of the fourth transistor be electrically connected to one of a source and a drain of the fifth transistor, the other of the source and the drain of the fifth transistor be electrically connected to the other of the source and the drain of the third transistor, one of a pair of terminals of the second capacitor be electrically connected to the gate of the fourth transistor, and the other of the source and the drain of the third transistor be electrically connected to the third wiring.

A channel formation region of each of the third transistor, the fourth transistor, and the fifth transistor preferably includes a second oxide semiconductor. The second oxide semiconductor preferably includes one or more selected from indium, zinc, and the element M described in (6).

(8)

Another embodiment of the present invention is a semiconductor device that includes a first circuit, a second circuit, a third circuit, a fourth circuit, and a fifth circuit, and has a structure different from that of (1) above. Each of the first circuit, the second circuit, the third circuit, and the fourth circuit includes a first cell, a second cell, a sixth circuit, a first current generation circuit, a second current generation circuit, a first input terminal, and a first output terminal. The first current generation circuit includes a second input terminal and a second output terminal. The second current generation circuit includes a third input terminal and a third output terminal. The fifth circuit includes a fourth input terminal and a fourth output terminal. The fourth circuit includes a fifth output terminal.

The first output terminal of the first circuit is electrically connected to the first input terminal of the second circuit. The first output terminal of the second circuit is electrically connected to the first input terminal of the third circuit. The first output terminal of the third circuit is electrically connected to the first input terminal of the fourth circuit. The fifth output terminal of the fourth circuit is electrically connected to the fourth input terminal of the fifth circuit.

In each of the first circuit, the second circuit, the third circuit, and the fourth circuit, the first cell is electrically connected to the second input terminal of the first current generation circuit through the first wiring. The first cell is electrically connected to the sixth circuit and the first input terminal through the second wiring. The second cell is electrically connected to the second output terminal of the first current generation circuit and the third input terminal of the second current generation circuit through the third wiring. The third output terminal of the second current generation circuit is electrically connected to the first output terminal.

In each of the first circuit, the second circuit, the third circuit, and the fourth circuit, the sixth circuit has a function of generating a first current and outputting the first current to the second wiring. The first cell has a function of retaining a potential corresponding to first data. The first cell has a function of generating a third current with an amount corresponding to a product of a value of the first data and a value corresponding to the first current flowing from the sixth circuit to the second wiring or a second current flowing from the first input terminal to the second wiring and outputting the third current to the first wiring. The first current generation circuit has a function of outputting, as a current mirror circuit, to the second output terminal, a fourth current with an amount corresponding to the amount of the third current flowing through the second input terminal. The second cell has a function of retaining a first potential corresponding to the fourth current. The second cell has a function of generating a fifth current corresponding to the first potential and outputting the fifth current to the third wiring. The second current generation circuit has a function of outputting, as an arithmetic circuit of a function system, to the third output terminal, a sixth current with an amount corresponding to an amount of the fifth current flowing through the third input terminal.

The fifth circuit has a function of outputting, to the fourth output terminal, a digital potential corresponding to an amount of a current flowing through the fourth input terminal. In the fourth circuit, the second cell is electrically connected to the fifth output terminal through the third wiring.

Another embodiment of the present invention may have the structure of (8) above in which each of the first circuit, the second circuit, the third circuit, and the fourth circuit includes a first switching circuit, and the fourth circuit includes a second switching circuit.

Specifically, the first switching circuit preferably includes a first terminal, a second terminal, and a third terminal, and the second switching circuit preferably includes a fourth terminal, a fifth terminal, and a sixth terminal.

In each of the first circuit, the second circuit, the third circuit, and the fourth circuit, it is preferable that the first terminal of the first switching circuit be electrically connected to the second wiring, the second terminal of the first switching circuit be electrically connected to the sixth circuit, and the third terminal of the first switching circuit be electrically connected to the first input terminal.

In the fourth circuit, it is preferable that the fourth terminal of the second switching circuit be electrically connected to the third wiring, the fifth terminal of the second switching circuit be electrically connected to the third input terminal of the second current generation circuit, and the sixth terminal of the second switching circuit be electrically connected to the fifth output terminal.

(10)

Another embodiment of the present invention may have the structure of (9) above in which each of the first circuit, the second circuit, the third circuit, and the fourth circuit includes a seventh circuit. In particular, in each of the first circuit, the second circuit, the third circuit, and the fourth circuit, it is preferable that the seventh circuit be electrically connected to the first wiring. It is preferable that the seventh circuit have a function of making a seventh current corresponding to the first data flow to the first cell.

(11)

Another embodiment of the present invention may have the structure of (10) above including a first substrate, a second substrate positioned above the first substrate, a third substrate positioned above the second substrate, and a fourth substrate positioned above the third substrate. In particular, it is preferable that the first circuit be positioned over the first substrate, the second circuit be positioned over the second substrate, the third circuit be positioned over the third substrate, and the fourth circuit be positioned over the fourth substrate. It is preferable that part of the second circuit overlap with part of the first circuit, part of the third circuit overlap with part of the second circuit, part of the fourth circuit overlap with part of the third circuit, and part of the first circuit overlap with part of the fourth circuit.

(12)

Another embodiment of the present invention may have the structure of (11) above in which each of the first circuit, the second circuit, the third circuit, and the fourth circuit includes a first layer and a second layer positioned above the first layer. In particular, it is preferable that in each of the first circuit, the second circuit, the third circuit, and the fourth circuit, the first layer include the sixth circuit, the first current generation circuit, and the second current generation circuit, and the second layer include the first cell and the second cell.

(13)

Another embodiment of the present invention may have the structure of (12) above including the third cell. In particular, it is preferable that each of the first cell and the third cell include a first transistor, a second transistor, and a first capacitor.

In particular, in each of the first cell and the second cell, it is preferable that one of a source and a drain of the first transistor be electrically connected to a gate of the second transistor, one of a source and a drain of the second transistor be electrically connected to one of the source and the drain of the first transistor, and one of a pair of terminals of the first capacitor be electrically connected to the gate of the second transistor.

In the first cell, it is preferable that the other of the source and the drain of the first transistor be electrically connected to the first wiring, and the other of the pair of terminals of the first capacitor be electrically connected to the second wiring. In the third cell, it is preferable that the other of the source and the drain of the first transistor be electrically connected to the second wiring, and the other of the pair of terminals of the first capacitor be electrically connected to the second wiring.

A channel formation region of each of the first transistor and the second transistor preferably includes a first oxide semiconductor. The first oxide semiconductor preferably includes one or more selected from indium, zinc, and an element M. The element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony.

(14)

Another embodiment of the present invention may have the structure of (13) above in which the second cell includes a third transistor, a fourth transistor, a fifth transistor, and a second capacitor.

In particular, in the second cell, it is preferable that one of a source and a drain of the third transistor be electrically connected to a gate of the fourth transistor, one of a source and a drain of the fourth transistor be electrically connected to one of a source and a drain of the fifth transistor, the other of the source and the drain of the fifth transistor be electrically connected to the other of the source and the drain of the third transistor, one of a pair of terminals of the second capacitor be electrically connected to the gate of the fourth transistor, and the other of the source and the drain of the third transistor be electrically connected to the third wiring.

A channel formation region of each of the third transistor, the fourth transistor, and the fifth transistor preferably includes a second oxide semiconductor. The second oxide semiconductor preferably includes one or more selected from indium, zinc, and the element M described in (13).

(15)

Another embodiment of the present invention is an electronic device including the semiconductor device according to any one of (1) to (14) above and a housing.

According to one embodiment of the present invention, a semiconductor device with reduced power consumption can be provided. According to another embodiment of the present invention, a semiconductor device with a small circuit area can be provided. According to another embodiment of the present invention, a semiconductor device capable of performing arithmetic operations successively can be provided. According to another embodiment of the present invention, a novel semiconductor device can be provided. According to another embodiment of the present invention, an electronic device that includes the above semiconductor device can be provided.

Note that the effects of one embodiment of the present invention are not limited to the effects described above. The effects described above do not preclude the existence of other effects. The other effects are the ones that are not described in this section and will be described below. The effects that are not described in this section can be derived from the description of the specification, the drawings, and the like and can be extracted as appropriate from the description by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIG. 8A to FIG. 8D are circuit diagrams each illustrating a structure example of a circuit included in a semiconductor device.

FIG. 11 is a circuit diagram illustrating a structure example of a circuit included in a semiconductor device.

MODE FOR CARRYING OUT THE INVENTION

Figure 1:
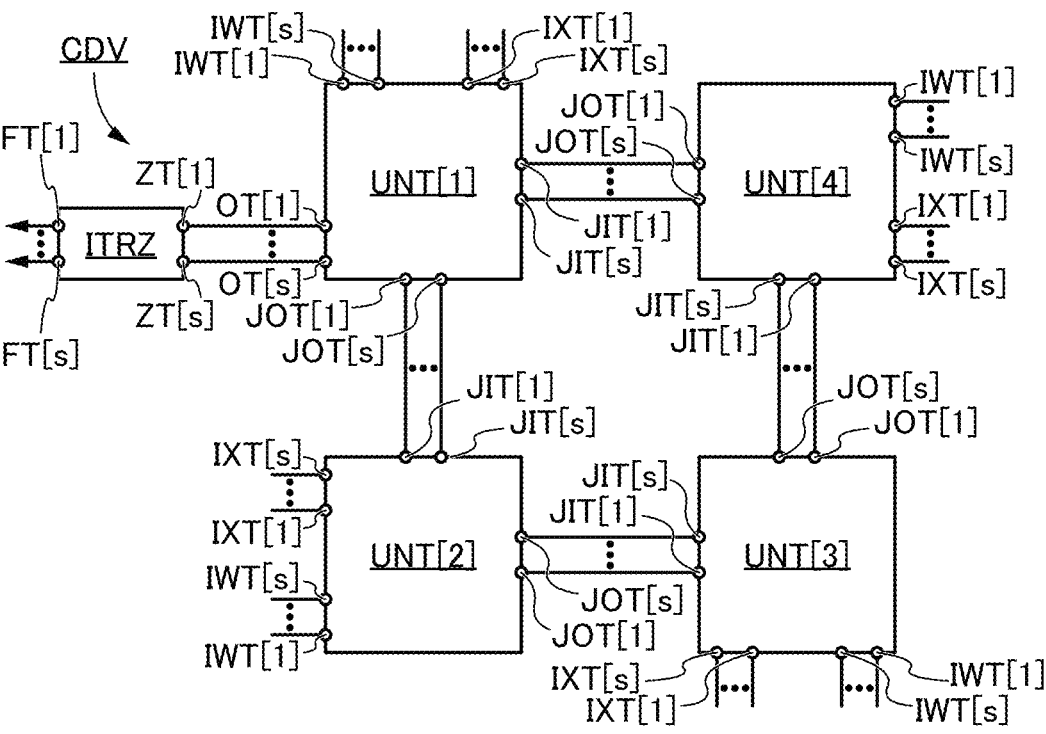
FIG. 1 is a block diagram illustrating a structure example of a semiconductor device.

In this specification and the like, a semiconductor device refers to a device that utilizes semiconductor characteristics, and means a circuit including a semiconductor element (e.g., a transistor, a diode, and a photodiode), or a device including the circuit. The semiconductor device also means all devices that can function by utilizing semiconductor characteristics. For example, an integrated circuit, a chip including an integrated circuit, and an electronic component including a chip in a package are each an example of the semiconductor device. Moreover, a memory device, a display apparatus, a light-emitting apparatus, a lighting device, an electronic device, and the like themselves are semiconductor devices in some cases and include semiconductor devices in other cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, and a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, a current amount, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit structure in which a plurality of elements are electrically connected to a wiring (a wiring for supplying a fixed potential or a wiring for transmitting a signal). For example, in the case where X is directly connected to a wiring and Y is directly connected to the wiring, this specification may describe that X and Y are directly electrically connected to each other.

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, each of X and Y denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has both functions of a wiring and an electrode. Thus, electrical connection in this specification includes, in its category, such a case where one conductive film has functions of a plurality of components.

In this specification and the like, a "resistor" can be, for example, a circuit element having a resistance value higher than 0 Ω or a wiring having a resistance value higher than 0 Ω. Therefore, in this specification and the like, a "resistor" includes a wiring having a resistance value, a transistor in which a current flows between a source and a drain, a diode, and a coil. Thus, the term "resistor" can sometimes be replaced with the terms "resistance", "load", or "region having a resistance value". Conversely, the terms "resistance", "load", or "region having a resistance value" can sometimes be replaced with the term "resistor". The resistance value can be, for example, preferably higher than or equal to 1 Ω and lower than or equal to 10 Ω, further preferably higher than or equal to 5 mΩ and lower than or equal to 5 Ω, still further preferably higher than or equal to 10 mΩ and lower than or equal to 1 Ω. For another example, the resistance value may be higher than or equal to 1 Ω and lower than or equal to $1 \times 10^9$ Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The term "capacitor", "parasitic capacitance", or "gate capacitance" can be replaced with the term "capacitance" in some cases. Conversely, the term "capacitance" can be replaced with the term "capacitor", "parasitic capacitance", or "gate capacitance" in some cases. In addition, a "capacitor" (including a "capacitor" with three or more terminals) includes an insulator and a pair of conductors between which the insulator is interposed. Thus, the term "pair of conductors" of "capacitor" can be replaced with "pair of electrodes", "pair of conductive regions", "pair of regions", or "pair of terminals". In addition, the terms "one of a pair of terminals" and "the other of the pair of terminals" are referred to as a first terminal and a second terminal, respectively, in some cases. Note that the electrostatic capacitance value can be higher than or equal to 0.05 fF and lower than or equal to 10 pF, for example. For another example, the electrostatic capacitance value may be higher than or equal to 1 pF and lower than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can sometimes be replaced with each other in this specification and the like. In this specification and the like, expressions "one of a source and a drain" (referred to as a first electrode or a first terminal in some cases) and "the other of the source and the drain" (referred to as a second electrode or a second terminal in some cases) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, a third gate, and the like in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the breakdown voltage of the transistor can be increased (the reliability can be improved). Alternatively, with the multi-gate structure, a drain-source current does not change very much even if a drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure and the device structure. Furthermore, a terminal, a wiring, or the like can be referred to as a node.

In this specification and the like, a "voltage" and a "potential" can be replaced with each other as appropriate. A "voltage" refers to a potential difference from a reference potential, and when the reference potential is a ground potential, for example, a "voltage" can be replaced with a "potential". Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied to both of the wirings are not necessarily equal to each other. Similarly, in the case where two wirings are both described as "functioning as a wiring for supplying a low-level potential", the levels of the low-level potentials supplied to both of the wirings are not necessarily equal to each other.

A "current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, a "current" in this specification and the like refers to a charge transfer phenomenon (electrical conduction) accompanying carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with positive charge moves, and the amount of the current is expressed as a positive value. In other words, the direction in which a carrier with negative charge moves is opposite to the direction of a current, and the amount of the current is expressed as a negative value. Thus, in the case where the polarity of a current (or the direction of a current) is not specified in this specification and the like, the description "a current flows from element A to element B" can be rephrased as "a current flows from element B to element A". The description "a current is input to element A" can be rephrased as "a current is output from element A".

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the terms "over" and "under" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B. Similarly, for example, the expression "electrode B above insulating layer A" does not necessarily mean that the electrode B is formed over and in direct contact with the insulating layer A, and does not exclude the case where another component is provided between the insulating layer A and the electrode B. Similarly, for example, the expression "electrode B under insulating layer A" does not necessarily mean that the electrode B is formed under and in direct contact with the insulating layer A, and does not exclude the case where another component is provided between the insulating layer A and the electrode B.

In this specification and the like, components arranged in a matrix and their positional relation are sometimes described using terms such as "row" and "column". The positional relation between components is changed as appropriate in accordance with the direction in which the components are described. Thus, the positional relation is not limited to the terms described in the specification and the like, and can be described with another term as appropriate depending on the situation. For example, the term "row direction" can be replaced with the term "column direction" when the direction of the diagram is rotated by 90°.

In this specification and the like, the terms "film" and "layer" can be interchanged with each other depending on the situation. For example, the term "conductive layer" can be replaced with the term "conductive film" in some cases. For another example, the term "insulating film" can be replaced with the term "insulating layer" in some cases. Alternatively, the terms "film" and "layer" are not used and can be interchanged with another term depending on the case or the situation. For example, the term "conductive layer" or "conductive film" can be replaced with the term "conductor" in some cases. For another example, the term "insulating layer" or "insulating film" can be replaced with the term "insulator" in some cases.

In this specification and the like, the terms "electrode", "wiring", and "terminal" do not limit the functions of such components. For example, an "electrode" is used as part of a "wiring" in some cases, and vice versa. Furthermore, the term "electrode" or "wiring" also includes, for example, the case where a plurality of "electrodes", "wirings", or the like are formed in an integrated manner. For example, a "terminal" is used as part of a "wiring" or an "electrode" in some cases, and vice versa. Furthermore, the term "terminal" also includes, for example, the case where one or more selected from "electrodes", "wirings", and "terminals" are formed in an integrated manner. Therefore, for example, an "electrode" can be part of a "wiring" or a "terminal", and a "terminal" can be part of a "wiring" or an "electrode". Moreover, the term "electrode", "wiring", or "terminal" is sometimes replaced with the term "region" depending on the case.

In this specification and the like, the terms "wiring", "signal line", and "power supply line" can be interchanged with each other depending on the case or the situation. For example, the term "wiring" can be replaced with the term "signal line" in some cases. For another example, the term "wiring" can be replaced with the term "power supply line" or the like in some cases. Conversely, the term "signal line" or "power supply line" can be replaced with the term "wiring" in some cases. The term "power supply line" can be replaced with the term "signal line" in some cases. Conversely, the term "signal line" can be replaced with the term "power supply line" in some cases. The term "potential" that is applied to a wiring can be replaced with the term "signal" depending on the case or the situation. Conversely, the term "signal" can be replaced with the term "potential" in some cases.

In this specification and the like, a timing chart is used in some cases to describe an operation method of a semiconductor device. In this specification and the like, the timing chart shows an ideal operation example and a period, a level of a signal (e.g., a potential or a current), and a timing described in the timing chart are not limited unless otherwise specified. In the timing chart described in this specification and the like, the level of a signal (e.g., a potential or a current) input to a wiring (including a node) and a timing can be changed depending on the circumstances. For example, even when two periods are shown to have an equal length, the two periods have different lengths in some cases. Furthermore, for example, even when one of two periods is shown long and the other is shown short, the two periods have the equal length in some cases, and the one period has a short length and the other has a long length in other cases.

In this specification and the like, a flowchart is used in some cases to describe an operation method of a semiconductor device. In this specification and the like, processing shown in the flowchart is classified on the operation basis and illustrated as independent steps. However, in actual processing, it is difficult to separate processing shown in the flowchart on the operation basis, and there is a case where a plurality of steps are associated with one step or a case where one step is associated with a plurality of steps. Thus, the processing illustrated in the flowchart is not limited to each step described in the specification, and the steps can be interchanged as appropriate according to circumstances. Specifically, the order of steps can be changed, a step can be added or omitted according to circumstances.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, an impurity in a semiconductor refers to, for example, an element other than a main component of a semiconductor layer. For example, an element with a concentration lower than 0.1 atomic % is an impurity. When an impurity is contained, for example, one or more selected from an increase in the density of defect states in a semiconductor, a decrease in carrier mobility, and a decrease in crystallinity may occur. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen.

In this specification and the like, a switch has a function of being in a conduction state (on state) or a non-conduction state (off state) to control whether a current flows or not. Alternatively, a switch has a function of selecting and changing a current path. Thus, a switch may have two or more terminals through which a current flows, in addition to a control terminal. For example, an electrical switch or a mechanical switch can be used. That is, a switch can be any element capable of controlling a current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor (a transistor in which a conduction state is established between its gate and drain)), and a logic circuit in which such elements are combined. Note that in the case of using a transistor as a switch, a "conduction state" of the transistor refers to a state where a source electrode and a drain electrode of the transistor can be regarded as being electrically short-circuited or a state where a current can be made to flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel"

or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) described in the embodiment and a content (or part of the content) described in one or more different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or more different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, illustration of some components may be omitted for clarity of the drawings.

In this specification and the like, when a plurality of components are denoted with the same reference numerals, and in particular need to be distinguished from each other, an identification sign such as "_1", "[n]", or "[m, n]" is sometimes added to the reference numerals. Components denoted with identification signs such as "_1", "[n]", and "[m, n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in a signal, a voltage, or a current due to noise, variations in a signal, a voltage, or a current due to difference in timing, or the like can be included.

Embodiment 1

In this embodiment, an arithmetic circuit that is a semiconductor device of one embodiment of the present invention will be described.

<Structure Example of Arithmetic Circuit>

An arithmetic circuit CDV illustrated in FIG. 1 is a semiconductor device of one embodiment of the present invention, and is an arithmetic circuit capable of successively executing a product-sum operation and an arithmetic operation of a function system a plurality of times.

The arithmetic circuit CDV illustrated in FIG. 1 includes a circuit UNT[1], a circuit UNT[2], a circuit UNT[3], a circuit UNT[4], and a circuit ITRZ.

The circuit UNT[1] includes a terminal IWT[1] to a terminal IWT[s] (s is an integer greater than or equal to 1), a terminal IXT[1] to a terminal IXT[s], a terminal OT[1] to a terminal OT[s], a terminal JIT[1] to a terminal JIT[s], and a terminal JOT[1] to a terminal JOT[s]. Each of the circuit UNT[2] to the circuit UNT[4] includes the terminal IWT[1] to the terminal IWT[s], the terminal IXT[1] to the terminal IXT[s], the terminal JIT[1] to the terminal JIT[s], and the terminal JOT[1] to the terminal JOT[s].

Note that although not illustrated in FIG. 1, each of the circuit UNT[2] to the circuit UNT[4] may include the terminal OT[1] to the terminal OT[s].

The circuit ITRZ includes a terminal ZT[1] to a terminal ZT[s] and a terminal FT[1] to a terminal FT[s].

The terminal JOT[k] of the circuit UNT[1] (k is an integer greater than or equal to 1 and less than or equal to s) is electrically connected to the terminal JIT[k] of the circuit UNT[2]. Note that FIG. 1 illustrates a structure in which the terminal JOT[1] of the circuit UNT[1] is electrically connected to the terminal JIT[1] of the circuit UNT[2], and the terminal JOT[s] of the circuit UNT[1] is electrically connected to the terminal JIT[s] of the circuit UNT[2].

In this embodiment, in the above-described manner, the first to s-th components are collectively explained with the k-th components in some cases. For example, the terminal JOT[k] of the circuit UNT[1] is described as the terminal JOT[1] to the terminal JOT[s] of the circuit UNT[1] in some cases. In a manner similar to the above, for example, the terminal JIT[k] of the circuit UNT[1] is described as the terminal JIT[1] to the terminal JIT[s] of the circuit UNT[1]. Note that the above applies not only to the circuit UNT[1] but also to the circuit UNT[2] to the circuit UNT[4].

The terminal JOT[k] of the circuit UNT[2] is electrically connected to the terminal JIT[k] of the circuit UNT[3]. The terminal JOT[k] of the circuit UNT[3] is electrically connected to the terminal JIT[k] of the circuit UNT[4]. The terminal JOT[k] of the circuit UNT[4] is electrically connected to the terminal JIT[k] of the circuit UNT[1].

The terminal OT[k] of the circuit UNT[1] is electrically connected to the terminal ZT[k] of the circuit ITRZ.

In each of the circuit UNT[1] to the circuit UNT[4], the terminal IWT[1] to the terminal IWT[s] and the terminal IXT[1] to the terminal IXT[s] function as terminals for inputting digital data used for an arithmetic operation in the arithmetic circuit CDV.

The terminal FT[1] to the terminal FT[s] function as terminals for outputting a result of the arithmetic operation performed in the arithmetic circuit CDV.

Next, structure examples of the circuit UNT[1] to the circuit UNT[4] are described.

Figure 2:
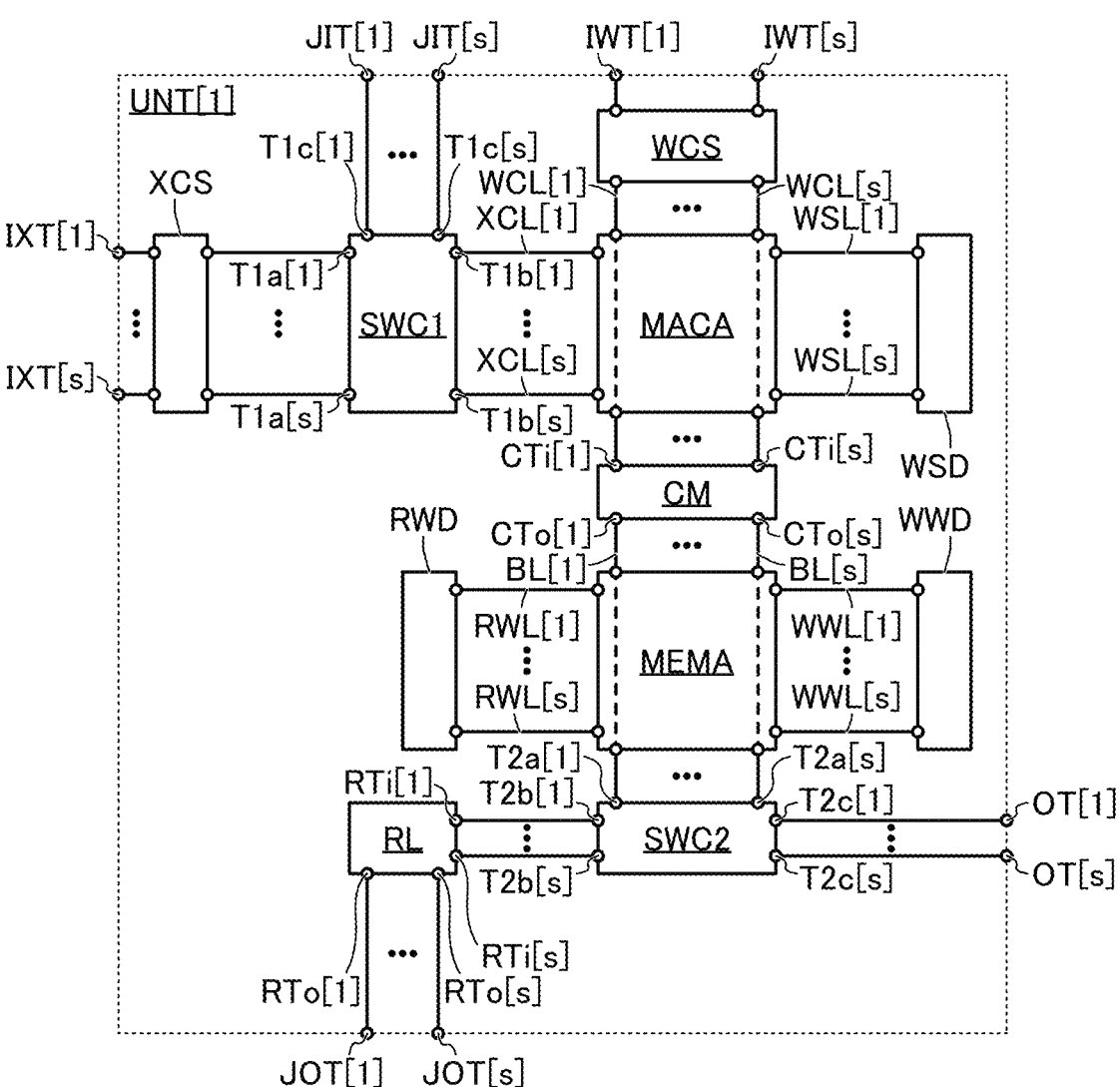
FIG. 2 is a block diagram illustrating a structure example of a circuit included in a semiconductor device.

FIG. 2 illustrates an example of a circuit structure of the circuit UNT[1] in FIG. 1. Note that in the case where each of the circuit UNT[2] to the circuit UNT[4] in FIG. 1 includes the terminal OT[1] to the terminal OT[s], the circuit UNT[1] in FIG. 2 can also be applied to the circuit UNT[2] to the circuit UNT[4].

The circuit UNT[1] includes an arithmetic cell array MACA and a memory cell array MEMA.

The circuit UNT[1] includes a circuit WCS, a circuit XCS, and a circuit WSD as driver circuits of the arithmetic cell array MACA. The circuit UNT[1] includes a circuit WWD and a circuit RWD as driver circuits of the memory cell array MEMA. The circuit UNT[1] includes a current generation circuit CM and a current generation circuit RL.

The current generation circuit CM includes a terminal CTi[1] to a terminal CTi[s] and a terminal CTo[1] to a terminal CTo[s]. The current generation circuit RL includes a terminal RTi[1] to a terminal RTi[s] and a terminal RTo[1] to a terminal RTo[s].

The circuit UNT[1] includes a switching circuit SWC1 and a switching circuit SWC2.

The switching circuit SWC1 includes a terminal T1$a$[1] to a terminal T1$a$[s], a terminal T1$b$[1] to a terminal T1$b$[s], and a terminal T1$c$[1] to a terminal T1$c$[s]. The switching circuit SWC2 includes a terminal T2$a$[1] to a terminal T2$a$[s], a terminal T2$b$[1] to a terminal T2$b$[s], and a terminal T2$c$[1] to a terminal T2$c$[s].

The arithmetic cell array MACA includes a plurality of arithmetic cells arranged in a matrix of s rows and s columns, for example.

A wiring XCL[1] to a wiring XCL[s] and a wiring WSL[1] to a wiring WSL[s] extend in the row direction of the arithmetic cell array MACA. A wiring WCL[1] to a wiring WCL[s] extend in the column direction of the arithmetic cell array MACA.

The circuit WCS is electrically connected to the wiring WCL[1] to the wiring WCL[s]. The circuit WSD is electrically connected to the wiring WSL[1] to the wiring WSL[s].

The terminal T1$a$[1] to the terminal T1$a$[s] of the switching circuit SWC1 are electrically connected to the circuit XCS.

The terminal T1$b$[k] of the switching circuit SWC1 is electrically connected to the wiring XCL[k] (note that the reference numerals of the terminal T1$b$[k] and the wiring XCL[k] are not illustrated in FIG. 2). Furthermore, the terminal T1$c$[k] of the switching circuit SWC1 is electrically connected to the terminal JIT[k] of the circuit UNT[1] (note that the reference numerals of the terminal T1$c$[k] and the terminal JIT[k] are not illustrated in FIG. 2).

The terminal CTi[k] of the current generation circuit CM is electrically connected to the wiring BL[k] (note that the reference numerals of the terminal CTi[k] and the wiring BL[k] are not illustrated in FIG. 2).

The circuit WCS is electrically connected to each of the terminal IWT[1] to the terminal IWT[s] included in the circuit UNT[1]. The circuit XCS is electrically connected to each of the terminal IXT[1] to the terminal IXT[s] included in the circuit UNT[1].

The memory cell array MEMA includes a plurality of arithmetic cells arranged in a matrix of s rows and s columns, for example.

Furthermore, a wiring WWL[1] to a wiring WWL[s] and a wiring RWL[1] to a wiring RWL[s] extend in the row direction of the memory cell array MEMA. Furthermore, a wiring BL[1] to a wiring BL[s] extend in the column direction of the memory cell array MEMA.

The circuit WWD is electrically connected to the wiring WWL[1] to the wiring WWL[s]. The circuit RWD is electrically connected to the wiring RWL[1] to the wiring RWL[s].

The terminal CTo[k] of the current generation circuit CM is electrically connected to the wiring BL[k] (note that the reference numerals of the terminal CTo[k] and the wiring BL[k] are not illustrated in FIG. 2).

The terminal T2$a$[k] of the switching circuit SWC2 is electrically connected to the wiring BL[k] (note that the reference numerals of the terminal T2$b$[k] and the wiring BL[k] are not illustrated in FIG. 2). The terminal T2$b$[k] of the switching circuit SWC2 is electrically connected to the terminal RTi[k] of the current generation circuit RL (note that the reference numerals of the terminal T2$b$[k] and the terminal RTi[k] are not illustrated in FIG. 2). The terminal T2$c$[k] of the switching circuit SWC2 is electrically connected to the terminal OT[k] of the circuit UNT[1] (note that the reference numerals of the terminal T2$c$[k] and the terminal OT[k] are not illustrated in FIG. 2).

The terminal RTo[k] of the current generation circuit RL is electrically connected to the terminal JOT[k] of the circuit UNT[1] (note that the reference numerals of the terminal RTo[k] and the terminal JOT[k] are not illustrated in FIG. 2).

Figure 3:
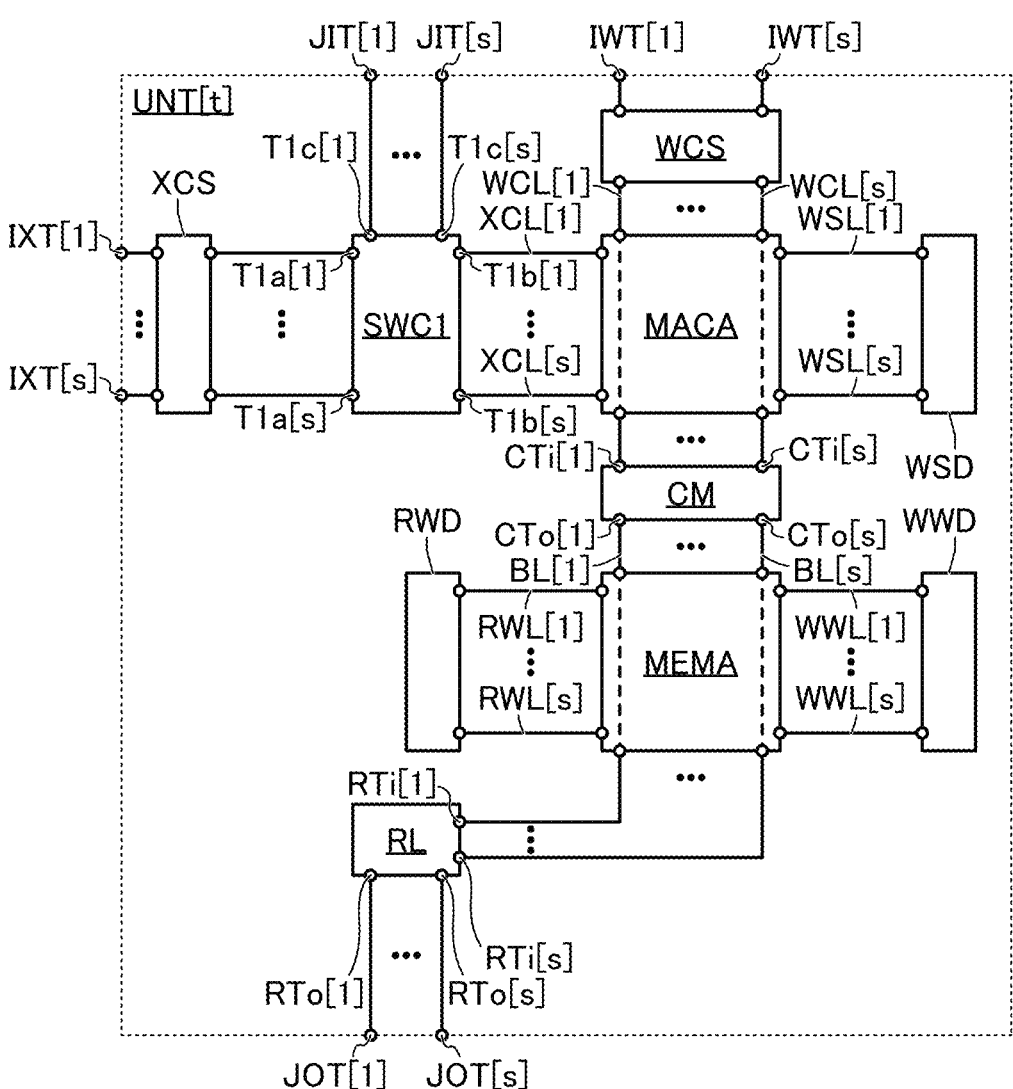
FIG. 3 is a block diagram illustrating a structure example of a circuit included in a semiconductor device.

A circuit UNT[t] illustrated in FIG. 3 (t is any one number of 2, 3, and 4) is an example of a circuit structure of any one of the circuit UNT[2] to the circuit UNT[4] in FIG. 1. The circuit UNT[t] in FIG. 3 is a modification example of the circuit UNT[1] in FIG. 2 and is different from the circuit UNT[1] in FIG. 2 in that the switching circuit SWC2 is not provided.

In the circuit UNT[t] in FIG. 3, the wiring BL[k] is electrically connected to the terminal RTi[k] of the current generation circuit RL (note that the wiring BL[k] and the terminal RTi[k] are not illustrated in FIG. 3).

<Structure Examples of Circuits Included in Arithmetic Circuit>

Next, components included in the circuit UNT[1] to the circuit UNT[4] illustrated in FIG. 2 will be described.

Figure 4:
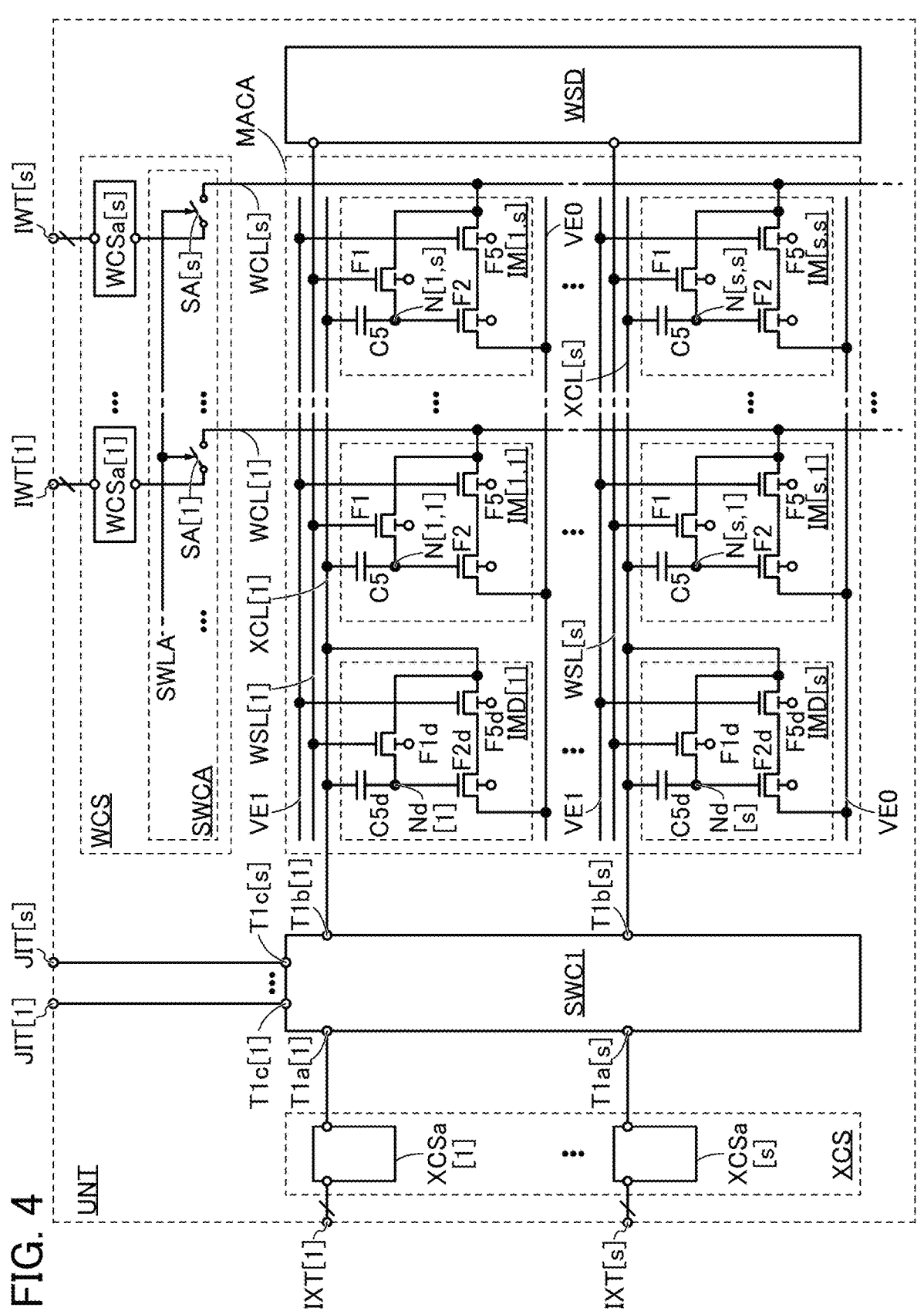
FIG. 4 is a circuit diagram illustrating a structure example of a circuit included in a semiconductor device.

The circuit UNT illustrated in FIG. 4 is a circuit structure example in which the arithmetic cell array MACA, the circuit WSD, the circuit WCS, the circuit XCS, and the switching circuit SWC1 of the circuit UNT[1] in FIG. 2 and the circuit UNT[t] in FIG. 3 are extracted. Specifically, FIG. 4 also illustrates structures of the arithmetic cell array MACA, the circuit WCS, and the circuit XCS.

Figure 5:
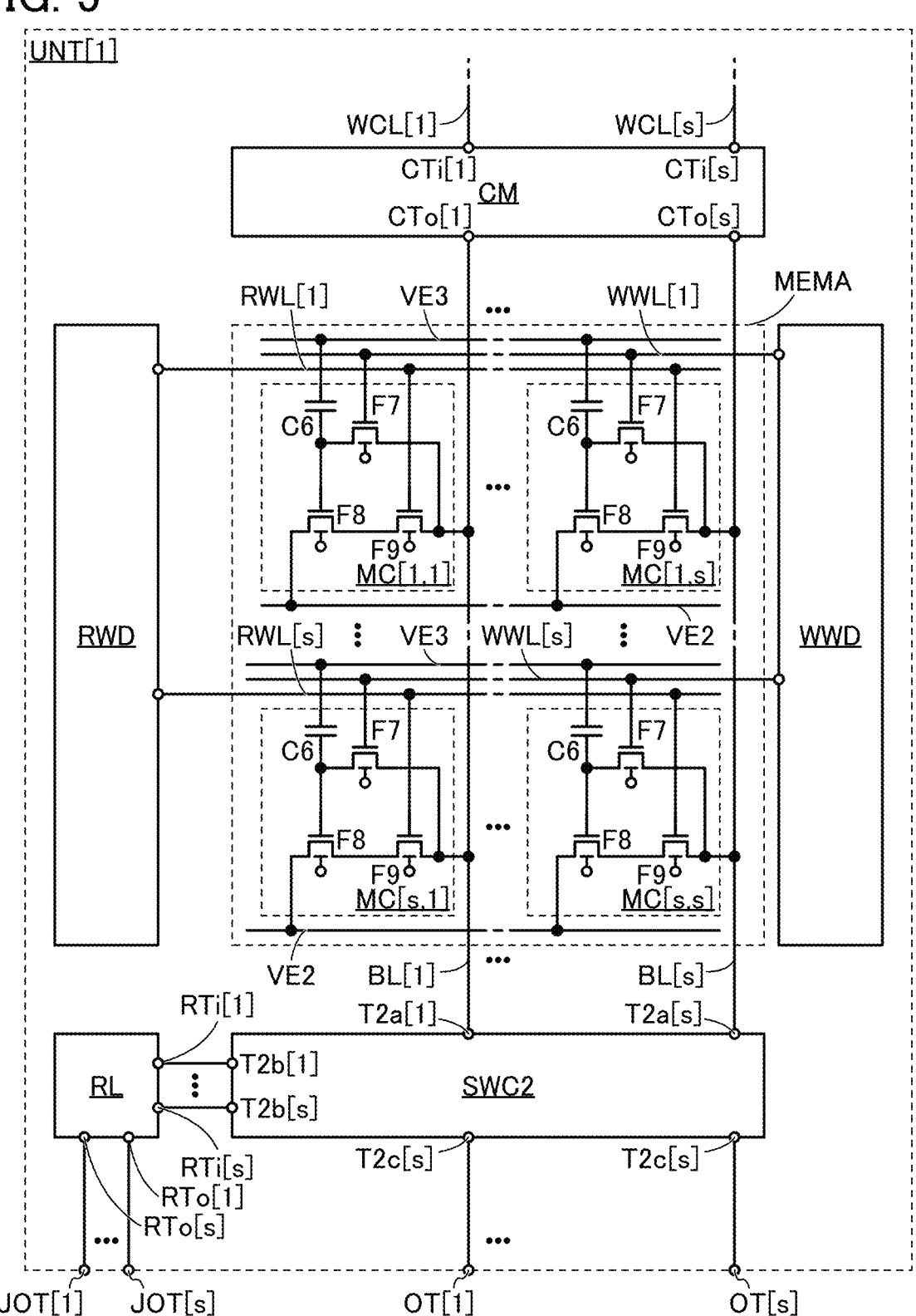
FIG. 5 is a circuit diagram illustrating a structure example of a circuit included in a semiconductor device.

FIG. 5 is a diagram selectively illustrating the current generation circuit CM, the memory cell array MEMA, the circuit WWD, the circuit RWD, the switching circuit SWC2, and the current generation circuit RL in the circuit UNT[1] in FIG. 2. Specifically, FIG. 5 also illustrates the structure of the memory cell array MEMA.

Figure 6:
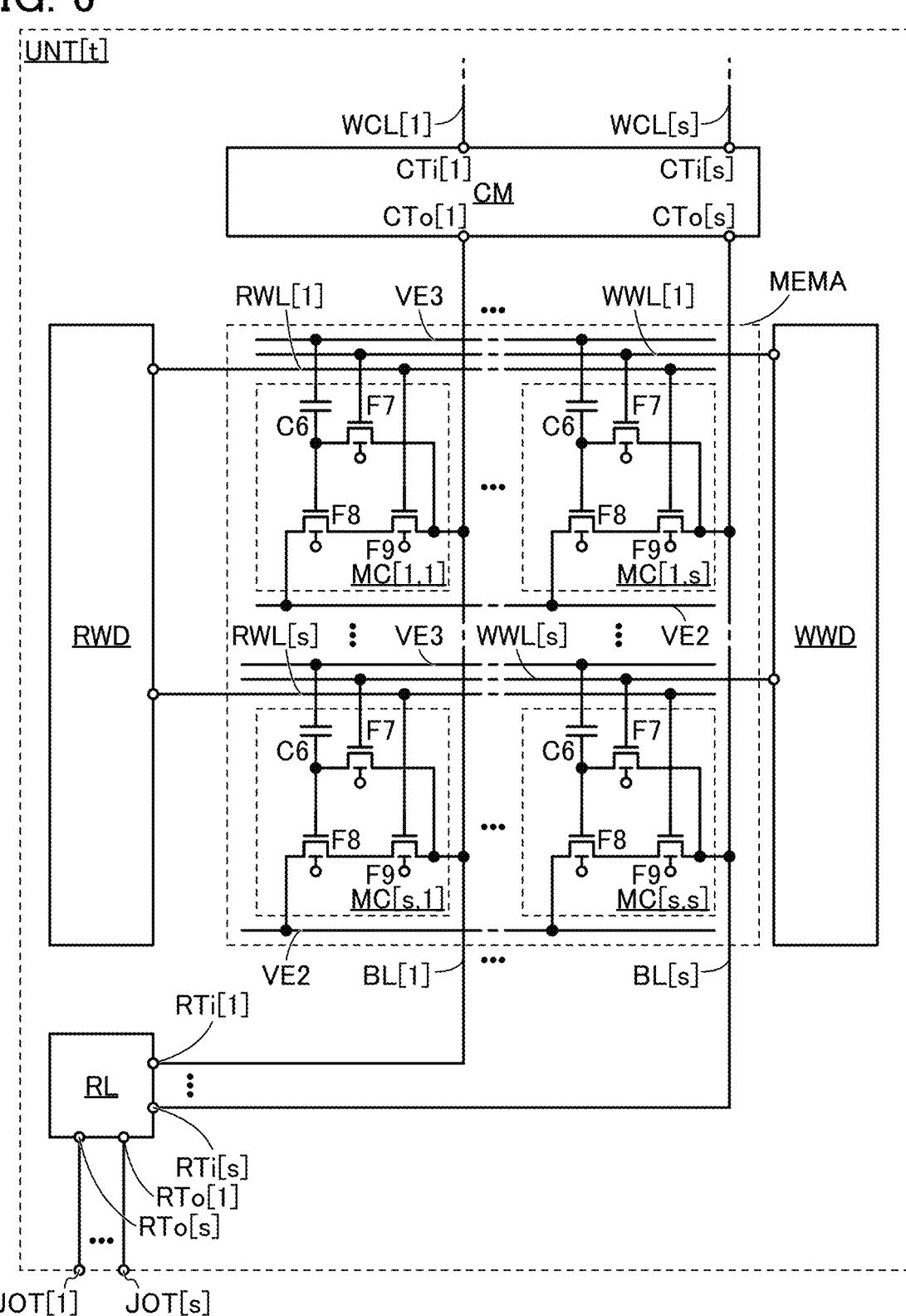
FIG. 6 is a circuit diagram illustrating a structure example of a circuit included in a semiconductor device.

FIG. 6 is a diagram selectively illustrating the current generation circuit CM, the memory cell array MEMA, the circuit WWD, the circuit RWD, and the current generation circuit RL in the circuit UNT[t] in FIG. 3. Note that the memory cell array MEMA illustrated in FIG. 6 has a structure similar to that of the memory cell array MEMA illustrated in FIG. 5.

[Arithmetic Cell Array MACA]

The arithmetic cell array MACA has a function of performing a product-sum operation of a plurality of pieces of first data and a plurality of pieces of second data, for example. Note that in this embodiment, each piece of the first data and the second data is a positive value or "0".

In FIG. 4, the arithmetic cell array MACA includes a cell IM[1, 1] to a cell IM[s, s], for example. The arithmetic cell array MACA further includes a cell IMD[1] to a cell IMD[s].

The cell IM[1, 1] to the cell IM[s, s] function as arithmetic cells, for example. The cell IMD[1] to the cell IMD[s] each have a function of retaining a potential corresponding to reference data in order to perform an arithmetic operation in the cell IM[1, 1] to the cell IM[s, s], for example. Note that the reference data will be described in detail later.

The cell IM[1, 1] to the cell IM[s, s] each include a transistor F1, a transistor F2, a transistor F5, and a capacitor C5, for example. The cell IMD[1] to the cell IMD[s] each include a transistor F1d, a transistor F2d, a transistor F5d, and a capacitor C5d, for example. Note that although the transistor F1, the transistor F2, and the transistor F5 each being an n-channel transistor are described in this specification, the drawings, and the like, one embodiment of the present invention is not limited thereto. For example, each of the transistor F1, the transistor F2, and the transistor F5 may be replaced with a p-channel transistor. Note that in this case, in order to operate the circuit properly, the potentials applied to the wirings are different from those of the case where the transistor F1, the transistor F2, and the transistor F5 are each an n-channel transistor in some cases.

In particular, the structures (including the channel lengths and the channel widths) of the transistors F1 included in the cell IM[1, 1] to the cell IM[s, s] are preferably the same, the structures of the transistors F2 included in the cell IM[1, 1] to the cell IM[s, s] are preferably the same, and the structures of the transistors F5 included in the cell IM[1, 1] to the cell IM[s, s] are preferably the same. The structures of the transistors F1d included in the cell IMD[1] to the cell IMD[s] are preferably the same, the structures of the transistors F2d included in the cell IMD[1] to the cell IMD[s] are preferably the same, and the structures of the transistors F5d included in the cell IMD[1] to the cell IMD[s] are preferably the same. The structures of the transistor F1 and the transistor F1d are preferably the same, the structures of the transistor F2 and the transistor F2d are preferably the same, and the structures of the transistor F5 and the transistor F5d are preferably the same.

By making the transistors have the same structure, the transistors can have substantially the same electrical characteristics. Thus, by making the transistors F1 included in the cell IM[1, 1] to the cell IM[s, s] have the same structure, making the transistors F2 included in the cell IM[1, 1] to the cell IM[s, s] have the same structure, and making the transistors F5 included in the cell IM[1, 1] to the cell IM[s, s] have the same structure, the cell IM[1, 1] to the cell IM[s, s] can perform almost the same operation under the same conditions. The same conditions here refer to, for example, that the potential or the current input to the cell IM[1, 1] and the potential or the current input to the cell IM[s, s] are equal to each other. Similarly, by making the transistors F1d included in the cell IMD[1] to the cell IMD[s] have the same structure, making the transistors F2d included in the cell IMD[1] to the cell IMD[s] have the same structure, and making the transistors F5d included in the cell IMD[1] to the cell IMD[s] have the same structure, the cell IMD[1] to the cell IMD[s] can perform almost the same operation under the same conditions. The same conditions here refer to, for example, that the potential or the current input to the cell IMD[1] and the potential or the current input to the cell IMD[s] are equal to each other.

Note that the transistor F1 and the transistor F1d may function as switching elements unless otherwise specified. In other words, the gate voltage, the source voltage, and the drain voltage of each of the above transistors may be appropriately biased to voltages in the range where the transistor operates as switching elements. However, one embodiment of the present invention is not limited thereto. For example, the transistor F1 and the transistor F1d in an on state may operate in a linear region or a saturation region or may operate both in a linear region and a saturation region.

Unless otherwise specified, the transistor F2 and the transistor F2d may operate in the subthreshold region (i.e., the gate-source voltage may be lower than the threshold voltage in the transistor F2 or the transistor F2d which are n-channel transistors, further preferably, the drain current increases exponentially with respect to the gate-source voltage). In other words, the gate voltage, the source voltage, and the drain voltage of each of the above transistors may be appropriately biased to voltages in the range where the transistor operates in the subthreshold region. Thus, the transistor F2 and the transistor F2d may operate such that an off-state current flows between the source and the drain.

The transistor F5 and the transistor F5d each function as a clamp transistor (also called a clamp FET in some cases), for example. Thus, a fixed potential is preferably applied to the gates of the transistor F5 and the transistor F5d. Providing the transistor F5 (transistor F5d) can prevent drain-induced barrier lowering (DIBL) in the transistor F2 (transistor F2d), which will be described later in detail.

Meanwhile, in the case where drain-induced barrier lowering (DIBL) in the transistor F2 (transistor F2d) can be ignored, the cell IM (cell IMD1) may have a structure in which the transistor F5 (transistor F5d) is not provided.

One or both of the transistor F1 and the transistor F1d are preferably an OS transistor, for example. Specific examples of a metal oxide included in a channel formation region of the OS transistor include indium oxide, gallium oxide, and zinc oxide. The metal oxide preferably includes one or more selected from indium, an element M, and zinc. The element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony. Specifically, the element M is preferably one or more selected from aluminum, gallium, yttrium, and tin. Note that a metal oxide containing indium, the element M, and zinc is referred to as an In-M-Zn oxide in some cases.

It is particularly preferable that an oxide containing indium (In), gallium (Ga), and zinc (Zn) (also referred to as IGZO) be used as the metal oxide used for a semiconductor layer. Alternatively, it is preferable to use an oxide containing indium, tin, and zinc (also referred to as ITZO (registered trademark)). Alternatively, it is preferable to use an oxide containing indium (In), gallium (Ga), tin (Sn), and zinc (Zn). Alternatively, it is preferable to use an oxide containing indium (In), aluminum (Al), and zinc (Zn) (also referred to as IAZO). Alternatively, it is preferable to use an oxide containing indium (In), aluminum (Al), gallium (Ga), and zinc (Zn) (also referred to as IAGZO).

The metal oxide included in the channel formation region of the OS transistor preferably has a stacked-layer structure of a plurality of oxide layers with different chemical compositions. For example, an oxide layer having a two-layer structure of a first layer and a second layer positioned directly over the first layer is considered. The atomic ratio of the element M to the metal element that is a main component in the metal oxide used for the first layer is preferably higher than the atomic ratio of the element M to the metal element that is a main component in the metal oxide used for the second layer. Moreover, the atomic ratio of the element M to In in the metal oxide used for the first layer is preferably higher than the atomic ratio of the element M to In in the metal oxide used for the second layer. With this structure, impurities and oxygen can be inhibited from diffusing into the second layer from the components formed below the first layer.

The atomic ratio of In to the element M in the metal oxide used for the second layer is preferably higher than the atomic ratio of In to the element M in the metal oxide used for the first layer. With this structure, the OS transistor can have a high on-state current and high frequency characteristics.

Specifically, as the metal oxide used for the first layer, a metal oxide with a composition of In:M:Zn=1:3:2[atomic ratio] or in the neighborhood thereof, a composition of In:M:Zn=1:3:4[atomic ratio] or in the neighborhood thereof, or a composition of In:M:Zn=1:1:0.5[atomic ratio] or in the neighborhood thereof can be used, for example. As the metal oxide used for the second layer, a metal oxide with a composition of In:M:Zn=1:1:1[atomic ratio] or in the neighborhood thereof, a composition of In:M:Zn=1:1:1.2[atomic ratio] or in the neighborhood thereof, a composition of In:M:Zn=1:1:2[atomic ratio] or in the neighborhood thereof, or a composition of In:M:Zn=4:2:3[atomic ratio] or in the neighborhood thereof can be used. Note that a composition in the neighborhood includes the range of +30% of an intended atomic ratio.

One or both of the transistor F1 and the transistor F1d can be, other than an OS transistor, a transistor including silicon in its channel formation region (hereinafter, referred to as a Si transistor). As the silicon, amorphous silicon (referred to as hydrogenated amorphous silicon in some cases), microcrystalline silicon, polycrystalline silicon, single crystal silicon, or the like can be used, for example.

Examples of a transistor that can be used as one or both of the transistor F1 and the transistor F1d other than an OS transistor and a Si transistor include a transistor including germanium or the like in its channel formation region, a transistor including a compound semiconductor, such as zinc selenide, cadmium sulfide, gallium arsenide, indium phosphide, gallium nitride, or silicon germanium, in its channel formation region, a transistor including a carbon nanotube in its channel formation region, and a transistor including an organic semiconductor in its channel formation region.

The use of an OS transistor as one or both of the transistor F1 and the transistor F1d can reduce the leakage current of one or both of the transistor F1 and the transistor F1d, so that power consumption of the arithmetic circuit can be reduced. Specifically, the amount of a leakage current from a retention node (e.g., a later-described node N or a later-described node Nd) to a write word line can be extremely small when one or both of the transistor F1 and the transistor F1d is in a non-conduction state; thus, the frequency of refresh operations for the potential of the retention node can be reduced. By reducing the frequency of refresh operations, power consumption of the arithmetic circuit can be reduced. An extremely low leakage current from the retention node to the wiring WCL or the wiring XCL allows the cells to retain the potential of the retention node for a long time, increasing the arithmetic operation accuracy of the arithmetic circuit.

Using an OS transistor also as one or both of the transistor F2 and the transistor F2d enables an operation with a wide range of a current in the subthreshold region, leading to a reduction in the current consumption.

Using OS transistors also as the transistor F2, the transistor F2d, the transistor F5, and the transistor F5d allows the transistor F2, the transistor F2d, the transistor F5, and the transistor F5d to be manufactured concurrently with the transistor F1 and the transistor F1d, which sometimes shortens the manufacturing process of the arithmetic circuit. The transistor F2, the transistor F2d, the transistor F5, and the transistor F5d can be, if not OS transistors, Si transistors.

When semiconductor devices are highly integrated into a chip, heat may be generated in the chip by driving of the circuit. This heat generation increases the temperature of a transistor to change the characteristics of the transistor; thus, the field-effect mobility thereof might change or the operation frequency thereof might decrease, for example. Since an OS transistor has higher heat resistance than a Si transistor, a change in field-effect mobility and a decrease in operation frequency due to a temperature change do not easily occur. Even when having a high temperature, an OS transistor is likely to keep a property of the drain current increasing exponentially with respect to the gate-source voltage. With the use of an OS transistor, an arithmetic operation, processing, or the like can thus be easily performed even in a high-temperature environment. To form a semiconductor device highly resistant to heat due to driving, an OS transistor is preferably used as its transistor.

In each of the cell IM[1, 1] to the cell IM[s, s], a first terminal of the transistor F1 is electrically connected to the gate of the transistor F2. A first terminal of the transistor F2 is electrically connected to a wiring VE0. A first terminal of the capacitor C5 is electrically connected to the gate of the transistor F2. A second terminal of the transistor F2 is electrically connected to a first terminal of the transistor F5. A second terminal of the transistor F5 is electrically connected to a second terminal of the transistor F1, and the gate of the transistor F5 is electrically connected to a wiring VE1.

In each of the cell IM[1, 1] to the cell IM[s, s], the second terminal of the transistor F2 and the wiring WCL are electrically connected in series with each other through the first terminal and the second terminal of the transistor F5, thereby preventing direct application of a high-level potential from the wiring WCL to the second terminal of the transistor F2. Thus, drain-induced barrier lowering in the transistor F2 can be prevented.

In the case where the second terminal of the transistor F2 is directly electrically connected to the wiring WCL (i.e., the case where the transistor F5 is not provided) in each of the cell IM[1, 1] to the cell IM[s, s], direct application of a high-level potential from the wiring WCL to the second terminal of the transistor F2 might cause drain-induced barrier lowering in the transistor F2. When drain-induced barrier lowering occurs in the transistor F2, the threshold voltage of the transistor F2 is lowered, so that the voltage range of the subthreshold region of the transistor F2 might change. As a result, when the cell IM[1, 1] to the cell IM[s, s] each have a structure in which the transistor F5 is not provided, a current in the subthreshold region that flows through the transistor F2 might vary.

In each of the cell IMD[1] to the cell IMD[s], a first terminal of the transistor F1d is electrically connected to the gate of the transistor F2d. A first terminal of the transistor F2d is electrically connected to the wiring VE0. A first terminal of the capacitor C5d is electrically connected to the gate of the transistor F2d. A second terminal of the transistor F2d is electrically connected to a first terminal of the transistor F5d. A second terminal of the transistor F5d is electrically connected to a second terminal of the transistor F1d, and the gate of the transistor F5d is electrically connected to the wiring VE1.

Like the transistors F5 in each of the cell IM[1, 1] to the cell IM[s, s], the transistors F5d in each of the cell IMD[1] to the cell IMD[s] have a function of preventing drain-induced barrier lowering in the transistor F2d.

In FIG. 4, back gates are illustrated for the transistor F1, the transistor F2, the transistor F5, the transistor F1*d*, the transistor F2*d*, and the transistor F5*d*. Although the connection structure of the back gates is not illustrated, points to which the back gates are electrically connected can be determined at the design stage. For example, in a transistor including a back gate, a gate and the back gate may be electrically connected to each other to increase the on-state current of the transistor. In other words, the gate and the back gate of the transistor F1 may be electrically connected to each other, and the gate and the back gate of the transistor F1*d* may be electrically connected to each other, for example. Furthermore, for example, in a transistor including a back gate, a wiring electrically connecting the back gate of the transistor to an external circuit or the like may be provided and a potential may be supplied to the back gate of the transistor with the external circuit or the like to change the threshold voltage of the transistor or to reduce the off-state current of the transistor.

The transistor F1, the transistor F2, and the transistor F5 illustrated in FIG. 4 have back gates; however, the semiconductor device of one embodiment of the present invention is not limited thereto. For example, the transistor F1, the transistor F2, and the transistor F5 illustrated in FIG. 4 may each be a transistor having a structure not including a back gate, i.e., a single-gate structure. It is also possible that some transistors have a structure including a back gate and the other transistors have a structure not including a back gate.

The transistor F1, the transistor F2, and the transistor F5 illustrated in FIG. 4 are n-channel transistors; however, the semiconductor device of one embodiment of the present invention is not limited thereto. For example, the transistor F1 may be an n-channel transistor, and the transistor F2 and the transistor F5 may be replaced with p-channel transistors.

The above-described examples of changes in the structure and polarity of the transistor are not limited to the transistor F1, the transistor F2, and the transistor F5. For example, the same applies to the transistor F1*d*, the transistor F2*d*, the transistor F5*d*, transistors described in other parts of this specification, or transistors illustrated in other drawings.

The wiring VE0 functions as a wiring for making a current flow between the first terminal and the second terminal of the transistor F2 in each of the cell IM[1, 1] to the cell IM[s, s]. The wiring VE0 functions as a wiring for making a current flow between the first terminal and second terminal of the transistor F2*d* in each of the cell IMD[1] to the cell IMD[s]. The wiring VE0 functions as a wiring for supplying a fixed potential, for example. The fixed potential can be, for example, a low-level potential or a ground potential.

The wiring VE1 functions as a wiring for applying a potential to the gates of the transistors F5 in the cell IM[1, 1] to the cell IM[s, s] and the gates of the transistors F5*d* in the cell IMD[1] to the cell IMD[s]. Note that the potential is preferably a potential within a range where the transistor F5 and the transistor F5*d* function as clamp transistors.

In the cell IM[1, 1], the second terminal of the transistor F1 and the second terminal of the transistor F5 are electrically connected to the wiring WCL[1], and the gate of the transistor F1 is electrically connected to the wiring WSL[1]. A second terminal of the capacitor C5 is electrically connected to the wiring XCL[1]. In the cell IM[1, 1] in FIG. 4, a connection portion of the first terminal of the transistor F1, the gate of the transistor F2, and the first terminal of the capacitor C5 is the node N[1, 1].

In the cell IM[s, 1], the second terminal of the transistor F1 and the second terminal of the transistor F5 are electrically connected to the wiring WCL[1], and the gate of the transistor F1 is electrically connected to the wiring WSL[s]. The second terminal of the capacitor C5 is electrically connected to the wiring XCL[s]. In the cell IM[s, 1] in FIG. 4, a connection portion of the first terminal of the transistor F1, the gate of the transistor F2, and the first terminal of the capacitor C5 is the node N[s, 1].

In the cell IM[1, s], the second terminal of the transistor F1 and the second terminal of the transistor F5 are electrically connected to the wiring WCL[s], and the gate of the transistor F1 is electrically connected to the wiring WSL[1]. The second terminal of the capacitor C5 is electrically connected to the wiring XCL[1]. In the cell IM[1, s] in FIG. 4, a connection portion of the first terminal of the transistor F1, the gate of the transistor F2, and the first terminal of the capacitor C5 is the node N[1, s].

In the cell IM[s, s], the second terminal of the transistor F1 and the second terminal of the transistor F5 are electrically connected to the wiring WCL[s], and the gate of the transistor F1 is electrically connected to the wiring WSL[s]. The second terminal of the capacitor C5 is electrically connected to the wiring XCL[s]. In the cell IM[s, s] in FIG. 4, a connection portion of the first terminal of the transistor F1, the gate of the transistor F2, and the first terminal of the capacitor C5 is the node N[s, s].

In the cell IMD[1], the second terminal of the transistor F1*d* and the second terminal of the transistor F5*d* are electrically connected to the wiring XCL[1], and the gate of the transistor F1*d* is electrically connected to the wiring WSL[1]. A second terminal of the capacitor C5*d* is electrically connected to the wiring XCL[1]. In the cell IMD[1] in FIG. 4, a connection portion of the first terminal of the transistor F1*d*, the gate of the transistor F2*d*, and the first terminal of the capacitor C5*d* is the node Nd[1].

In the cell IMD[s], the second terminal of the transistor F1*d* and the second terminal of the transistor F5*d* are electrically connected to the wiring XCL[s], and the gate of the transistor F1*d* is electrically connected to the wiring WSL[s]. The second terminal of the capacitor C5*d* is electrically connected to the wiring XCL[s]. In the cell IMD[s] in FIG. 4, a connection portion of the first terminal of the transistor F1*d*, the gate of the transistor F2*d*, and the first terminal of the capacitor C5*d* is the node Nd[s].

Note that the node N[1, 1], the node N[1, s], the node N[s, 1], the node N[s, s], the node Nd[1], and the node Nd[s] function as retention nodes of their respective cells.

In each of the cell IM[1, 1] to the cell IM[s, s], for example, when the transistor F1 and the transistor F5 are in an on state, a conduction state is established between the gate and the second terminal of the transistor F2. When a fixed potential applied to the wiring VE0 is the ground potential (GND), the transistor F1 is in an on state, and a current with a current amount I flows from the wiring WCL to the second terminal of the transistor F2, the potential of the gate of the transistor F2 (the node N) is determined in accordance with the current amount I. Since the transistor F1 is in an on state, the potential of the second terminal of the transistor F2 is ideally equal to that of the gate of the transistor F2 (the node N). Here, by turning off the transistor F1, the potential of the gate of the transistor F2 (the node N) is retained by the capacitor C5. Accordingly, in the transistor F2, a current with the current amount I corresponding to the ground potential of the first terminal of the transistor F2 and the potential of the gate of the transistor F2 (the node N) flow between the source and the drain of the transistor F2. In this specification and the like, such an operation is called "setting (programing) the amount of current flowing between the source and the drain of the transistor F2 in the cell IM to I", for example.

In a similar manner, the amount of current flowing between the source and the drain of the transistor F2d in each of the cell IMD[1] to the cell IMD[s] can be set when the transistor F1 is replaced with the transistor F1d, the transistor F2 is replaced with the transistor F2d, and the node N is replaced with the node Nd in the above description.

[Circuit WSD]

The circuit WSD has a function of selecting a row in the arithmetic cell array MACA to which the first data is to be written, by supplying a predetermined signal to the wiring WSL[k] at the time of writing the first data to each of the arithmetic cells included in the arithmetic cell array MACA, for example.

For example, in FIG. 4, when the circuit WSD supplies a high-level potential to the wiring WSL[1] and supplies a low-level potential to the wiring WSL[2] (not illustrated) to the wiring WSL[s], the transistor F1 and the transistor F1d each including a gate electrically connected to the wiring WSL[1] can be turned on and the transistors F1 and the transistors F1d including gates electrically connected to the wiring WSL[2] to the wiring WSL[s] can be turned off.

[Circuit WCS]

The circuit WCS has a function of obtaining the first data, which is digital data, from the outside of the circuit UNT, converting the first data into analog data (current), and further supplying the first data converted into the analog data to the arithmetic cells included in the arithmetic cells included in the arithmetic cell array MACA, for example. For example, in FIG. 4, in the case where the circuit WCS writes the first data to the arithmetic cells in the k-th column in the arithmetic cell array MACA, the circuit WCS supplies the first data to the arithmetic cells in the k-th column in the arithmetic cell array MACA through the wiring WCL[k].

The circuit WCS includes a circuit SWCA and a circuit WCSa[1] to a circuit WCSa[s], for example.

The circuit SWCA has a function of establishing a conduction state or a non-conduction state between the wiring WCL[k] and the circuit WCSa[k].

The circuit SWCA includes a switch SA[1] to a switch SA[s], for example.

A first terminal of the switch SA[k] is electrically connected to the wiring WCL[k], a second terminal of the switch SA[k] is electrically connected to the circuit WCSa[k], and a control terminal of the switch SA[k] is electrically connected to a wiring SWLA.

As the switch SA[k], an electrical switch (such as an analog switch and a transistor) can be used, for example. Specifically, as an electrical switch for the switch SA[k], the above-described transistor is preferably used, and in particular, an OS transistor is further preferably used. In the case where an electrical switch is used as the switch SA[k], the electrical switch can be a Si transistor other than an OS transistor, for example. For another example, a mechanical switch may be used as the switch SA[k].

In this specification and the like, the switch SA[k] illustrated in FIG. 4 is in an on state when a high-level potential is supplied to the control terminal, and is in an off state when a low-level potential is supplied to the control terminal.

The wiring SWLA functions as a wiring for switching between an on state and an off state of the switch SA[k], for example. Accordingly, the wiring SWLA is supplied with a high-level potential or a low-level potential.

As described above, the circuit SWCA functions as a circuit that establishes a conduction state or a non-conduction state between the circuit WCS and the wiring WCL[k]. That is, the circuit SWCA switches to a conduction state or a non-conduction state between the circuit WCS and the wiring WCL[k] by using the switch SA[k].

The circuit WCSa[1] to the circuit WCSa[s] are electrically connected to the terminal IWT[1] to the terminal IWT[s], respectively in a one-to-one correspondence manner.

The terminal IWT[1] to the terminal IWT[s] function as terminals for receiving the first data, which is digital data from the outside of the circuit UNT.

The circuit WCSa[k] has a function of obtaining the first data from the outside through the terminal IWT[k] and supplying a signal corresponding to the first data to the wiring WCL[k], for example. Specifically, when the switch SA[k] is in an on state, the circuit WCSa[k] supplies the first data to be stored in the cells included in the arithmetic cell array MACA. Note that in the case of the arithmetic cell array MACA in FIG. 4, the signal is preferably analog data (current).

Figure 7A:
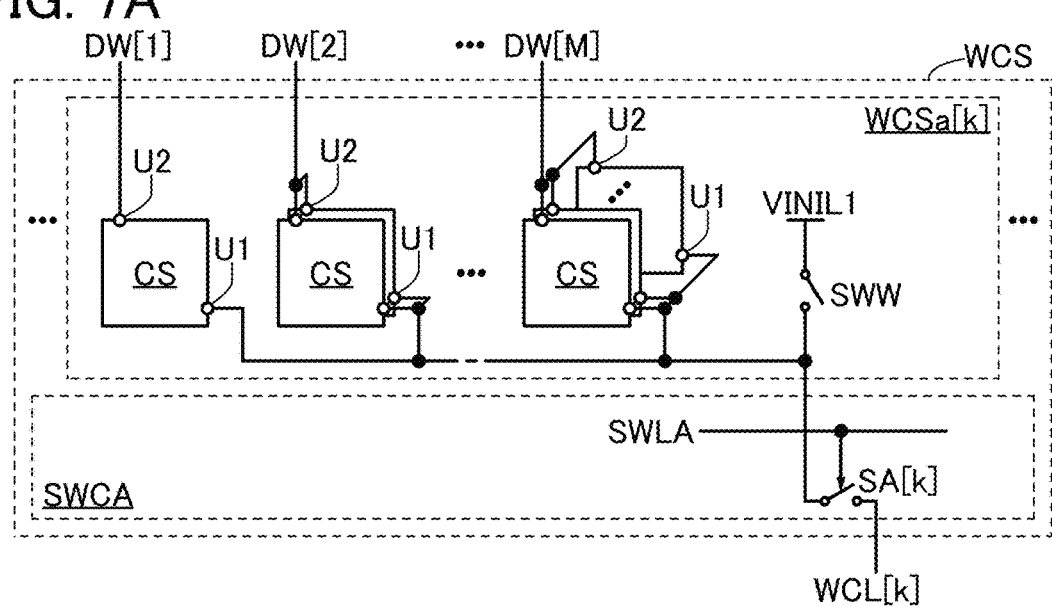
FIG. 7A to FIG. 7C are circuit diagrams each illustrating a structure example of a circuit included in a semiconductor device.

The circuit WCSa[k] can have a structure illustrated in FIG. 7A, for example. FIG. 7A also shows the circuit SWCA, the switch SA[k], the wiring SWLA, and the wiring WCL[k] to illustrate electrical connection between the circuit WCSa[k] and its peripheral circuits.

Thus, the switch SA[k] illustrated in FIG. 7A can be any one of the switch SA[1] to the switch SA[s] included in the circuit SWCA in FIG. 4. Similarly, the wiring WCL[k] can be any one of the wiring WCL[1] to the wiring WCL[s] extending in the arithmetic cell array MACA in FIG. 4.

Accordingly, the circuit WCSa[k] is electrically connected to the wiring WCL[k] through the switch SA[k].

The circuit WCSa[k] illustrated in FIG. 7A includes a switch SWW, for example. A first terminal of the switch SWW is electrically connected to the second terminal of the switch SA[k], and a second terminal of the switch SWW is electrically connected to a wiring VINIL1. The wiring VINIL1 functions as a wiring for supplying an initialization potential to the wiring WCL, and the initialization potential can be set to the ground potential (GND), a low-level potential, or a high-level potential. Note that the switch SWW is in an on state only when the initialization potential is supplied to the wiring WCL[k]; otherwise, the switch is in an off state.

As the switch SWW, an electrical switch (such as an analog switch and a transistor) can be used, for example. When a transistor is used as the switch SWW, for example, the transistor can be a transistor having a structure similar to that of the transistor F1 or the transistor F2. Other than the electrical switch, a mechanical switch may be used.

The circuit WCSa in FIG. 7A includes a plurality of current sources CS, for example. Specifically, the circuit WCSa[k] has a function of outputting M-bit first data ($2^M$ values) (M is an integer greater than or equal to 1) as a current amount; in this case, the circuit WCSa[k] includes $2^M-1$ current sources CS. The circuit WCSa[k] includes one current source CS that outputs information corresponding to the first bit value as a current, two current sources CS that output information corresponding to the second bit value as a current, and $2^{M-1}$ current sources CS that output information corresponding to the M-th bit value as a current, for example.

Each of the current sources CS in FIG. 7A includes a terminal U1 and a terminal U2. The terminal U1 of each of the current sources CS is electrically connected to the second terminal of the switch SA included in the circuit SWCA. The terminal U2 of the one current source CS is electrically connected to a wiring DW[1], the terminals U2 of the two current sources CS are electrically connected to a wiring DW[2], and the terminals U2 of the $2^{M-1}$ current sources CS are electrically connected to a wiring DW[M].

The plurality of current sources CS included in the circuit WCSa[k] have a function of outputting the same constant current $I_{Wut}$ from the terminals U1. In practice, at the manufacturing stage of the circuit UNT, the transistors included in the current sources CS may have different electrical characteristics; this may yield errors. Thus, the errors in constant currents $I_{Wut}$ output from each of the terminals U1 of the plurality of current sources CS are preferably small. For example, the errors in constant currents $I_{Wut}$ output from the terminals U1 of the plurality of current sources CS are preferably within 10%, further preferably within 5%, still further preferably within 1%. In particular, in the circuit UNT, addition of currents is performed; thus, accumulation of errors is caused by the addition, and the arithmetic operation result is shifted from a desired value in some cases. Thus, the above-described error range is an example, and depending on the specifications of the arithmetic circuit CDV, the errors in the constant currents $I_{Wut}$ are sometimes required to be less than or equal to 0.1%. On the other hand, as long as the circuit UNT operates normally, the errors in the constant currents $I_{Wut}$ output from the terminals U1 of the plurality of current sources CS may exceed 10%. In this embodiment, the description is made on the assumption that there are no errors in constant currents $I_{Wut}$ output from the terminals U1 of the plurality of current sources CS included in the circuit WCSa[k].

The wiring DW[1] to the wiring DW[M] are electrically connected to the terminal IWT[k] described above. That is, the wiring DW[1] to the wiring DW[M] function as wirings for obtaining the first data, which is digital data supplied from the outside of the circuit UNT. Specifically, the wiring DW[1] to the wiring DW[M] function as wirings for transmitting signals to make the current sources CS electrically connected to the wiring DW[1] to the wiring DW[M] output constant currents $I_{Wut}$. For example, when a high-level potential is supplied to the wiring DW[1], the current source CS electrically connected to the wiring DW[1] supplies $I_{Wut}$ as a constant current to the second terminal of the switch SA[k], and when a low-level potential is supplied to the wiring DW[1], the current source CS electrically connected to the wiring DW[1] does not output $I_{Wut}$. For example, when a high-level potential is supplied to the wiring DW[2], the two current sources CS electrically connected to the wiring DW[2] supply a constant current of $2I_{Wut}$ in total to the second terminal of the switch SA[k], and when a low-level potential is supplied to the wiring DW[2], the current sources CS electrically connected to the wiring DW[2] do not output a constant current of $2I_{Wut}$ in total. For example, when a high-level potential is supplied to the wiring DW[M], the $2^{M-1}$ current sources CS electrically connected to the wiring DW[M] supply a constant current of $2^{M-1}I_{Wut}$ in total to the second terminal of the switch SA[k], and when a low-level potential is supplied to the wiring DW[M], the current sources CS electrically connected to the wiring DW[M] do not output a constant current of $2^{M-1}I_{Wut}$ in total.

The amount of current flowing from the one current source CS electrically connected to the wiring DW[1] corresponds to the value of the first bit, the amount of current flowing from the two current sources CS electrically connected to the wiring DW[2] corresponds to the value of the second bit, and the amount of current flowing from the $2^{M-1}$ current sources CS electrically connected to the wiring DW[M] corresponds to the value of the M-th bit. The circuit WCSa with M of 2 is considered here. For example, when the value of the first bit is "1" and the value of the second bit is "0", a high-level potential is supplied to the wiring DW[1], and a low-level potential is supplied to the wiring DW[2]. In this case, $I_{Wut}$ flows as a constant current to the second terminal of the switch SA[k] of the circuit SWCA from the circuit WCSa. For example, when the value of the first bit is "0" and the value of the second bit is "1", a low-level potential is supplied to the wiring DW[1], and a high-level potential is supplied to the wiring DW[2]. In this case, $2I_{Wut}$ flows as a constant current to the second terminal of the switch SA[k] of the circuit SWCA from the circuit WCSa. For example, when the value of the first bit is "1" and the value of the second bit is "1", a high-level potential is supplied to each of the wiring DW[1] and the wiring DW[2]. In this case, $3I_{Wut}$ flows as a constant current to the second terminal of the switch SA[k] of the circuit SWCA from the circuit WCSa. For example, when the value of the first bit is "0" and the value of the second bit is "0", a low-level potential is supplied to each of the wiring DW[1] and the wiring DW[2]. In this case, no constant current flows from the circuit WCSa to the second terminal of the switch SA[k] of the circuit SWCA.

FIG. 7A illustrates the circuit WCSa[k] where M is an integer greater than or equal to 3; when M is 1, the current sources CS electrically connected to the wiring DW[2] to the wiring DW[M] are not provided in the circuit WCSa in FIG. 7A. When M is 2, the current sources CS electrically connected to the wiring DW[3] (not illustrated) to the wiring DW[M] are not provided in the circuit WCSa in FIG. 7A.

Next, a specific structure example of the current source CS is described.

A current source CS1 illustrated in FIG. 8A is a circuit that can be used as the current source CS included in the circuit WCSa in FIG. 7A, and the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal U1, and a gate of the transistor Tr2 is electrically connected to the terminal U2. The terminal U2 is electrically connected to the wiring DW.

The wiring DW is any one of the wiring DW[1] to the wiring DW[M] in FIG. 7A.

The wiring VDDL functions as a wiring for supplying a fixed potential. The fixed potential can be a high-level potential, for example.

When the fixed potential supplied to the wiring VDDL is a high-level potential, a high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 is electrically connected to the second terminal of the transistor Tr1, the gate-source voltage of the transistor Tr1 is 0 V. Thus, when the threshold voltage of the transistor Tr1 is within an appropriate range, a current in the current range of the subthreshold region (drain current) flows between the first terminal and the second terminal of the transistor Tr1. The amount of current is preferably smaller than or equal to $1.0 \times 10^{-8}$ A, further preferably smaller than or equal to $1.0 \times 10^{-12}$ A, still further preferably smaller than or equal to $1.0 \times 10^{-15}$ A, for example, when the transistor Tr1 is an OS transistor. For example, the current is further preferably within a range where the current exponentially increases with respect to the gate-source voltage. That is, the transistor Tr1 functions as a current source for supplying a current within a current range of the transistor Tr1 operating in the subthreshold region. The current corresponds to $I_{W_{ut}}$ described above or $I_{X_{ut}}$ described later.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, a back gate-source voltage becomes 0 V. Thus, when the threshold voltage of the transistor Tr2 is within an appropriate range and a high-level potential is input to the gate of the transistor Tr2, the transistor Tr2 is turned on; when a low-level potential is input to the gate of the transistor Tr2, the transistor Tr2 is turned off. Specifically, when the transistor Tr2 is in an on state, the current within the current range of the subthreshold region flows from the second terminal of the transistor Tr1 to the terminal U1, and when the transistor Tr2 is in an off state, the current does not flow from the second terminal of the transistor Tr1 to the terminal U1.

The circuit that can be used as the current source CS included in the circuit WCSa[k] in FIG. 7A is not limited to the current source CS1 in FIG. 8A. For example, the current source CS1 has a structure in which the back gate of the transistor Tr2 and the second terminal of the transistor Tr2 are electrically connected to each other; however, the back gate of the transistor Tr2 may be electrically connected to another wiring. Such a structure example is illustrated in FIG. 8B. In a current source CS2 illustrated in FIG. 8B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. In particular, the off-state current of the transistor Tr2 can be reduced by an increase in the threshold voltage of the transistor Tr2.

For example, the current source CS1 has a structure in which the back gate of the transistor Tr1 and the second terminal of the transistor Tr1 are electrically connected to each other; however, the voltage between the back gate and the second terminal of the transistor Tr1 may be retained with a capacitor. Such a structure example is illustrated in FIG. 8C. A current source CS3 illustrated in FIG. 8C includes a transistor Tr3 and a capacitor C7 in addition to the transistor Tr1 and the transistor Tr2. The current source CS3 is different from the current source CS1 in that the second terminal of the transistor Tr1 and the back gate of the transistor Tr1 are electrically connected to each other through the capacitor C7, and the back gate of the transistor Tr1 and a first terminal of the transistor Tr3 are electrically connected to each other. In the current source CS3, a second terminal of the transistor Tr3 is electrically connected to a wiring VTL, and a gate of the transistor Tr3 is electrically connected to a wiring VWL. In the current source CS3, the wiring VWL is supplied with a high-level potential to turn on the transistor Tr3, so that a conduction state is established between the wiring VTL and the back gate of the transistor Tr1. In this case, a predetermined potential can be input to the back gate of the transistor Tr1 from the wiring VTL. The wiring VWL is supplied with a low-level potential to turn off the transistor Tr3, so that the voltage between the second terminal of the transistor Tr1 and the back gate of the transistor Tr1 can be retained with the capacitor C7. The threshold voltage of the transistor Tr1 can be changed when the voltage supplied to the back gate of the transistor Tr1 is determined by the wiring VTL, and the threshold voltage of the transistor Tr1 can be fixed with the transistor Tr3 and the capacitor C7.

For example, as the circuit structure that can be used as the current source CS included in the circuit WCSa[k] in FIG. 7A, a current source CS4 illustrated in FIG. 8D may be used. The current source CS4 is different from the current source CS3 in FIG. 8C in that the back gate of the transistor Tr2 is electrically connected not to the second terminal of the transistor Tr2 but to the wiring VTHL. That is, in the current source CS4, the threshold voltage of the transistor Tr2 can be changed with the potential supplied to the wiring VTHL, as in the current source CS2 in FIG. 8B.

When a high current flows between the first terminal and the second terminal of the transistor Tr1 in the current source CS4, to supply the current from the terminal U1 to the outside of the current source CS4, the on-state current of the transistor Tr2 needs to be increased. In this case, in the current source CS4, the wiring VTHL is supplied with a high-level potential to reduce the threshold voltage of the transistor Tr2 and increase the on-state current of the transistor Tr2, whereby a high current flowing between the first terminal and the second terminal of the transistor Tr1 can be supplied from the terminal U1 to the outside of the current source CS4.

The use of any of the current source CS1 to the current source CS4 illustrated in FIG. 8A to FIG. 8D as the current sources CS included in the circuit WCSa[k] in FIG. 7A enables the circuit WCSa to output a current corresponding to the M-bit first data. The amount of current can be the amount of current flowing between the first terminal and the second terminal of the transistor F1 in the range where the transistor F1 operates in the subthreshold region, for example.

As the current source CS in the circuit WCSa[k] in FIG. 7A, the current source CS2 illustrated in FIG. 8A may be used. In the circuit WCSa[k] in FIG. 7B, one current source CS1 in FIG. 8A is connected to each of the wiring DW[1] to the wiring DW[M]. When the channel width of the transistor Tr1[1] is w[1], the channel width of the transistor Tr1[2] is w[2], and the channel width of the transistor Tr1[M] is w[M], the ratio between the channel widths is $w[1]:w[2]:w[M]=1:2:2^{M-1}$. Since a current flowing between a source and a drain of a transistor that operates in the subthreshold region is proportional to the channel width, the circuit WCSa illustrated in FIG. 7B can output a current corresponding to the M-bit first data like the circuit WCSa in FIG. 7A.

As the transistor Tr1 (including the transistor Tr1[1] to the transistor Tr1[M]), the transistor Tr2 (including the transistor Tr2[1] to the transistor Tr2[M]), and the transistor Tr3, a transistor that can be used as the transistor F1 or the transistor F2 can be used, for example. In particular, as the transistor Tr1 (including the transistor Tr1[1] to the transistor Tr1[M]), the transistor Tr2 (including the transistor Tr2[1] to the transistor Tr2[M]), and the transistor Tr3, OS transistors are preferably used.

[Circuit XCS]

The circuit XCS has a function of obtaining the second data, which is digital data, from the outside of the circuit UNT, converting the second data into analog data (current), and further supplying the second data to the arithmetic cells included in the arithmetic cell array MACA, for example. In the case where the circuit XCS supplies the second data to the arithmetic cells in the k-th row in the arithmetic cell array MACA, for example, the circuit XCS supplies the second data to the arithmetic cells in the k-th row in the arithmetic cell array MACA through the wiring XCL[k].

The circuit XCS includes a circuit XCSa[1] to a circuit XCSa[s], for example.

In FIG. 4, the circuit XCSa[1] is electrically connected to the terminal T1$a$[1] of the switching circuit SWC1, for example. The circuit XCSa[s] is electrically connected to the terminal T1$a$[s] of the switching circuit SWC1, for example.

The circuit XCSa[1] to the circuit XCSa[s] are electrically connected to the terminal IXT[1] to the terminal IXT[s], respectively in a one-to-one correspondence manner.

The terminal IXT[1] to the terminal IXT[s] function as terminals for receiving the second data, which is digital data from the outside of the circuit UNT.

The circuit XCSa[1] to the circuit XCSa[s] have a function of obtaining the later-described reference data from the outside through the terminal IXT[1] to the terminal IXT[s], respectively, and supplying signals corresponding to the reference data to the wiring XCL[1] to the wiring XCL[s], for example. Alternatively, the circuit XCSa[1] to the circuit XCSa[s] have a function of obtaining the second data from the outside through the terminal IXT[1] to the terminal IXT[s], respectively, and supplying signals corresponding to the second data, for example. Note that in the case of the arithmetic cell array MACA in FIG. 4, the above signals are preferably analog data (current).

Figure 7B:
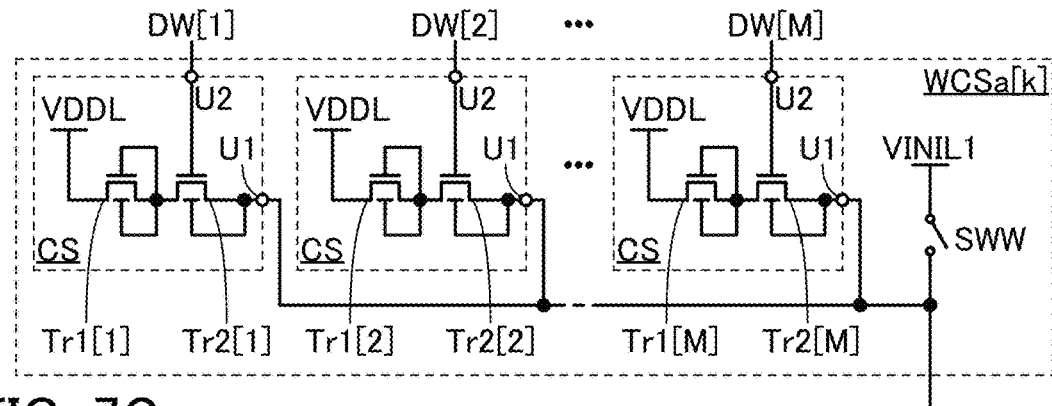
Figure 7C:
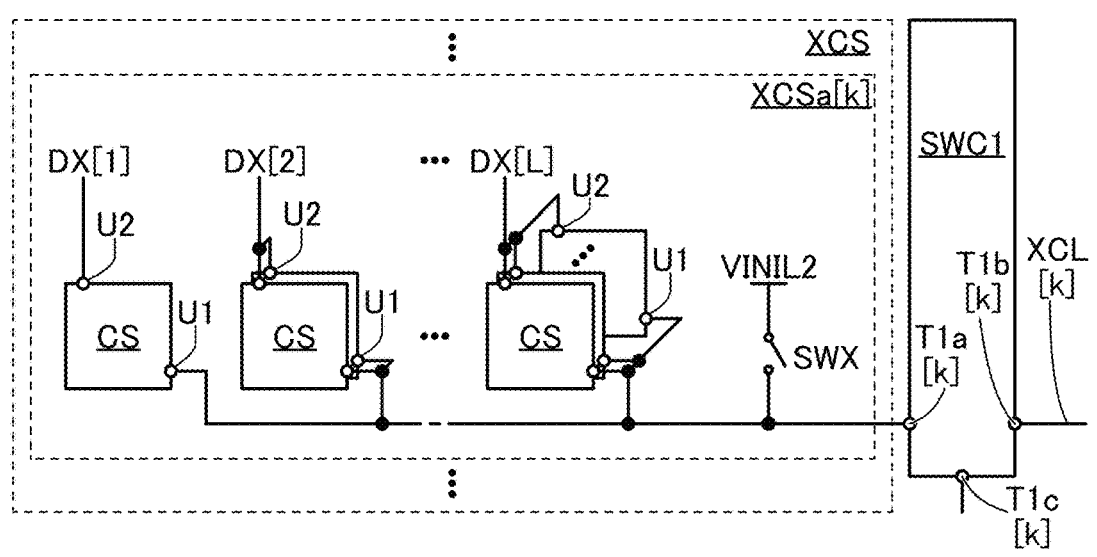

FIG. 7C is a block diagram illustrating an example of the circuit XCSa[k] that can be applied to the arithmetic cell array MACA in FIG. 4. FIG. 7C selectively illustrates the circuit XCSa[k] corresponding to any one of the circuit XCSa[1] to the circuit XCSa[s]. FIG. 7C also illustrates the wiring XCL[k], the selection circuit SWC1, the terminal T1$a$[k], the terminal T1$b$[k], and the terminal T1$c$[k] to show electrical connection between the circuit XCS and its peripheral circuits.

Accordingly, the circuit XCSa[k] is electrically connected to the wiring XCL[k]. Since the switching circuit SWC1 is provided between the wiring XCL[k] and the circuit XCSa[k], the switching circuit SWC1 can switch to a conduction state or a non-conduction state between the circuit XCSa[k] and the wiring WCL[k].

The circuit XCSa[k] illustrated in FIG. 7C includes a switch SWX, for example. A first terminal of the switch SWX is electrically connected to the wiring XCL[k], and a second terminal of the switch SWX is electrically connected to a wiring VINIL2. The wiring VINIL2 functions as a wiring for supplying an initialization potential to the wiring XCL[k], and the initialization potential can be set to the ground potential (GND), a low-level potential, or a high-level potential. The initialization potential supplied to the wiring VINIL2 may be equal to the potential supplied to the wiring VINIL1. The switch SWX is in an on state only when the initialization potential is supplied to the wiring XCL[k]; otherwise, the switch is in an off state.

As the switch SWX, for example, a switch that can be used as the switch SWW can be used.

The circuit XCSa[k] in FIG. 7C can have substantially the same structure as the circuit WCSa[k] in FIG. 7A. Specifically, the circuit XCSa[k] has a function of outputting the reference data as a current amount, and a function of outputting L-bit second data ($2^L$ values) (L is an integer greater than or equal to 1) as a current amount; in this case, the circuit XCSa[i] includes $2^L-1$ current sources CS. The circuit XCSa[i] includes one current source CS that outputs information corresponding to the first bit value as a current, two current sources CS that output information corresponding to the second bit value as a current, and $2^{L-1}$ current sources CS that output information corresponding to the L-th bit value as a current.

The reference data output from the circuit XCSa[k] as a current can be information in which the first bit value is "1" and the second and subsequent bit values are "0", for example.

In FIG. 7C, the terminal U2 of the one current source CS is electrically connected to a wiring DX[1], the terminals U2 of the two current sources CS are electrically connected to a wiring DX[2], and the terminals U2 of the $2^{L-1}$ current sources CS are electrically connected to a wiring DX[L].

The plurality of the current sources CS included in the circuit XCSa[k] have a function of outputting the same constant current $I_{Xut}$ from the terminals U1. The wiring DX[1] to the wiring DX[L] are electrically connected to the terminal IXT[k] described above. That is, the wiring DX[1] to the wiring DX[Z] function as wirings for obtaining the reference data, which is digital data from the outside, or the second data. Specifically, the wiring DX[1] to the wiring DX[Z] function as wirings for transmitting control signals to make the current sources CS electrically connected to the wiring DX[1] to the wiring DX[L] output $I_{Xut}$. In other words, the circuit XCSa[k] has a function of making a current with the amount corresponding to the L-bit information transmitted from the wiring DX[1] to the wiring DX[L] flow to the wiring XCL[k].

Specifically, the circuit XCSa[k] with L of 2 is considered here. For example, when the value of the first bit is "1" and the value of the second bit is "0", a high-level potential is supplied to the wiring DX[1], and a low-level potential is supplied to the wiring DX[2]. In this case, $I_{Xut}$ flows as a constant current from the circuit XCSa[k] to the wiring XCL. For example, when the value of the first bit is "0" and the value of the second bit is "1", a low-level potential is supplied to the wiring DX[1], and a high-level potential is supplied to the wiring DX[2]. In this case, $2I_{Xut}$ flows as a constant current from the circuit XCSa[k] to the wiring XCL[k]. For example, when the value of the first bit is "1" and the value of the second bit is "1", a high-level potential is supplied to each of the wiring DX[1] and the wiring DX[2]. In this case, $3I_{Xut}$ flows as a constant current from the circuit XCSa[i] to the wiring XCL[i]. For example, when the value of the first bit is "0" and the value of the second bit is "0", a low-level potential is supplied to each of the wiring DX[1] and the wiring DX[2]. In this case, no constant current flows from the circuit XCSa[k] to the wiring XCL[k]. In this specification and the like, this case is sometimes rephrased as "a current with an amount of 0 flows from the circuit XCSa[k] to the wiring XCL[k]". A current amount 0, $I_{Xut}$, $2I_{Xut}$, $3I_{Xut}$, or the like output from the circuit XCSa[k] can be the second data output from the circuit XCSa[k]; specifically, a constant current amount $I_{Xut}$ output from the circuit XCSa[k] can be the reference data output from the circuit XCSa[k].

When the transistors in the current sources CS included in the circuit XCSa[k] have different electrical characteristics and this yields errors, the errors in constant currents $I_{Xut}$ output from the terminals U1 of the plurality of current sources CS are preferably small. For example, the errors in constant currents $I_{X_{ut}}$ output from the terminals U1 of the plurality of current sources CS are preferably within 10%, further preferably within 5%, still further preferably within 1%. In particular, in the circuit UNT, addition of currents is performed; thus, the accumulation of errors is caused by the addition, and the arithmetic operation result is shifted from a desired value in some cases. Thus, the above-described error range is only an example, and depending on the specifications of the arithmetic circuit CDV, the errors in the constant currents $I_{W_{ut}}$ are sometimes required to be less than or equal to 0.1%. On the other hand, as long as the circuit UNT operates normally, the errors in the constant currents $I_{X_{ut}}$ output from the terminals U1 of the plurality of current sources CS may exceed 10%. In this embodiment, the description is made on the assumption that there are no errors in the constant currents $I_{X_{ut}}$ output from the terminals U1 of the plurality of current sources CS included in the circuit XCSa.

As the current source CS of the circuit XCSa[k], any of the current source CS1 to the current source CS4 in FIG. 8A to FIG. 8D can be used in a manner similar to that of the current source CS of the circuit WCSa[k]. In that case, the wiring DW[1] to the wiring DW[M] illustrated in FIG. 8A to FIG. 8D is replaced with the wiring DX[1] to the wiring DX[L]. This allows the circuit XCSa[k] to make a current within the current range of the subthreshold region flow through the wiring XCL[k] as the reference data or the L-bit second data.

The circuit XCSa[k] in FIG. 7C can have a circuit structure similar to that of the circuit WCSa[k] illustrated in FIG. 7B. In that case, the circuit WCSa[k] illustrated in FIG. 7B is replaced with the circuit XCSa[k], the terminal IWT[k] is replaced with the terminal IXT[k], the wiring DW[1] is replaced with the wiring DX[1], the wiring DW[2] is replaced with the wiring DX[2], the wiring DW[M] is replaced with the wiring DX[Z], the switch SWW is replaced with the switch SWX, and the wiring VINIL1 is replaced with the wiring VINIL2.

[Memory Cell Array MEMA]

The memory cell array MEMA has a function of storing a result of an arithmetic operation performed in the arithmetic cell array MACA, for example. Specifically, the result of the arithmetic operation is stored in the memory cell included in the memory cell array MEMA.

For example, in FIG. 5 and FIG. 6, the memory cell array MEMA includes a cell MC[1, 1] to a cell MC[s, s], for example.

The cell MC[1, 1] to the cell MC[s, s] function as memory cells, for example.

The cell MC[1, 1] to the cell MC[s, s] each include a transistor F7, a transistor F8, a transistor F9, and a capacitor C6, for example.

In particular, the structures (including the channel lengths and the channel widths) of the transistors F7 included in the cell MC[1, 1] to the cell MC[s, s] are preferably the same, the structures of the transistors F8 included in the cell MC[1, 1] to the cell MC[s, s] are preferably the same, and structures of the transistors F9 included in the cell MC[1, 1] to the cell MC[s, s] are preferably the same. For the advantages of employing the same transistor structure, the description of the transistor F1, the transistor F2, and the transistor F5 is to be referred to.

Note that the transistor F7 and the transistor F9 may function as switching elements unless otherwise specified. In other words, the gate voltage, the source voltage, and the drain voltage of each of the above transistors may be appropriately biased to voltages in the range where the transistor operates as switching elements. However, one embodiment of the present invention is not limited thereto. For example, the transistor F7 and the transistor F9 in an on state may operate in a linear region or a saturation region or may operate both in a linear region and a saturation region.

Unless otherwise specified, the transistor F8 may operate in the subthreshold region (i.e., the gate-source voltage may be lower than the threshold voltage in the transistor F8, further preferably, the drain current increases exponentially with respect to the gate-source voltage). In other words, the gate voltage, the source voltage, and the drain voltage of the transistor F8 may be appropriately biased to voltages in the range where the transistor operates in the subthreshold region. Thus, the transistor F8 may operate such that an off-state current flows between the source and the drain.

Note that as each of the transistors F7 to the transistor F9, a transistor that can be used as the transistor F1, the transistor F2, or the transistor F5 can be used, for example.

In each of the cell MC[1, 1] to the cell MC[s, s], a first terminal of the transistor F7 is electrically connected to a gate of the transistor F8. A first terminal of the transistor F8 is electrically connected to a wiring VE2. A first terminal of the capacitor C6 is electrically connected to the gate of the transistor F8. A second terminal of the transistor F8 is electrically connected to a first terminal of the transistor F9. A second terminal of the transistor F9 is electrically connected to a second terminal of the transistor F7, and a second terminal of the capacitor C6 is electrically connected to a wiring VE3.

For back gates of the transistor F7 to the transistor F9 in FIG. 5 or FIG. 6, the above description of the back gates of the transistor F1, the transistor F2, the transistor F5, the transistor F1d, the transistor F2d, and the transistor F5d can be referred to.

The wiring VE2 functions as a wiring for making a current flow between the first terminal and the second terminal of the transistor F8 in each of the cell MC[1, 1] to the cell MC[s, s]. The wiring VE0 functions as a wiring for supplying a fixed potential, for example. The fixed potential can be, for example, a low-level potential or the ground potential.

The wiring VE3 functions as a wiring for applying a potential to the second terminal of the capacitor C6 in each of the cell IM[1, 1] to the cell IM[s, s]. The potential can be, for example, a low-level potential or the ground potential.

In the cell MC[1, 1], the second terminal of the transistor F7 and the second terminal of the transistor F9 are electrically connected to the wiring BL[1], and a gate of the transistor F7 is electrically connected to the wiring WWL [1]. A gate of the transistor F9 is electrically connected to the wiring RWL[1].

In the cell MC[s, 1], the second terminal of the transistor F7 and the second terminal of the transistor F9 are electrically connected to the wiring BL[1], and the gate of the transistor F7 is electrically connected to the wiring WWL[s]. The gate of the transistor F9 is electrically connected to the wiring RWL[s].

In the cell MC[1, s], the second terminal of the transistor F7 and the second terminal of the transistor F9 are electrically connected to the wiring BL[s], and the gate of the transistor F7 is electrically connected to the wiring WWL [1]. The gate of the transistor F9 is electrically connected to the wiring RWL[1].

In the cell MC[s, s], the second terminal of the transistor F7 and the second terminal of the transistor F9 are electrically connected to the wiring BL[s], and the gate of the transistor F7 is electrically connected to the wiring WWL[s]. The gate of the transistor F9 is electrically connected to the wiring RWL[s].

Note that the first terminals of the capacitors C6 in the cell IM[1, 1] to the cell IM[s, s] function as retention nodes of their respective cells.

Next, a writing operation for the cell MC[1, 1] to the cell MC[s, s] will be described. For example, when the transistor F7 and the transistor F9 are in an on state, a conduction state is established between the gate and the second terminal of the transistor F8. When a fixed potential applied to the wiring VE2 is the ground potential (GND), the transistor F7 is in an on state, and a current with a current amount I flows from the wiring BL to the second terminal of the transistor F8, the potential of the gate of the transistor F8 (the node N) is determined in accordance with a current amount I. Since the transistor F7 is in an on state, the potential of the second terminal of the transistor F8 is ideally equal to that of the gate of the transistor F8 (the node N). Here, by turning off the transistor F7, the potential of the gate of the transistor F8 (the node N) is retained by the capacitor C6. After that, the transistor F9 is turned off, whereby the writing operation is completed.

By the above writing operation, the amount of current flowing between the source and the drain of the transistor F8 in the cell MC is set to I. When the transistor F9 is in an off state, no current flows between the source and the drain of the transistor F8.

To read the written data from the cell MC[1, 1] to the cell MC[s, s], the transistor F9 is turned on to make a current with a current amount I set in the transistor F8 flow to the wiring BL.

[Switching Circuit SWC1 and Switching Circuit SWC2]

In FIG. 4, the switching circuit SWC1 has a function of establishing a conduction state or a non-conduction state between the terminal T1a[k] and the terminal T1b[k] and a function of establishing a conduction state or a non-conduction state between the terminal T1b[k] and the terminal T1c[k], for example.

Figure 9A:
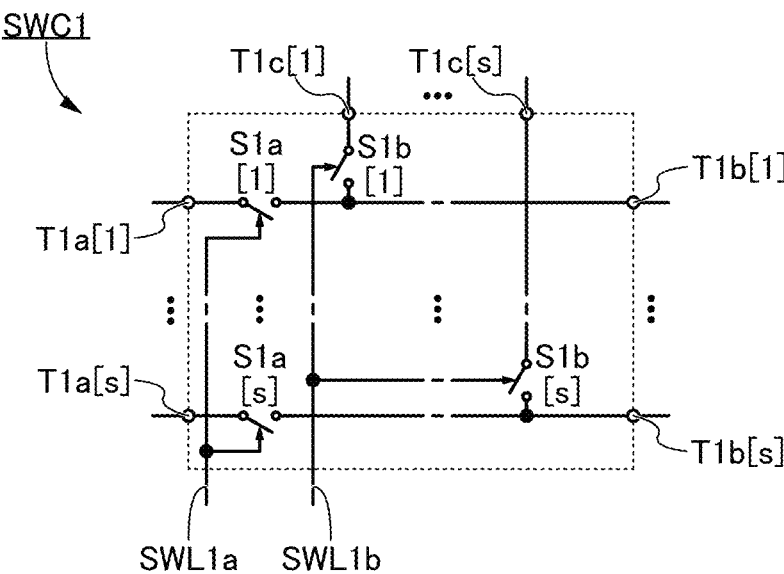
FIG. 9A and FIG. 9B are circuit diagrams each illustrating a structure example of a circuit included in a semiconductor device.

FIG. 9A illustrates a structure example of the switching circuit SWC1. The switching circuit SWC1 in FIG. 9A includes a switch S1a[1] to a switch S1a[s] and a switch S1b[1] to a switch S1b[s], for example.

A first terminal of the switch S1a[k] is electrically connected to the terminal T1a[k], and a second terminal of the switch S1a[k] is electrically connected to the terminal T1b[k]. A first terminal of the switch S1b[k] is electrically connected to the terminal T1b[k], and a second terminal of the switch S1b[k] is electrically connected to the terminal T1c[k].

Control terminals of the switch S1a[1] to the switch S1a[s] are electrically connected to a wiring SWL1a. Control terminals of the switch S1b[1] to the switch S1b[s] are electrically connected to a wiring SWL1b.

The switching circuit SWC2 has a function of establishing a conduction state or a non-conduction state between the terminal T2a[k] and the terminal T2b[k] and a function of establishing a conduction state or a non-conduction state between the terminal T2a[k] and the terminal T2c[k], for example.

Figure 9B:
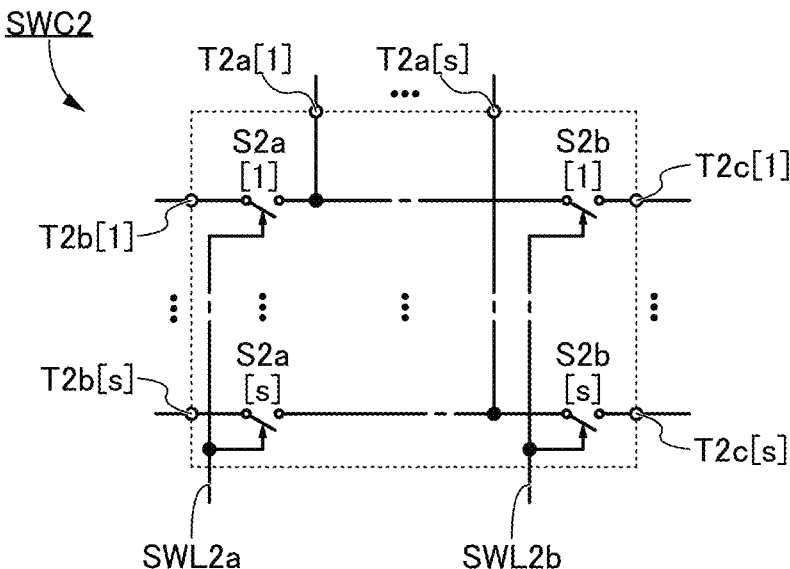

FIG. 9B illustrates a structure example of the switching circuit SWC2. The switching circuit SWC2 in FIG. 9B includes a switch S2a[1] to a switch S2a[s] and a switch S2b[1] to a switch S2b[s], for example.

A first terminal of the switch S2a[k] is electrically connected to the terminal T2a[k], and a second terminal of the switch S2a[k] is electrically connected to the terminal T2b[k]. A first terminal of the switch S2b[k] is electrically connected to the terminal T2a[k], and a second terminal of the switch S2a[k] is electrically connected to the terminal T2c[k].

Control terminals of the switch S2a[1] to the switch S2a[s] are electrically connected to a wiring SWL2a. Control terminals of the switch S2b[1] to the switch S2b[s] are electrically connected to a wiring SWL2b.

Note that as each of the switch S1a[1] to the switch S1a[s], the switch S1b[1] to the switch S1b[s], the switch S2a[1] to the switch S2a[s], and the switch S2b[1] to the switch S2b[s], a switch that can be used as the switch SA[k] can be used, for example.

In this specification and the like, each of the above-described switches is in an on state when a high-level potential is supplied to the control terminal, and each of the above-described switches is in an off state when a low-level potential is supplied to the control terminal.

The wiring SWL1a, the wiring SWL1b, the wiring SWL2a, and the wiring SWL2b each function as a wiring for switching between an on state and an off state of a switch including a control terminal electrically connected to the wiring. Accordingly, for example, the above-described wiring is supplied with a high-level potential or a low-level potential.

With the use of the switching circuit SWC1 and the switching circuit SWC2, an input terminal for inputting a signal to the inside of the switching circuit and an output terminal for outputting the signal to the outside can be selected.

[Current Generation Circuit CM]

In FIG. 5 and FIG. 6, the current generation circuit CM has a function of outputting, to the terminal CTo[k], a current with an amount equal to the amount of current output to the terminal CTi[k], for example.

Figure 10A:
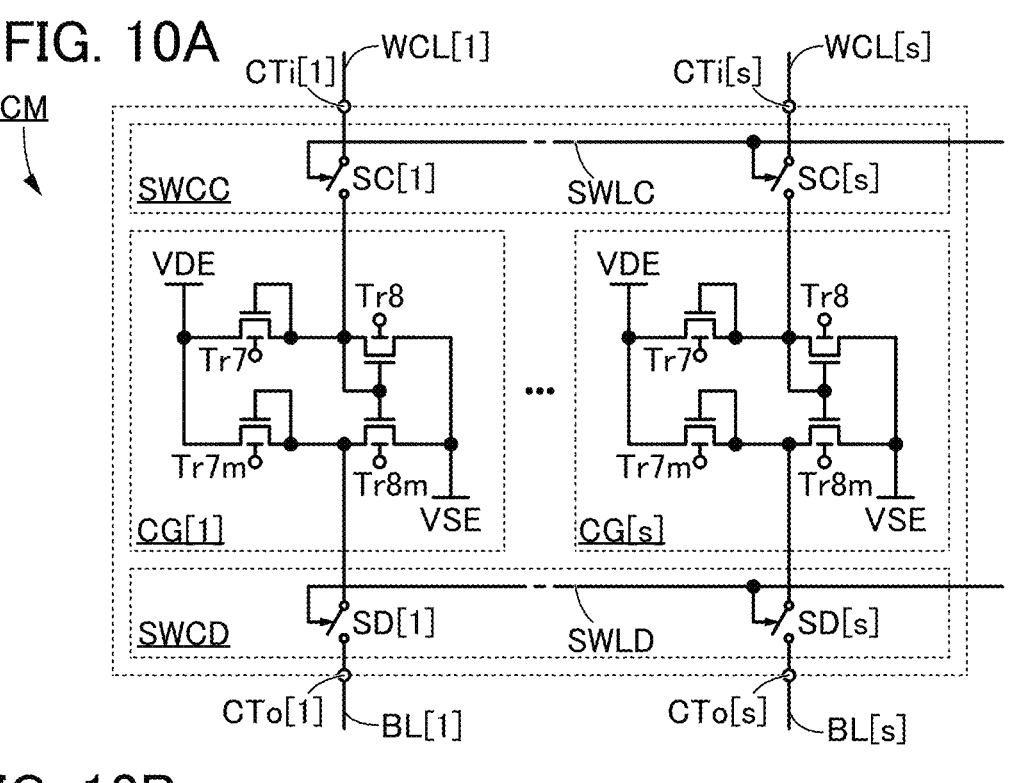
FIG. 10A and FIG. 10B are circuit diagrams each illustrating a structure example of a circuit included in a semiconductor device.

FIG. 10A illustrates a specific circuit structure example of the current generation circuit CM. The current generation circuit CM illustrated in FIG. 10A has a circuit structure applicable to the current generation circuit CM in FIG. 5 and FIG. 6 and includes a circuit CG[1] to a circuit CG[s], a circuit SWCC, and a circuit SWCD.

The circuit CG[1] to the circuit CG[s] can each have the same structure. In this embodiment, the circuit CG[1] to the circuit CG[s] are described as each having the same structure.

The circuit CG[k] (the reference numeral is not illustrated in FIG. 10A) includes a transistor Tr7, a transistor Tr7m, a transistor Tr8, and a transistor Tr8m. Note that in FIG. 10A, the transistor Tr7, the transistor Tr7m, the transistor Tr8, and the transistor Tr8m are n-channel transistors.

The switching circuit SWCC includes a switch SC[1] to a switch SC[s]. The circuit SWCD includes a switch SD[1] to a switch SD[s].

In the circuit CG[k], a first terminal of the transistor Tr7 is electrically connected to a wiring VDE, and a second terminal of the transistor Tr7 is electrically connected to a gate of the transistor Tr7, a first terminal of the transistor Tr8, a gate of the transistor Tr8, a gate of the transistor Tr8m, and a first terminal of a switch SC[k] (the reference numeral is not illustrated in FIG. 10A). A second terminal of the transistor Tr8 is electrically connected to a wiring VSE.

A first terminal of the transistor Tr7m is electrically connected to the wiring VDE, and a second terminal of the transistor Tr7m is electrically connected to a gate of the transistor Tr7m, a first terminal of the transistor Tr8m, and the and a first terminal of a switch SD[k] (the reference numeral is not illustrated in FIG. 10A). A second terminal of the transistor Tr8$m$ is electrically connected to the wiring VSE.

A second terminal of the switch SC[k] is electrically connected to the terminal CTi[k], and a control terminal of the switch SC[k] is electrically connected to a wiring SWLC. A second terminal of the switch SD[k] is electrically connected to the terminal CTo[k], and a control terminal of the switch SD[k] is electrically connected to a wiring SWLD.

The terminal CTi[k] is electrically connected to the wiring WCL[k] (the reference numeral is not illustrated in FIG. 10A), and the terminal CTo[k] is electrically connected to the wiring BL[k] (the reference numeral is not illustrated in FIG. 10A).

The wiring SWLC functions as a wiring for switching between an on state and an off state of the switch SC[k], for example. Accordingly, the wiring SWLC is supplied with a high-level potential or a low-level potential. The wiring SWLD functions as a wiring for switching between an on state and an off state of the switch SD[k], for example. Accordingly, the wiring SWLD is supplied with a high-level potential or a low-level potential. The wiring SWLC and the wiring SWLD can be supplied with the same potential at the same time. Thus, the wiring SWLC and the wiring SWLD may be combined into one wiring.

The wiring VDE functions as a wiring for supplying a potential to the first terminal of each of the transistors Tr7 and the transistors Tr7$m$ in the circuit CG[1] to the circuit CG[s]. The fixed potential can be a high-level potential, for example.

The wiring VSE functions as a wiring for supplying a potential to the second terminal of each of the transistors Tr8 and the transistors Tr8$m$ in the circuit CG[1] to the circuit CG[s]. The fixed potential can be, for example, the ground potential, a low-level potential, or a negative potential.

In FIG. 10A, when the fixed potential supplied to the wiring VDE is a high-level potential, a high-level potential is input to the first terminal of the transistor Tr7. The potential of the second terminal of the transistor Tr7 is lower than the high-level potential. At this time, the first terminal of the transistor Tr functions as a drain, and the second terminal of the transistor Tr7 functions as a source. Since the gate of the transistor Tr7 is electrically connected to the second terminal of the transistor Tr7, the gate-source voltage of the transistor Tr1 is 0 V. Thus, when the threshold voltage of the transistor Tr1 is within an appropriate range, a current in the current range of the subthreshold region (drain current) flows between the first terminal and the second terminal of the transistor Tr1. The amount of current is preferably smaller than or equal to $1.0 \times 10^{-8}$ A, further preferably smaller than or equal to $1.0 \times 10^{-12}$ A, still further preferably smaller than or equal to $1.0 \times 10^{-15}$ A, for example, when the transistor Tr7 is an OS transistor. For example, the current is further preferably within a range where the current exponentially increases with respect to the gate-source voltage. That is, the transistor Tr7 functions as a current source for supplying a current within a current range of the transistor Tr7 operating in the subthreshold region. Note that the same applies to the transistor Tr7$m$.

In FIG. 10A, the first terminal of the transistor Tr8 is electrically connected to the gate of the transistor Tr8 and the gate of the transistor Tr8$m$; thus, the connection structure between the transistor Tr8 and the transistor Tr8$m$ forms a current mirror circuit. In other words, ideally, the amount of current flowing between a source and a drain of the transistor Tr8 is equal to the amount of current flowing between a source and a drain of the transistor Tr8$m$.

When each of the switch SC[k] and the switch SD[k] is in an on state, the amount of current flowing between the source and the drain of the transistor Tr8 is $I_{SC}-I_{OP}$, where $I_{SC}$ is the amount of current flowing between a source and a drain of each of the transistor Tr7 and the transistor Tr7$m$ and $I_{OP}$ is the amount of current output from the circuit CG[k] to the terminal CTi[k]. Accordingly, the amount of current flowing between the source and the drain of the transistor Tr8$m$ is also $I_{SC}-I_{OP}$. Thus, the amount of current output from the circuit CG[k] to the terminal CTo[k] is $I_{SC}-(I_{SC}-I_{OP})=I_{OP}$. Accordingly, the circuit CG[k] can output, to the terminal CTo[k], a current with an amount equal to the amount of current output to the terminal CTi[k].

The structures of the circuit CG[1] to the circuit CG[s] according to the semiconductor device of one embodiment of the present invention are not limited to the structures illustrated in FIG. 10A. The structures illustrated in FIG. 10A may be changed depending on circumstances and applied to the structures of the circuit CG[1] to the circuit CG[s] according to the semiconductor device of one embodiment of the present invention.

Figure 10B:
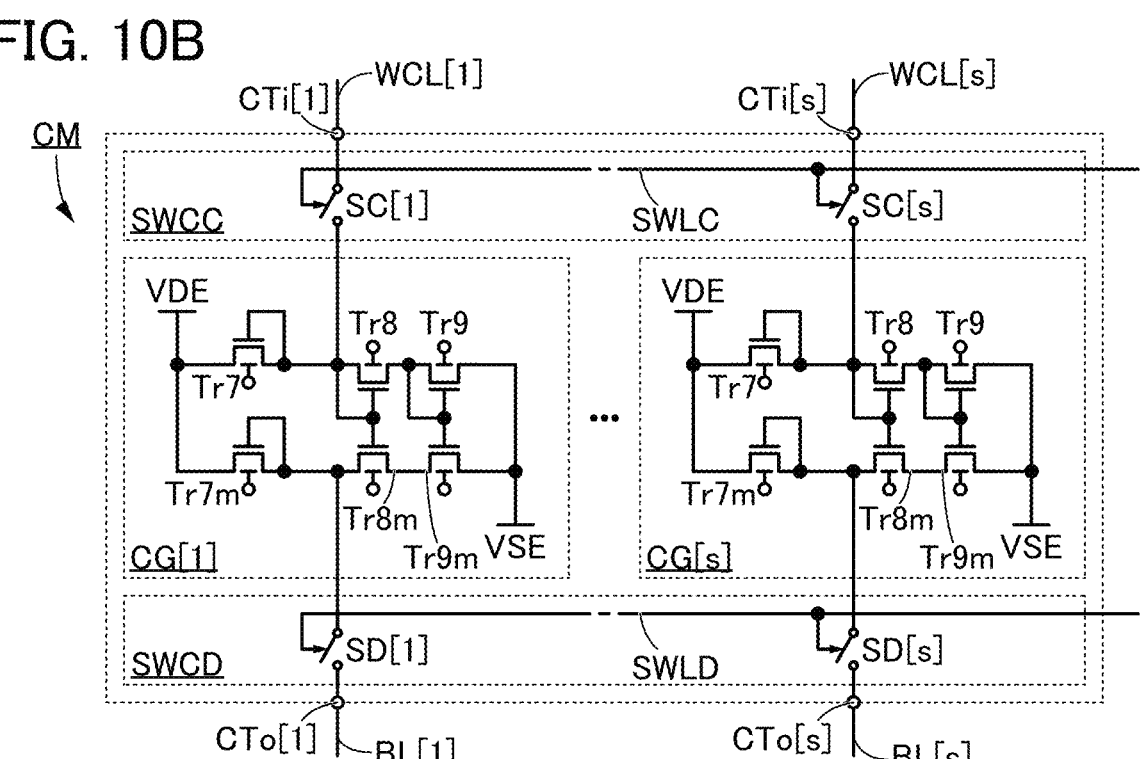

For example, the structures of the circuit CG[1] to the circuit CG[s] illustrated in FIG. 10A may be changed to the structures of the circuit CG[1] to the circuit CG[s] illustrated in FIG. 10B. The circuit CG[k] (the reference numeral is not illustrated in FIG. 10B) in FIG. 10B has a structure in which the circuit CG[k] in FIG. 10A is further provided with a transistor Tr9 and a transistor Tr9$m$, which are n-channel transistors, the transistor Tr8 and the transistor Tr9 are cascode-connected to each other, and the transistor Tr8$m$ and the transistor Tr9$m$ are cascode-connected to each other. When the transistors included in the current mirror circuit are cascode-connected as illustrated in FIG. 10B, the operation of the current mirror circuit can be more stable.

Figure 11:
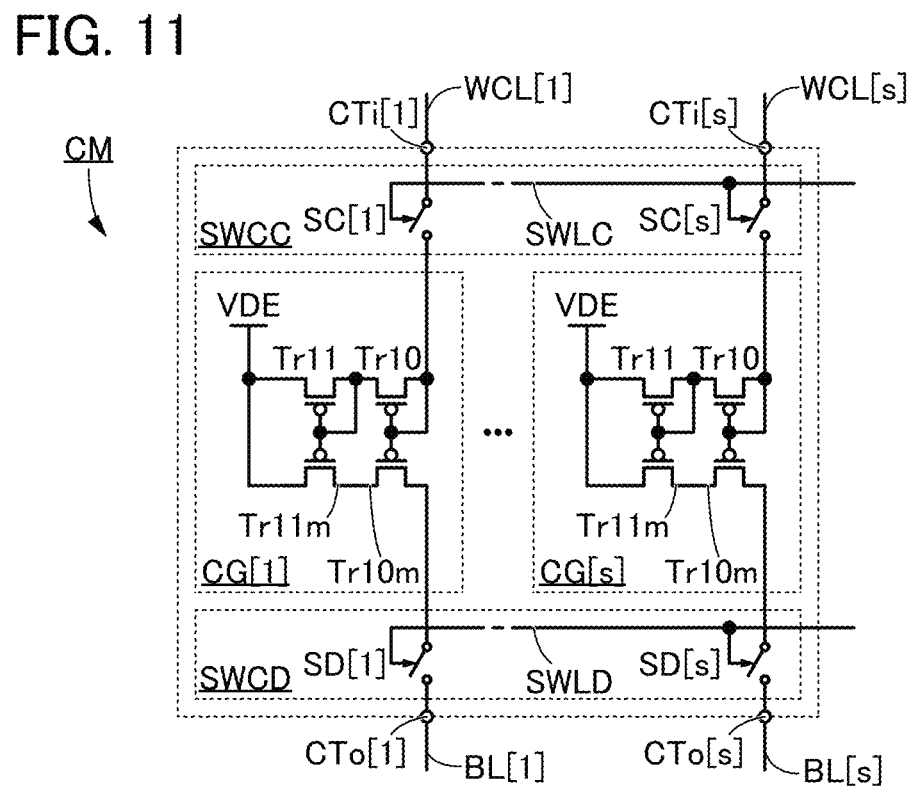

For example, the structures of the current generation circuit CM illustrated in FIG. 2 and FIG. 3 may each be the structure of the current generation circuit CM illustrated in FIG. 11.

The circuit CG[1] to the circuit CG[s] included in the current generation circuit CM in FIG. 11 each include a transistor Tr10, a transistor Tr10$m$, a transistor Tr11, and a transistor Tr11$m$. Note that the transistor Tr10, the transistor Tr10$m$, the transistor Tr11, and the transistor Tr11$m$ are p-channel transistors.

In the circuit CG[k] in FIG. 11, a first terminal of the transistor Tr11 is electrically connected to the wiring VDE, and a second terminal of the transistor Tr11 is electrically connected to a gate of the transistor Tr11, a gate of the transistor Tr11$m$, and a first terminal of the transistor Tr10. A second terminal of the transistor Tr10 is electrically connected to a gate of the transistor Tr10, a gate of the transistor Tr10$m$, and a first terminal of the switch SC[k]. A first terminal of the transistor Tr11$m$ is electrically connected to the wiring VDE, and a second terminal of the transistor Tr11$m$ is electrically connected to a first terminal of the transistor Tr10$m$. A second terminal of the transistor Tr10$m$ is electrically connected to a first terminal of the switch SD[k].

The circuit CG[k] in FIG. 11 has a structure of a current mirror circuit in which the transistor Tr10 and the transistor Tr11 are cascode-connected to each other and the transistor Tr10$m$ and the transistor Tr11$m$ are cascode-connected to each other. Thus, the circuit CG[k] can output, to the terminal CTo[k], a current with an amount equal to the amount of current output to the terminal CTi[k]. Note that the circuit CG[k] in FIG. 11 may be a current mirror circuit having a structure in which the transistor Tr11 and the transistor Tr11m are not provided (cascode connection is not performed), for example.

[Current Generation Circuit RL]

The current generation circuit RL includes an arithmetic circuit of a function system, for example. Specifically, for example, the current generation circuit RL in FIG. 2 and FIG. 3 has a function of performing an arithmetic operation of a function system with the use of a value corresponding to the amount of current output to the terminal RTi[k] as an input value and outputting a current with an amount corresponding to the result of the arithmetic operation to the terminal RTo[k].

The current generation circuit RL may have a function of establishing a conduction state or a non-conduction state between the current generation circuit RL and a wiring electrically connected to the terminal RTi[k]. Similarly, the current generation circuit RL may have a function of establishing a conduction state or a non-conduction state between the current generation circuit RL and a wiring electrically connected to the terminal RTo[k]. For example, in the case where the current generation circuit RL is not used temporarily, a non-conduction state may be established between the current generation circuit RL and a wiring electrically connected to the terminal RTi[k], and a non-conduction state may be established between the current generation circuit RL and a wiring electrically connected to the terminal RTo[k]. Thus, input and output of a current between the current generation circuit RL and the terminal RTi[k] or the terminal RTi[k] can be stopped, whereby power consumption of the current generation circuit RL can be reduced.

The arithmetic circuit of a function system included in the current generation circuit RL can be, for example, an arithmetic circuit of a sigmoid function, a tanh function, a softmax function, a ReLU function, or a threshold function. The current generation circuit RL may include a circuit performing pooling processing, instead of the arithmetic circuit of a function system.

Here, a circuit structure in which the current generation circuit RL includes an arithmetic circuit of a ReLU function is described as an example.

Figure 12:
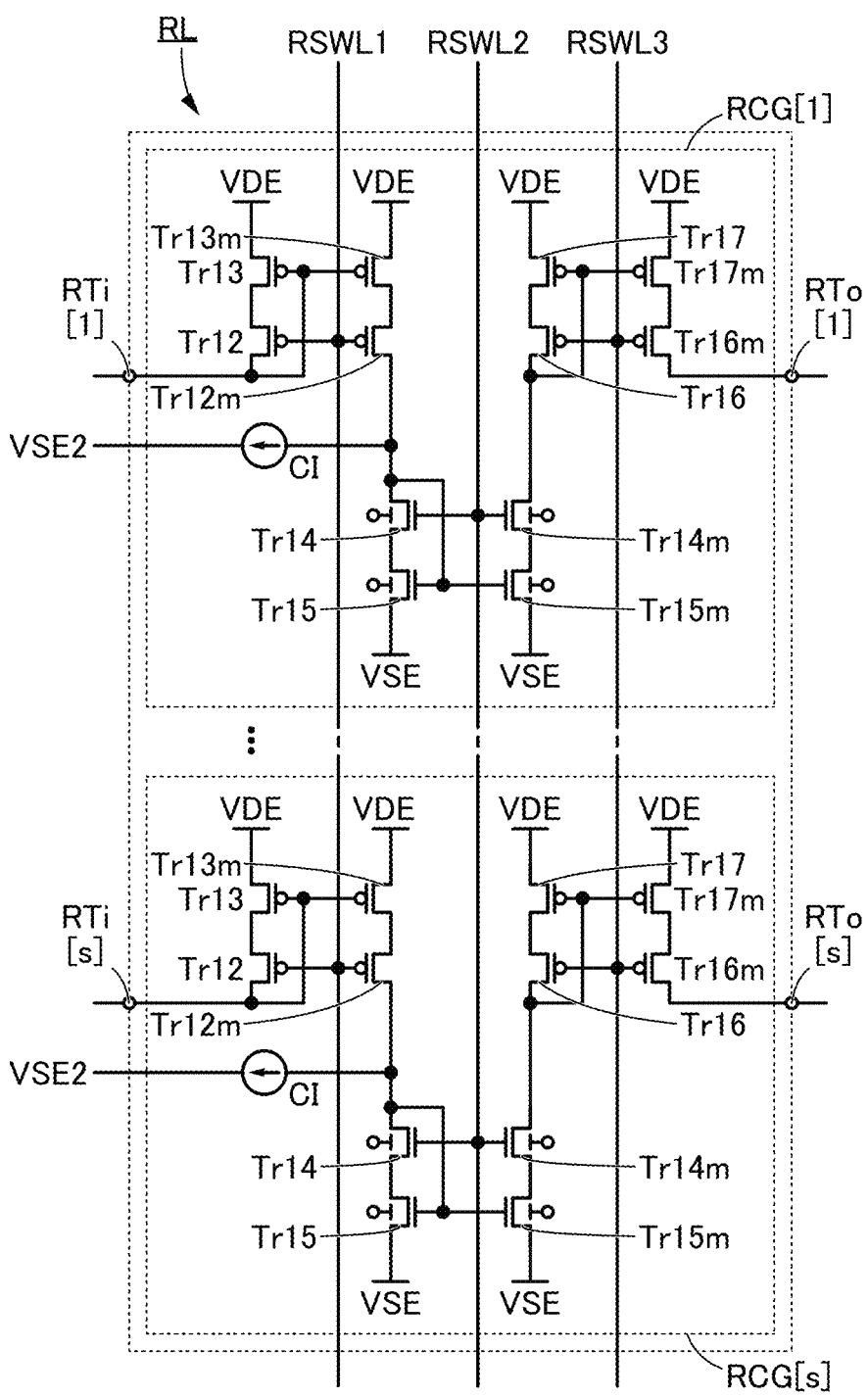
FIG. 12 is a circuit diagram illustrating a structure example of a circuit included in a semiconductor device.

The current generation circuit RL illustrated in FIG. 12 is an example of a circuit structure of the current generation circuit RL in FIG. 2 and FIG. 3 that includes an arithmetic circuit of a ReLU function. The current generation circuit RL illustrated in FIG. 12 includes a circuit RCG[1] to a circuit RCG[s], for example.

The circuit RCG[1] to the circuit RCG[s] can each have the same structure. Note that in this embodiment, the circuit RCG[1] to the circuit RCG[s] are described as each having the same structure.

The circuit RCG[k] (the reference numeral is not illustrated in FIG. 12) includes, for example, a transistor Tr12, a transistor Tr12m, a transistor Tr13, a transistor Tr13m, a transistor Tr14, a transistor Tr14m, a transistor Tr15, a transistor Tr15m, a transistor Tr16, a transistor Tr16m, a transistor Tr17, and a transistor Tr17m. Note that in FIG. 12, the transistor Tr12, the transistor Tr12m, the transistor Tr13, the transistor Tr13m, the transistor Tr16, the transistor Tr16m, the transistor Tr17, and the transistor Tr17m are p-channel transistors. In FIG. 12, the transistor Tr14, the transistor Tr14m, the transistor Tr15, and the transistor Tr15m are n-channel transistors.

In the circuit RCG[k], a first terminal of the transistor Tr13 is electrically connected to the wiring VDE, a second terminal of the transistor Tr13 is electrically connected to a first terminal of the transistor Tr12, and a gate of the transistor Tr13 is electrically connected to a gate of the transistor Tr13m, a second terminal of the transistor Tr12, and the terminal RTi[k]. A gate of the transistor Tr12 is electrically connected to a wiring RSWL1 and a gate of the transistor Tr12m. A first terminal of the transistor Tr13m is electrically connected to the wiring VDE, and a second terminal of the transistor Tr13m is electrically connected to a first terminal of the transistor Tr12m.

The first terminal of the transistor Tr13m is electrically connected to an input terminal of a constant current source CI, a first terminal of the transistor Tr14, a gate of the transistor Tr15, and a gate of the transistor Tr15m. A second terminal of the transistor Tr14 is electrically connected to a first terminal of the transistor Tr15, and a gate of the transistor Tr14 is electrically connected to a wiring RSWL2 and a gate of the transistor Tr14m. A second terminal of the transistor Tr15 is electrically connected to the wiring VSE.

An output terminal of the constant current source CI is electrically connected to a wiring VSE2.

A first terminal of the transistor Tr17 is electrically connected to the wiring VDE, and a second terminal of the transistor Tr17 is electrically connected to a first terminal of the transistor Tr16. A second terminal of the transistor Tr16 is electrically connected to a gate of the transistor Tr17, a gate of the transistor Tr17m, and the first terminal of the transistor Tr14. A second terminal of the transistor Tr14m is electrically connected to a first terminal of the transistor Tr15m, and a second terminal of the transistor Tr15m is electrically connected to the wiring VSE.

A gate of the transistor Tr16 is electrically connected to a wiring RSWL3 and a gate of the transistor Tr16m. A first terminal of the transistor Tr17m is electrically connected to the wiring VDE, and a second terminal of the transistor Tr17m is electrically connected to a first terminal of the transistor Tr16m. A second terminal of the transistor Tr16m is electrically connected to the terminal RTo[k].

The description of the wiring VDE in the description of the current generation circuit CM is to be referred to for the wiring VDE. The description of the wiring VSE in the description of the current generation circuit CM is to be referred to for the wiring VSE.

The wiring VSE2 functions as a wiring for supplying a fixed potential to the output terminal of the constant current source CI. The fixed potential can be, for example, a low-level potential, the ground potential, or a negative potential. The fixed potential supplied to the wiring VSE2 may be equal to the fixed potential supplied to the wiring VSE.

In FIG. 12, the transistor Tr12, the transistor Tr12m, the transistor Tr14, the transistor Tr14m, the transistor Tr16, and the transistor Tr16m function as a switching element, for example. Thus, the wiring RSWL1 functions as, for example, a wiring for switching between the on state and the off state of the transistor Tr12 and the transistor Tr12m. The wiring RSWL2 functions as, for example, a wiring for switching between the on state and the off state of the transistor Tr14 and the transistor Tr14m. The wiring RSWL3 function as, for example, a wiring for switching between the on state and the off state of the transistor Tr16 and the transistor Tr16m.

In FIG. 12, the gate of the transistor Tr13 is electrically connected to the terminal RTi[k] and the gate of the transistor Tr13m; thus, the connection structure between the transistor Tr13 and the transistor Tr13m forms a current mirror circuit. In other words, ideally, the amount of current flowing between a source and a drain of the transistor Tr13 is equal to the amount of current flowing between a source and a drain of the transistor Tr13m.

Similarly, in FIG. 12, the first terminal of the transistor Tr12 is electrically connected to the terminal RTi[k], the gate of the transistor Tr13, and the gate of the transistor Tr13m; thus, the connection structure between the transistor Tr13 and the transistor Tr13m forms the current mirror circuit. In other words, ideally, the amount of current flowing between a source and a drain of the transistor Tr13 is equal to the amount of current flowing between a source and a drain of the transistor Tr13m. Similarly, the gate of the transistor Tr17 is electrically connected to the gate of the transistor Tr17m and the second terminal of the transistor Tr16; thus, the connection structure between the transistor Tr17 and the transistor Tr17m forms a current mirror circuit. In other words, ideally, the amount of current flowing between a source and a drain of the transistor Tr17 is equal to the amount of current flowing between a source and a drain of the transistor Tr17m. The constant current source CI outputs a constant current with a current amount $I_{STD}$ to the wiring VSE2, for example. $I_{STD}$ corresponds to a reference value of a ReLU function in the circuit RCG[k].

Upon output of a current with a current amount $I_{OP}$ from the terminal RTi[k], the circuit RCG[k] outputs a current with a current amount $I_{OP}-I_{STD}$ from the terminal RTo[k] when $I_{OP}>I_{STD}$. When $I_{OP}\leq I_{STD}$, the circuit RCG[k] outputs no current from the terminal RTo[k].

[Circuit ITRZ]

The circuit ITRZ illustrated in FIG. 1 includes, for example, an arithmetic circuit of a function system and an analog-digital converter circuit. In particular, the arithmetic circuit of a function system preferably has a function of performing an arithmetic operation of a function system using a value corresponding to the amount of an input current as an input value and outputting digital data (voltage) corresponding to the result of the arithmetic operation, for example.

Figures 13A, 13B:
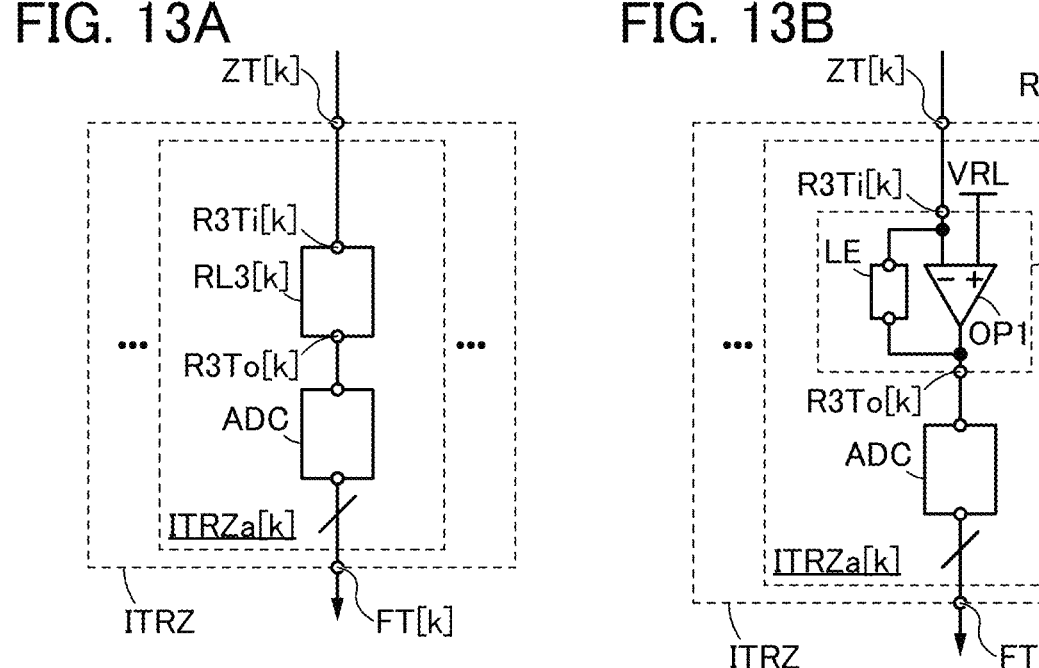
FIG. 13A and FIG. 13B are circuit diagrams each illustrating a structure example of a circuit included in a semiconductor device.

FIG. 13A illustrates a circuit structure example of the circuit ITRZ. The circuit ITRZ illustrated in FIG. 13A is an example of a circuit that can be used as the circuit ITRZ illustrated in FIG. 1.

The circuit ITRZ in FIG. 13A includes a circuit ITRZa[1] to a circuit ITRZa[s]. Note that FIG. 13A selectively illustrates the circuit ITRZa[k], which is any one of the circuit ITRZa[1] to the circuit ITRZa[s]. The circuit ITRZa[k] includes a converter circuit RL3[k] and an analog-digital converter circuit ADC.

The converter circuit RL3[k] includes a terminal R3Ti[k] and a terminal R3To[k].

The terminal ZT[k] is electrically connected to the terminal R3Ti[k] of the converter circuit RL3[k]. The terminal R3To[k] of the converter circuit RL3[k] is electrically connected to an input terminal of the analog-digital converter circuit ADC, and an output terminal of the analog-digital converter circuit ADC is electrically connected to a terminal FT[k].

The terminal FT[k] (the terminal FT[1] to the terminal FT[s] in FIG. 1) functions as a wiring for outputting a result of an arithmetic operation performed in the arithmetic circuit CDV, as digital data, to the outside of the arithmetic circuit CDV.

The converter circuit RL3[k] can be the above-described arithmetic circuit of a function system. The arithmetic circuit of a function system can be, for example, an arithmetic circuit of a sigmoid function, a tanh function, a softmax function, a ReLU function, or a threshold function. The converter circuit RL3[k] may include a circuit performing pooling processing, instead of the arithmetic circuit of a function system. The converter circuit RL3[k] preferably outputs a voltage from the terminal R3To[k].

The converter circuit RL3[k] may be a current-voltage converter circuit.

In the case where the converter circuit RL3[k] is a current-voltage converter circuit, for example, the converter circuit RL3[k] preferably generates an analog voltage corresponding to a current input from the terminal OT[k] of the circuit UNT[1] to the terminal R3Ti[k] of the converter circuit RL3[k] through the terminal ZT[k] and outputs the analog voltage to the terminal R3To[k] of the converter circuit RL3[k].

The analog-digital converter circuit ADC preferably converts an analog voltage supplied from the terminal R3To[k] of the converter circuit RL3[k] into a digital signal and outputs the digital signal to the terminal FT[k].

FIG. 13B illustrates a structure example of the circuit ITRZ in which the converter circuit RL3[k] is a current-voltage converter circuit. The converter circuit RL3[k] illustrated in FIG. 13B includes a load LE and an operational amplifier OP1, for example.

An inverting input terminal of the operational amplifier OP1 is electrically connected to a first terminal of the load LE and the terminal ZT[k]. A non-inverting input terminal of the operational amplifier OP1 is electrically connected to a wiring VRL. An output terminal of the operational amplifier OP1 is electrically connected to a second terminal of the load LE and the terminal FT.

The wiring VRL functions as a wiring supplying a fixed potential. The fixed potential can be a ground potential (GND), a low-level potential, or the like, for example.

In particular, by setting the fixed potential supplied to the wiring VRL to the ground potential (GND), the inverting input terminal of the operational amplifier OP1 is virtually grounded, and the analog voltage output to the terminal FT[k] can be a voltage with reference to the ground potential (GND).

By having the structure in FIG. 13A, the circuit ITRZ can output a value corresponding to the amount of current flowing from the terminal OT[k] of the circuit UNT[1] to the terminal R3Ti[k] of the converter circuit RL3[k] through the terminal ZT[k], as an analog voltage, to the terminal R3To [k]. The analog voltage can be converted into a digital signal by the analog-digital converter circuit ADC, and the digital signal can be output to the terminal FT[k].

<Arithmetic Operation of Arithmetic Cell Array MACA>

Next, an example of an arithmetic operation of the arithmetic cell array MACA is described.

Figure 14:
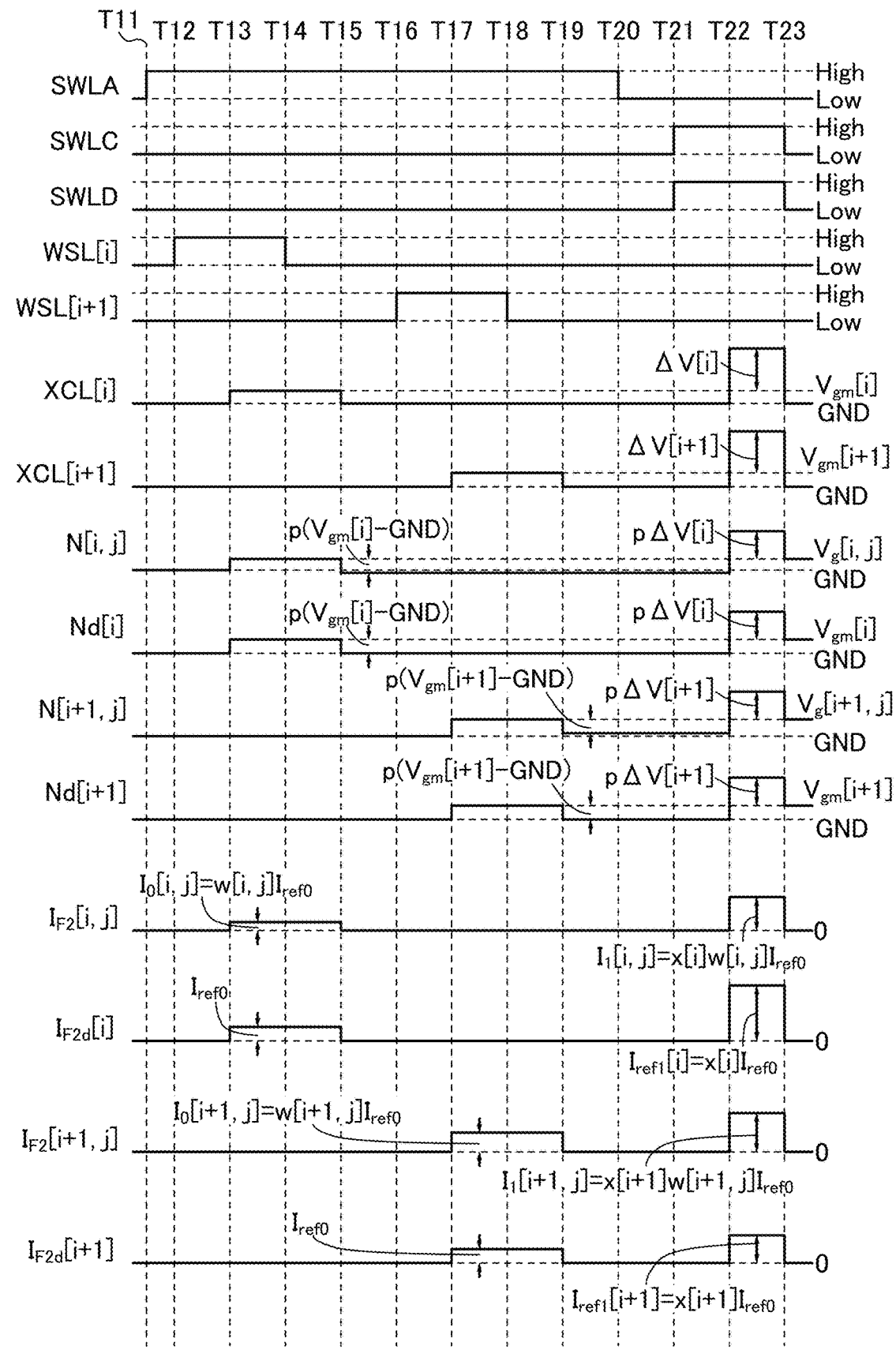
FIG. 14 is a timing chart showing an operation example of a semiconductor device.

FIG. 14 is a timing chart showing an operation example of the arithmetic cell array MACA, the circuit WCS, the circuit XCS, and the switching circuit SWC1. The timing chart in FIG. 14 shows changes in the potentials of the wiring SWLA, the wiring SWLC, the wiring SWLD, the wiring WSL[i] (here, i is an integer greater than or equal to 1 and less than or equal to s−1), the wiring WSL[i+1], the wiring XCL[i], the wiring XCL[i+1], the node N[i, j] (here, j is an integer greater than or equal to 1 and less than or equal to s−1), the node N[i+1, j], the node Nd[i], and the node Nd[i+1] in the period from Time T11 to Time T23 and the vicinity thereof. Note that the wiring SWLC and the wiring SWLD are supplied with the same potential. The timing chart in FIG. 14 also shows changes in an amount $I_{F2}[i, j]$ of a current flowing between the first terminal and the second terminal of the transistor F2 included in the cell IM[i, j]; an amount $I_{F2d}[i]$ of a current flowing between the first terminal and the second terminal of the transistor F2d included in the cell IMD[i]; an amount $I_{F2}[i+1, j]$ of a current flowing between the first terminal and the second terminal of the transistor F2 included in the cell IM[i+1, j]; and an amount $I_{F2d}[i+1]$ of a current flowing between the first terminal and the second terminal of the transistor F2$d$ included in the cell IMD[i+1].

The circuit WCS in FIG. 7A is used as the circuit WCS, and the circuit XCS in FIG. 7C is used as the circuit XCS. As the current generation circuit CM, the current generation circuit CM in FIG. 11 is used.

Note that in this operation example, the potential of the wiring VE0 is the ground potential GND. Before Time T11, as an initial setting, the potential of each of the node N[i, j], the node N[i+1, j], the node Nd[i], and the node Nd[i+1] is the ground potential GND. Specifically, for example, the potential of each of the node N[i, j] and the node N[i+1, j] can be set to the ground potential GND when the initialization potential of the wiring VINIL1 in FIG. 7A is set to the ground potential GND, the switch SWW and the switch SA[k] are turned on, the transistor F1 included in each of the cell IM[i, j] and the cell IM[i+1, j] is turned on, and the switch SC[j] is turned off. For example, the potentials of the node Nd[i] and the node Nd[i+1] can be set to the ground potential GND when the initialization potential of the wiring VINIL2 in FIG. 7C is set to the ground potential GND, the switch SWX and the switch S1$a$[i] are turned on, the transistor F1$d$ included in each of the cell IMD[i] and the cell IMD[i+1] is turned on, and the switch S1$b$[j] is turned off.

In this operation example, the switch S1$a$[1] to the switch S1$a$[s] of the switching circuit SWC1 are always in an on state, and the switch S1$b$[1] to the switch S1$b$[s] are always in an off state. That is, a current from the circuit XCS flows to the wiring XCL[1] to the wiring XCL[s].
[From Time T11 to Time T12]

In the period from Time T11 to Time T12, a high-level potential (shown as High in FIG. 14) is applied to the wiring SWLA, a low-level potential (shown as Low in FIG. 14) is applied to the wiring SWLC, and a low-level potential is applied to the wiring SWLD. Accordingly, in the circuit WCS, a high-level potential is applied to each of the control terminals of the switch SA[1] to the switch SA[s], whereby the switch SA[1] to the switch SA[s] are each turned on. In the current generation circuit CM, a low-level potential is applied to each of the control terminals of the switch SC[1] to the switch SC[s] and the switch SD[1] to the switch SD[s], whereby the switch S1$a$[1] to the switch S1$a$[s] and the switch S1$b$[1] to the switch S1$b$[s] are each turned off.

In the period from Time T11 to Time T12, a low-level potential is applied to each of the wiring WSL[i] and the wiring WSL[i+1]. In the period from Time T14 to Time T15, a low-level potential is applied to the wiring WSL[i]. Accordingly, in the i-th row in the arithmetic cell array MACA, a low-level potential is applied to each of the gates of the transistors F1 included in the cell IM[i, 1] to the cell IM[i, s] and the gate of the transistor F1$d$ included in the cell IMD[i], so that the transistors F1 and the transistor F1$d$ are turned off. In addition, in the i+1-th row in the arithmetic cell array MACA, a low-level potential is applied to each of the gates of the transistors F1 included in the cell IM[i+1, 1] to the cell IM[i+1, s] and the gate of the transistor F1$d$ included in the cell IMD[i+1], so that the transistors F1 and the transistor F1$d$ are turned off.

In the period from Time T11 to Time T12, the ground potential GND is applied to the wiring XCL[i] and the wiring XCL[i+1]. Specifically, for example, when the wiring XCL[k] illustrated in FIG. 7C is the wiring XCL[i] and the wiring XCL[i+1], the potentials of the wiring XCL[i] and the wiring XCL[i+1] can be set to the ground potential GND by setting the initialization potential of the wiring VINIL2 to the ground potential GND and turning on the switch SWX.

In the period from Time T11 to Time T12, the first data is not input to the wiring DW[1] to the wiring DW[M] in the circuit WCSa[1] to the circuit WCSa[s] in FIG. 7A, which are electrically connected to the wiring WCL[1] to the wiring WCL[s] through the respective switches SA. In that case, a low-level potential is input to each of the wiring DW[1] to the wiring DW[M] in the circuit WCSa[1] to the circuit WCSa[s] in FIG. 7A. In the period from Time T11 to Time T12, the second data is not input to the wiring DX[1] to the wiring DX[L] in the circuit XCSa[1] to the circuit WCSa[s] in FIG. 7C, which are electrically connected to the wiring XCL[1] to the wiring XCL[s]. In that case, a low-level potential is input to each of the wiring DX[1] to the wiring DX[Z] in the circuit XCSa[1] to the circuit WCSa[s] in FIG. 7C.

In the period from Time T11 to Time T12, a current does not flow through the wiring WCL[j], the wiring XCL[i], and the wiring XCL[i+1]. Therefore, $I_{F2}[i, j]$, $I_{F2}a[i]$, $I_{F2}[i+1, j]$, and $I_{F2}a[i+1]$ are each 0.
[From Time T12 to Time T13]

In the period from Time T12 to Time T13, a high-level potential is applied to the wiring WSL[i]. Accordingly, in the i-th row in the arithmetic cell array MACA, a high-level potential is applied to each of the gates of the transistors F1 included in the cell IM[i, 1] to the cell IM[i, s] and the gate of the transistor F1$d$ included in the cell IMD[i], so that the transistors F1 and the transistor F1$d$ are turned on. Furthermore, in the period from Time T12 to Time T13, a low-level potential is applied to each of the wiring WSL[1] to the wiring WSL[s] other than the wiring WSL[i], so that in the rows other than the i-th row of the arithmetic cell array MACA, the transistors F1 included in the cell IM[1, 1] to the cell IM[s, s] and the transistors F1$d$ included in the cell IMD[1] to the cell IMD[s] are in an off state.

The ground potential GND has been applied to the wiring XCL[1] to the wiring XCL[s] since before Time T12.
[From Time T13 to Time T14]

In the period from Time T13 to Time T14, a current with a current amount $I_0[i, j]$ flows as the first data from the circuit WCSa[j] to the arithmetic cell array MACA through the switch SA[j]. Specifically, when the wiring WCL[k] illustrated in FIG. 7A is the wiring WCL[j], signals corresponding to the first data are input to the wiring DW[1] to the wiring DW[M], whereby a current $I_0[i, j]$ flows from the circuit WCSa[j] to the second terminal of the switch SA[j]. That is, when the value of the M-bit signal input as the first data is $\alpha[i, j]$ ($\alpha[i, j]$ is an integer greater than or equal to 0 and less than or equal to 2-1), $I_0[i, j]=\alpha[i, j] \times I_{Wut}$.

Since $I_0[i, j]=0$ when $\alpha[i, j]$ is 0, no current flows from the circuit WCSa to the arithmetic cell array MACA through the switch SA[j] in a strict sense, but in this specification and the like, an expression such as "a current such that $I_0[i, j]=0$ flows" is sometimes used.

In the period from Time T13 to Time T14, a conduction state is established between the wiring WCL[j] and the first terminal of the transistor F1 included in the cell IM[i, j] in the i-th row of the arithmetic cell array MACA, and a non-conduction state is established between the wiring WCL [j] and the first terminals of the transistors F1 included in the cell IM[1, j] to the cell IM[s, j] in the rows other than the i-th row of the arithmetic cell array MACA; accordingly, a current with a current amount $I_0[i, j]$ flows from the wiring WCL[j] to the cell IM[i, j].

When the transistor F1 included in the cell IM[i, j] is turned on, a conduction state is established between the gate and the drain of the transistor F2 included in the cell IM[i, j] (diode-connected structure). Thus, when a current flows from the wiring WCL[j] to the cell IM[i, j], the potentials of the gate of the transistor F2 and the second terminal of the transistor F2 become substantially equal to each other. The potentials are determined by the amount of current flowing from the wiring WCL[j] to the cell IM[i, j], the potential of the first terminal of the transistor F2 (here, GND), and the like. In this operation example, a current with the current amount $I_0[i, j]$ flows from the wiring WCL[j] to the cell IM[i, j], whereby the potential of the gate of the transistor F2 (the node N[i, j]) becomes $V_g[i, j]$. That is, the gate-source voltage of the transistor F2 is $V_g[i, j]$–GND, and a current amount $I_0[i, j]$ is set as a current flowing between the first terminal and the second terminal of the transistor F2.

Here, when the threshold voltage of the transistor F2 is Vth[i, j], the current amount $I_0[i, j]$ in the case where the transistor F2 operates in the subthreshold region can be expressed by the following formula.

[Formula 1]

$$I_0[i, j] = I_a \exp\{J(V_g[i, j] - V_{th}[i, j])\} \qquad (1.1)$$

Note that $I_a$ is a drain current for the case where $V_g[i, j]$ is Vth[i, j], and J is a correction coefficient determined with the temperature, the device structure, and the like.

In the period from Time T13 to Time T14, a current with the current amount $I_{ref0}$ flows as the reference data from the circuit XCS to the wiring XCL[i]. Specifically, when the wiring XCL[k] illustrated in FIG. 8C is the wiring XCL[i], a high-level potential is input to the wiring DX[1] and a low-level potential is input to each of the wiring DX[2] to the wiring DX[L], so that a current $I_{ref0}$ flows from the circuit XCSa[i] to the wiring XCL[i]. In other words, $I_{ref0} = I_{Xut}$.

In the period from Time T13 to Time T14, since a conduction state is established between the first terminal of the transistor F1d included in the cell IMD[i] and the wiring XCL[i], a current with a current amount $I_{ref0}$ flows from the wiring XCL[i] to the cell IMD[i].

As in the cell IM[i, j], when the transistor F1d included in the cell IMD[i] is turned on, a conduction state is established between the gate and the drain of the transistor F2d included in the cell IMD[i] (diode-connected structure). Therefore, when a current flows from the wiring XCL[i] to the cell IMD[i], the potentials of the gate of the transistor F2d and the second terminal of the transistor F2d are substantially equal to each other. The potentials are determined by the amount of current flowing from the wiring XCL[i] to the cell IMD[i], the potential of the first terminal of the transistor F2d (here, GND), and the like. In this operation example, a current with a current amount $I_{ref0}$ flows from the wiring XCL[i] to the cell IMD[i], whereby the gate of the transistor F2d (the node Nd[i]) becomes $V_{gm}[i]$; at this time, the potential of the wiring XCL[i] is also $V_{gm}[i]$. That is, the gate-source voltage of the transistor F2d is $V_{gm}[i]$–GND, and a current amount $I_{ref0}$ is set as a current flowing between the first terminal and the second terminal of the transistor F2d.

Here, when the threshold voltage of the transistor F2d is $V_{thm}[i]$, the current amount $I_{ref0}$ in the case where the transistor F2d operates in the subthreshold region can be expressed by the following formula.

[Formula 2]

$$I_{ref0} = I_a \exp\{J(V_{gm}[i] - V_{thm}[i])\} \qquad (1.2)$$

Note that the correction coefficient J is the same as that of the transistor F2 included in the cell IM[i, j]. For example, the same device structure (including the channel length and the channel width) is used for the transistors. Furthermore, although variations in manufacturing cause variations in the correction coefficient J among the transistors, the variations are suppressed to the extent that the argument described later can be made with sufficient precision for practical purposes.

Here, a weight coefficient w[i, j] that is the first data is defined as follows.

[Formula 3]

$$w[i, j] = \exp\{J(V_g[i, j] - V_{th}[i, j] - V_{gm}[i] + V_{thm}[i])\} \qquad (1.3)$$

Thus, Formula (1.1) can be rewritten into the following formula with the use of Formula (1.1) to Formula (1.3), $I_0[i, j] = \alpha[i, j] \times I_{Wut}$, and $I_{ref0} = I_{Xut}$.

[Formula 4]

$$I_0[i, j] = w[i, j]I_{ref0} \leftrightarrow \alpha[i, j]I_{Wut} = w[i, j]I_{Xut} \qquad (1.4)$$

When a constant current $I_{Wut}$ output from the current source CS of the circuit WCSa[j] in FIG. 7A is equal to a constant current $I_{Xut}$ output from the current source CS of the circuit XCSa[i] in FIG. 7C, w[i, j]=$\alpha$[i, j]. That is, when $I_{Wut}$ is equal to $I_{Xut}$, $\alpha$[i, j] corresponds to the value of the first data; thus, $I_{Wut}$ and $I_{Xut}$ are preferably equal to each other. Description of this operation example is made on the assumption that $I_{Wut}$ is equal to $I_{Xut}$.

[From Time T14 to Time T15]

In the period from Time T14 to Time T15, a low-level potential is applied to the wiring WSL[i]. Accordingly, in the i-th row in the arithmetic cell array MACA, a low-level potential is applied to the gates of the transistors F1 included in the cell IM[i, 1] to the cell IM[i, s] and the gate of the transistor F1d included in the cell IMD[i], so that the transistors F1 and the transistor F1d are each turned off.

When the transistor F1 included in the cell IM[i, j] is turned off, $V_g[i, j]$–$V_{gm}[i]$, which is a potential difference between the potential of the gate of the transistor F2 (the node N[i, j]) and the potential of the wiring XCL[i], is retained in the capacitor C5. When the transistor F1 included in the cell IMD[i] is turned off, 0, which is a potential difference between the potential of the gate of the transistor F2d (the node Nd[i]) and the potential of the wiring XCL[i], is retained in the capacitor C5d. In the operation from Time T13 to Time T14, the voltage retained in the capacitor C5d might be a voltage that is not 0 (e.g., Vas here) depending on the transistor characteristics or the like of one or the other of the transistor F1d and the transistor F2d. In that case, the potential of the node Nd[i] is regarded as a potential obtained by adding Vas to the potential of the wiring XCL[i].

[From Time T15 to Time T16]

In the period from Time T15 to Time T16, GND is applied to the wiring XCL[i]. Specifically, for example, when the wiring XCL[k] illustrated in FIG. 7C is the wiring XCL[i], the potential of the wiring XCL[i] can be set to the ground potential GND by setting the initialization potential of the wiring VINIL2 to the ground potential GND and turning on the switch SWX.

Thus, the potentials of the node N[i, 1] to the node N[i, n] change because of capacitive coupling of the capacitors C5 included in each of the cell IM[i, 1] to the cell IM[i, s] in the i-th row in the arithmetic cell array MACA1, and the potential of the node Nd[i] changes because of capacitive coupling of the capacitor C5d included in the cell IMD[i].

The amount of change in the potentials of the node N[i, 1] to the node N[i, s] is a potential obtained by multiplying the amount of change in the potential of the wiring XCL[i] by the capacitive coupling coefficient that is determined by the structures of the cell IM[i, 1] to the cell IM[i, s] included in the arithmetic cell array MACA. The capacitive coupling coefficient is calculated using the capacitance of the capacitor C5, the gate capacitance of the transistor F2, the parasitic capacitance, and the like. When the capacitive coupling coefficient due to the capacitor C5 in each of the cell IM[i, 1] to the cell IM[i, s] is p, the potential of the node N[i, j] in the cell IM[i, j] decreases by p(V_{gm}[i]−GND) from the potential in the period from Time T14 to Time T15.

Similarly, when the potential of the wiring XCL[i] changes, the potential of the node Nd[i] also changes because of capacitive coupling of the capacitor C5d included in the cell IMD[i]. In the case where the capacitive coupling coefficient due to the capacitor C5d is p like that due to the capacitor C5, the potential of the node Nd[i] in the cell IMD[i] decreases by p(V_{gm}[i]−GND) from the potential in the period from Time T14 to Time T15.

In the timing chart in FIG. 14, p=1, for example. Thus, the potential of the node Nd[i] is GND in the period from Time T15 to Time T16.

Accordingly, the potential of the node N[i, j] in the cell IM[i, j] decreases, so that the transistor F2 is turned off; similarly, the potential of the node Nd[i] in the cell IMD[i] decreases, so that the transistor F2d is also turned off. Therefore, I_{F2}[i, j] and I_{F2d}[i] are each 0 in the period from Time T15 to Time T16.

[From Time T16 to Time T17]

In the period from Time T16 to Time T17, a high-level potential is applied to the wiring WSL[i+1]. Accordingly, in the i+1-th row of the arithmetic cell array MACA, a high-level potential is applied to each of the gates of the transistors F1 included in the cell IM[i+1, 1] to the cell IM[i+1, s] and the gate of the transistor F1d included in the cell IMD[i+1], so that the transistors F1 and the transistor F1d are turned on. Furthermore, in the period from Time T16 to Time T17, a low-level potential is applied to each of the wiring WSL[1] to the wiring WSL[s] other than the wiring WSL[i+1], so that in the rows other than the i+1-th row of the arithmetic cell array MACA, the transistors F1 included in the cell IM[1, 1] to the cell IM[s, s] and the transistors F1d included in the cell IMD[1] to the cell IMD[s] are in an off state.

The ground potential GND has been applied to the wiring XCL[1] to the wiring XCL[s] since before Time T16.

[From Time T17 to Time T18]

In the period from Time T17 to Time T18, a current with a current amount I_0[i+1, j] flows as the first data from the circuit WCSa[j] to the arithmetic cell array MACA through the switch SA[j]. Specifically, when the wiring WCL[k]

illustrated in FIG. 7A is the wiring WCL[j+1], signals corresponding to the first data are input to the wiring DW[1] to the wiring DW[M], whereby a current I_0[i+1, j] flows from the circuit WCSa[j] to the second terminal of the switch SA[j]. That is, when the value of the M-bit signal input as the first data is α[i+1, j] (α[i+1, j] is an integer greater than or equal to 0 and less than or equal to $2^M−1$), I_0[i+1, j]=α[i+1, j]×I_{Wut}.

Since I_0[i+1, j]=0 when α[i+1, j] is 0, no current flows from the circuit WCSa[j] to the arithmetic cell array MACA through the switch SA[j] in a strict sense, but in this specification and the like, an expression such as "a current such that I_0[i+1, j]=0 flows" is sometimes used, as in the case of I_0[i, j]=0.

At this time, a conduction state is established between the wiring WCL[j] and the first terminal of the transistor F1 included in the cell IM[i+1, j] in the i+1-th row of the arithmetic cell array MACA, and a non-conduction state is established between the wiring WCL[j] and the first terminals of the transistors F1 included in the cell IM[1, j] to the cell IM[m, j] in the rows other than the i+1-th row of the arithmetic cell array MACA; accordingly, a current with a current amount I_0[i+1, j] flows from the wiring WCL[j] to the cell IM[i+1, j].

When the transistor F1 included in the cell IM[i+1, j] is turned on, a conduction state is established between the gate and the drain of the transistor F2 included in the cell IM[i+1, j] (diode-connected structure). Therefore, when a current flows from the wiring WCL[j] to the cell IM[i+1, j], the potentials of the gate of the transistor F2 and the second terminal of the transistor F2 are substantially equal to each other. The potentials are determined by the amount of current flowing from the wiring WCL[j] to the cell IM[i+1, j], the potential of the first terminal of the transistor F2 (here, GND), and the like. In this operation example, a current with a current amount I_0[i+1, j] flows from the wiring WCL[j] to the cell IM[i+1, j], whereby the potential of the gate of the transistor F2 (the node N[i+1, j]) becomes V_g[i+1, j]. That is, the gate-source voltage of the transistor F2 is V_g[i+1, j]−GND, and a current amount I_0[i+1, j] is set as a current flowing between the first terminal and the second terminal of the transistor F2.

Here, a current amount I_0[i+1, j] of the case where the transistor F2 operates in the subthreshold region can be expressed by the following formula, where Vth[i+1, j] is the threshold voltage of the transistor F2. Note that the correction coefficient is J, which is the same as those for the transistor F2 included in the cell IM[i, j] and the transistor F2d included in the cell IMD[i].

[Formula 5]

$$I_0[i+1, j] = I_a \exp\{J(V_g[i+1, j] − V_{th}[i+1, j])\} \quad (1.5)$$

In the period from Time T17 to Time T18, a current with a current amount I_{ref0} flows as the reference data from the circuit XCSa[i+1] to the wiring XCL[i+1]. Specifically, as in the period from Time T13 to Time T14, when the wiring XCL[k] illustrated in FIG. 7C is the wiring XCL[i+1], a high-level potential is input to the wiring DX[1] and a low-level potential is input to each of the wiring DX[2] to the wiring DX[L], so that a current I_{ref0}=I_{Xut} flows from the circuit XCSa[i+1] to the wiring XCL[i+1].

In the period from Time T17 to Time T18, since a conduction state is established between the first terminal of the transistor F1$d$ included in the cell IMD[i+1] and the wiring XCL[i+1], a current with a current amount $I_{ref0}$ flows from the wiring XCL[i+1] to the cell IMD[i+1].

As in the cell IM[i+1, j], when the transistor F1$d$ included in the cell IMD[i+1] is turned on, a conduction state is established between the gate and the drain of the transistor F2$d$ included in the cell IMD[i+1] (diode connection). Therefore, when a current flows from the wiring XCL[i+1] to the cell IMD[i+1], the potentials of the gate of the transistor F2$d$ and the second terminal of the transistor F2$d$ are substantially equal to each other. The potentials are determined by the amount of current flowing from the wiring XCL[i+1] to the cell IMD[i+1], the potential of the first terminal of the transistor F2$d$ (here, GND), and the like. In this operation example, a current with a current amount $I_{ref0}$ flows from the wiring XCL[i+1] to the cell IMD[i+1], whereby the gate of the transistor F2 (the node Nd[i+1]) becomes $V_{gm}$[i+1]; at this time, the potential of the wiring XCL[i+1] is also $V_{gm}$[i+1]. That is, the gate-source voltage of the transistor F2$d$ is $V_{gm}$[i+1]–GND, and a current amount $I_{ref0}$ is set as a current flowing between the first terminal and the second terminal of the transistor F2$d$.

Here, when the threshold voltage of the transistor F2$d$ is $V_{thm}$[i+1, j], the current amount $I_{ref0}$ in the case where the transistor F2$d$ operates in the subthreshold region can be expressed by the following formula. Note that the correction coefficient J is the same as that of the transistor F2 included in the cell IM[i+1, j].

[Formula 6]

$$I_{ref0} = I_a \exp\{J(V_{gm}[i+1] - V_{thm}[i+1])\} \quad (1.6)$$

Here, a weight coefficient w[i+1, j] that is the first data is defined as follows.

[Formula 7]

$$w[i+1, j] = \exp\{J(V_g[i+1, j] - V_{th}[i+1, j] - V_{gm}[i+1] + V_{thm}[i+1])\} \quad (1.7)$$

Therefore, Formula (1.5) can be rewritten into the following formula with use of Formula (1.3), Formula (1.6), $I_{0r}$[i, j]=$\alpha$[i, j]×$I_{Wut}$, and $I_{ref0}$=$I_{Xut}$.

[Formula 8]

$$I_0[i+1, j] = w[i+1, j]I_{ref0} \leftrightarrow \alpha[i+1, j]I_{Wut} = w[i+1, j]I_{Xut} \quad (1.8)$$

As described above, description of this operation example is made on the assumption that $I_{Wut}$ is equal to $I_{Xut}$.
[From Time T18 to Time T19]

In the period from Time T18 to Time T19, a low-level potential is applied to the wiring WSL[i+1]. Accordingly, in the i+1-th row of the arithmetic cell array MACA, a low-level potential is applied to each of the gates of the transistors F1 included in the cell IM[i+1, 1] to the cell IM[i+1, n] and the gate of the transistor F1$d$ included in the cell IMD[i+1], so that the transistors F1 and the transistor F1$d$ are turned off.

When the transistor F1 included in the cell IM[i+1, j] is turned off, $V_g$[i+1, j]–$V_{gm}$[i+1], which is the potential difference between the potential of the gate of the transistor F2 (the node N[i+1, j]) and the potential of the wiring XCL[i+1], is retained in the capacitor C5. When the transistor F1 included in the cell IMD[i+1] is turned off, 0, which is the potential difference between the potential of the gate of the transistor F2$d$ (the node Nd[i+1]) and the potential of the wiring XCL[i+1], is retained in the capacitor C5$d$. In the operation in the period from Time T18 to Time T19, the voltage retained in the capacitor C5$d$ might be a voltage that is not 0 (e.g., Vas here) depending on the transistor characteristics or the like of one or both of the transistor F1$d$ and the transistor F2$d$. In this case, the node Nd[i+1] can be regarded as having a potential obtained by adding Vas to the potential of the wiring XCL[i+1]. [From Time T19 to Time T20]

In the period from Time T19 to Time T20, the ground potential GND is applied to the wiring XCL[i+1]. Specifically, for example, when the wiring XCL[k] illustrated in FIG. 7C is the wiring XCL[i+1], the potential of the wiring XCL[i+1] can be set to the ground potential GND by setting the initialization potential of the wiring VINIL2 to the ground potential GND and turning on the switch SWX.

Thus, the potentials of the node N[i, 1] to the node N[i+1, s] change because of capacitive coupling of the capacitors C5 included in the cell IM[i+1, 1] to the cell IM[i+1, n] in the i+1-th row in the arithmetic cell array MACA, and the potential of the node NDa[i+1] changes because of capacitive coupling of the capacitor C5$d$ included in the cell IMD[i+1].

The amount of change in the potentials of the node N[i+1, 1] to the node N[i+1, n] is a potential obtained by multiplying the amount of change in the potential of the wiring XCL[i+1] by the capacitive coupling coefficient that is determined by the structures of the cell IM[i+1, 1] to the cell IM[i+1, s] included in the arithmetic cell array MACA. The capacitive coupling coefficient is calculated using the capacitance of the capacitor C5, the gate capacitance of the transistor F2, the parasitic capacitance, and the like. When the capacitive coupling coefficient due to the capacitor C5 in each of the cell IM[i+1, 1] to the cell IM[i+1, s] is p, which is the same as the capacitive coupling coefficient due to the capacitor C5 in each of the cell IM[i, 1] to the cell IM[i, s], the potential of the node N[i+1, j] in the cell IM[i+1, j] decreases by p($V_{gm}$[i+1]–GND) from the potential in the period from Time T18 to Time T19.

Similarly, when the potential of the wiring XCL[i+1] changes, the potential of the node Nd[i+1] also changes because of capacitive coupling of the capacitor C5$d$ included in the cell IMD[i+1]. In the case where the capacitive coupling coefficient due to the capacitor C5$d$ is p like that due to the capacitor C5, the potential of the node Nd[i+1] in the cell IMD1 [i+1] decreases by p($V_{gm}$[i+1]–GND) from the potential in the period from Time T18 to Time T19.

In the timing chart in FIG. 14, p=1, for example. Thus, the potential of the node Nd[i+1] is GND in the period from Time T20 to Time T21.

Accordingly, the potential of the node N[i+1, j] in the cell IM[i+1, j] decreases, so that the transistor F2 is turned off; similarly, the potential of the node Nd[i+1] in the cell IMD[i+1] decreases, so that the transistor F2$d$ is also turned off. Therefore, $I_{F2}$[i+1, j] and $I_{F2d}$[i+1] are each 0 in the period from Time T19 to Time T20.
[From Time T20 to Time T21]

In the period from Time T20 to Time T21, a low-level potential is applied to the wiring SWLA. Accordingly, a low-level potential is applied to each of the control terminals of the switch SA[1] to the switch SA[s], whereby the switch SA[1] to the switch SA[s] are turned off.

[From Time T21 to Time T22]

In the period from Time T21 to Time T22, a high-level potential is applied to the wiring SWLC and the wiring SWLD. Accordingly, a high-level potential is applied to the control terminals of the switch SC[1] to the switch SC[s] and the switch SD[1] to the switch SD[s] of the current generation circuit CM, whereby the switch SC[1] to the switch SC[s] and the switch SD[1] to the switch SD[s] are each turned on.

[From Time T22 to Time T23]

In the period from Time T22 to Time T23, a current $x[i]I_{ref0}$, which is x[i] times the current amount $I_{ref0}$, flows as the second data from the circuit XCS to the wiring XCL[i]. Specifically, for example, when the wiring XCL[k] illustrated in FIG. 7C is the wiring XCL[i], a high-level potential or a low-level potential is input to each of the wiring DX[1] to the wiring DX[Z] in accordance with the value of x[i], so that $x[i]I_{ref0}=\alpha[i]I_{Xut}$ flows as a current amount from the circuit XCSa[i] to the wiring XCL[i]. In this operation example, x[i] corresponds to the value of the second data. At this time, the potential of the wiring XCL1[i] changes from 0 to $V_{gm}[i]+\Delta V[i]$.

When the potential of the wiring XCL[i] changes, the potentials of the node N[i, 1] to the node N[i, s] also change because of the capacitive coupling of the capacitors C5 included in the cell IM[i, 1] to the cell IM[i, s] in the i-th row of the arithmetic cell array MACA. Thus, the potential of the node N[i, j] in the cell IM[i, j] becomes $V_g[i, j]+p\Delta V[i]$.

Similarly, when the potential of the wiring XCL[i] changes, the potential of the node Nd[i] also changes because of capacitive coupling of the capacitor C5d included in the cell IMD[i]. Thus, the potential of the node Nd[i] in the cell IMD[i] becomes $V_{gm}[i]+p\Delta V[i]$.

Accordingly, the current amount $I_1[i, j]$ of a current flowing between the first terminal and the second terminal of the transistor F2 and the current amount $I_{ref1}[i, j]$ of a current flowing between the first terminal and the second terminal of the transistor F2d in the period from Time T22 to Time T23 can be expressed as follows.

[Formula 9]

$$I_1[i, j] = I_a\exp\{J(V_g[i, j] + p\Delta V[i] - V_{th}[i, j])\} \qquad (1.9)$$
$$= I_0[i, j]\exp(Jp\Delta V[i])$$

[Formula 10]

$$I_{ref1}[i] = I_a\exp\{J(V_{gm}[i] + p\Delta V[i] - V_{thm}[i])\} \qquad (1.10)$$
$$= x[i]I_{ref0}$$

According to Formula (1.9) and Formula (1.10), x[i] can be expressed by the following formula.

[Formula 11]

$$x[i] = \exp(Jp\Delta V[i]) \qquad (1.11)$$

Therefore, Formula (1.9) can be rewritten into the following formula.

[Formula 12]

$$I_1[i, j] = x[i]w[i, j]I_{ref0} \qquad (1.12)$$

That is, the amount of current flowing between the first terminal and the second terminal of the transistor F2 included in the cell IM[i, j] is proportional to the product of the first data w[i, j] and the second data x[i].

In the period from Time T22 to Time T23, a current $x[i+1]I_{ref0}$, which is x[i+1] times the current amount $I_{ref0}$, flows as the second data from the circuit XCS to the wiring XCL[i+1]. Specifically, for example, when the wiring XCL [k] illustrated in FIG. 7C is the wiring XCL[i+1], a high-level potential or a low-level potential is input to each of the wiring DX[1] to the wiring DX[Z] in accordance with the value of x[i+1], so that $x[i+1]I_{ref0}=\alpha[i+1]I_{Xut}$ flows as a current amount from the circuit XCSa[i+1] to the wiring XCL[i+1]. In this operation example, x[i+1] corresponds to the value of the second data. At this time, the potential of the wiring XCL1[i+1] changes from 0 to $V_{gm}[i+1]+\Delta V[i+1]$.

When the potential of the wiring XCL[i+1] changes, the potentials of the node N[i+1, 1] to the node N[i+1, s] also change because of the capacitive coupling of the capacitors C5 included in the cell IM[i+1, 1] to the cell IM[i+1, s] in the i+1-th row of the arithmetic cell array MACA. Thus, the potential of the node N[i+1, j] in the cell IM[i+1, j] becomes $V_g[i+1, j]+p\Delta V[i+1]$.

Similarly, when the potential of the wiring XCL[i+1] changes, the potential of the node Nd[i+1] also changes because of capacitive coupling of the capacitor C5d included in the cell IMD[i+1]. Thus, the potential of the node Nd[i+1] in the cell IMD[i+1] becomes $V_{gm}[i+1]+p\Delta V[i+1]$.

Accordingly, a current amount $I_1[i+1, j]$ that flows between the first terminal and the second terminal of the transistor F2 and a current amount $I_{ref1}[i+1, j]$ that flows between the first terminal and the second terminal of the transistor F2d in the period from Time T22 to Time T23 can be expressed as follows.

[Formula 13]

$$I_1[i + 1, j] = I_a\exp\{J(V_g[i + 1, j] + p\Delta V[i + 1] - V_{th}[i + 1, j])\} \qquad (1.13)$$
$$= I_0[i + 1, j]\exp(Jp\Delta V[i + 1])$$

[Formula 14]

$$I_{ref1}[i + 1] = I_a\exp\{J(V_{gm}[i + 1] + p\Delta V[i + 1] - V_{thm}[i + 1])\} \qquad (1.14)$$
$$= x[i + 1]I_{ref0}$$

According to Formula (1.13) and Formula (1.14), x[i+1] can be expressed by the following formula.

[Formula 15]

$$x[i + 1] = \exp(Jp\Delta V[i + 1]) \qquad (1.15)$$

Therefore, Formula (1.13) can be rewritten into the following formula.

[Formula 16]

$$I_1[i + 1, j] = x[i + 1]w[i + 1, j]I_{ref0} \qquad (1.16)$$

That is, the amount of current flowing between the first terminal and the second terminal of the transistor F2 included in the cell IM[i+1, j] is proportional to the product of the first data w[i+1, j] and the second data x[i+1].

On another note, since the switch SC[1] to the switch SC[s] are in an on state and the switch SD[1] to the switch SD[s] are in an on state in the current generation circuit CM in the period from Time T22 to Time T23, a current $I_1[i, j]$ (Formula (1.12)) flowing from the wiring WCL[j] to the cell IM[i, j] and a current $I_1[i+1, j]$ (Formula (1.16)) flowing from the wiring WCL[j] to the cell IM[i+1, j] are supplied from the terminal CTi[j] (not illustrated) of the current generation circuit CM in FIG. 1. At this time, when the sum of the amounts of currents flowing from the terminal CTi[j] of the current generation circuit CM to the cell IM[i, j] and the cell IM[i+1, j] is $I_{SUM}[j]$, $I_{SUM}[j]$ can be expressed by the following formula according to Formula (1.12) and Formula (1.16).

[Formula 17]

$$I_{SUM}[j] = I_1[i, j] + I_1[i+1, j] \qquad (1.17)$$

$$= I_{ref0}(x[i]w[i, j] + x[i, j]w[i+1, j])$$

Thus, the current amount output from the terminal CTi[j] of the current generation circuit CM is proportional to the sum of products of w[i, j] and w[i+1, j], which are the first data, and x[i] and x[i+1], which are the second data.

Although in the above-described operation example, the sum of the amounts of currents flowing in the cell IM[i, j] and the cell IM[i+1, j] is described, the sum of the amounts of currents flowing in a plurality of cells, i.e., the cell IM[1, j] to the cell IM[s, j], may also be described. In that case, Formula (1.17) can be rewritten into the following formula.

[Formula 18]

$$I_{SUM}[j] = I_{ref0} \sum_{i=1}^{s} x[i]w[i, j] \qquad (1.18)$$

Thus, even in the case of an arithmetic circuit MAC1 including the arithmetic cell array MACA having three or more rows and a plurality of columns, a product-sum operation can be performed in the above-described manner. In the arithmetic cell array MACA of this case, cells (the above-described cells IMD) in one of a plurality of columns retain $I_{ref0}$ and $xI_{ref0}$ as current amounts, whereby product-sum processing, the number of which corresponds to the number of the rest of the columns among the plurality of columns, can be executed concurrently. That is, when the number of columns in a memory cell array is increased, a semiconductor device that achieves high-speed product-sum processing can be provided.

<Operation Method Example 1 of Arithmetic Circuit CDV>

Next, an operation example of the arithmetic circuit CDV in FIG. 1 is described.

FIG. 15A to FIG. 17 are block diagrams illustrating an example of an operation method of the arithmetic circuit CDV in FIG. 1 by showing the flow of data input to the arithmetic circuit CDV, data output from the arithmetic circuit CDV, and data in the arithmetic circuit CDV. Note that in FIG. 15A to FIG. 17, the arrows with hatching represent digital data, and the white arrows represent analog data.

Figure 15A:
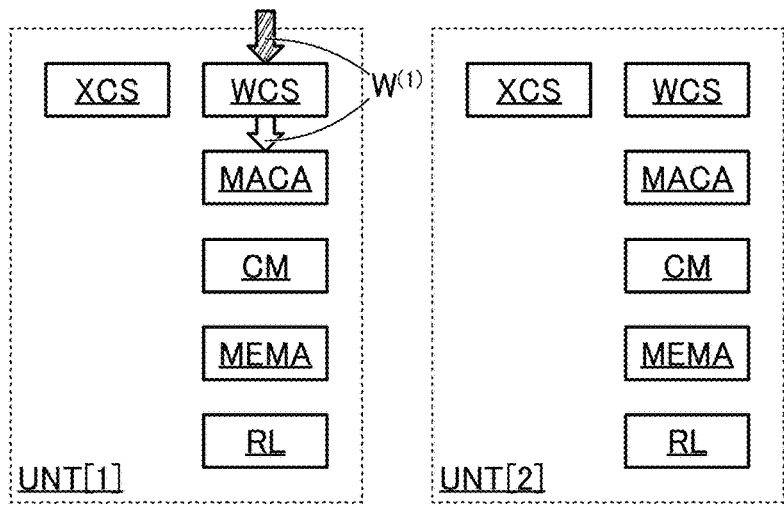
FIG. 15A to FIG. 15C are block diagrams illustrating an operation example of a semiconductor device.

FIG. 15A illustrates the following operation: $W^{(1)}$ as the first data, which is digital data, is input to the circuit WCS of the circuit UNT[1] from the outside of the arithmetic circuit CDV, $W^{(1)}$ as the first data is converted into analog data (current) by the circuit WCS, and $W^{(1)}$ as the first data that is converted into the analog data (current) is written to the arithmetic cell array MACA of the circuit UNT[1]. Since the first data is written to each of the cell IM[1, 1] to the cell IM[s, s] of the arithmetic cell array MACA, $W^{(1)}$ as the first data can be used as a matrix of s rows and s columns (which will be described later in detail). $W^{(1)}$ as the first data is one of a multiplier and a multiplicand that are used in the first product-sum operation.

Figure 15B:
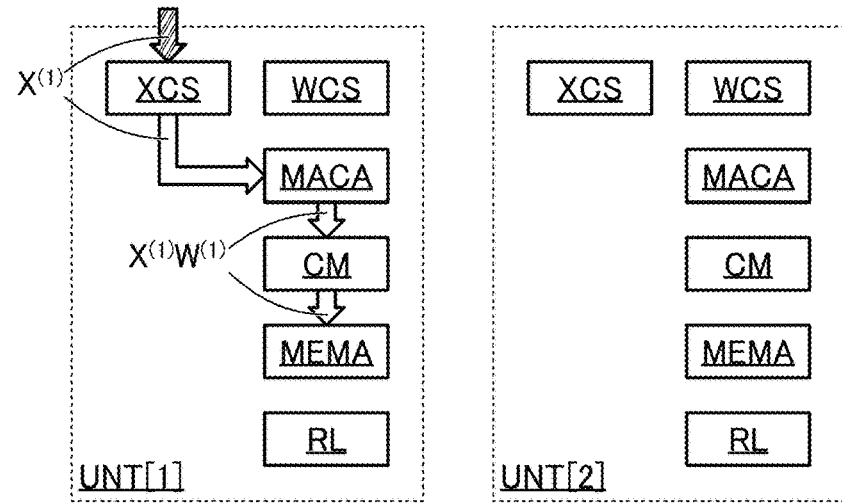

FIG. 15B illustrates the following operation: $X^{(1)}$ as the second data, which is digital data, is input to the circuit XCS of the circuit UNT[1] from the outside of the arithmetic circuit CDV, $X^{(1)}$ as the second data is converted into analog data (current) by the circuit XCS, and $X^{(1)}$ as the second data that is converted into the analog data (current) is input to the arithmetic cell array MACA of the circuit UNT[1]. Here, $X^{(1)}$ as the second data is a matrix (a matrix of s rows and s columns) including s sets of the second data, where one set includes s pieces of the second data (which will be described later in detail). Thus, the first set to the s-th set of the second data, where one set includes s pieces of the second data, are sequentially input from the circuit XCS to the arithmetic cell array MACA through the wiring XCL[1] to the wiring XCL[s]. $X^{(1)}$ as the second data is the other of a multiplier and a multiplicand that are used in the second product-sum operation.

FIG. 15B also illustrates the following operation: the arithmetic cell array MACA of the circuit UNT[1] outputs $X^{(1)}W^{(1)}$, which is the result of the initial product-sum operation of $W^{(1)}$ as the first data written to the arithmetic cell array MACA of the circuit UNT[1] at the stage of FIG. 15A and $X^{(1)}$ as the input second data, and $X^{(1)}W^{(1)}$ is written to the memory cell array MEMA of the circuit UNT[1]. Note that $X^{(1)}W^{(1)}$ is a matrix of s rows and s columns.

Figure 15C:
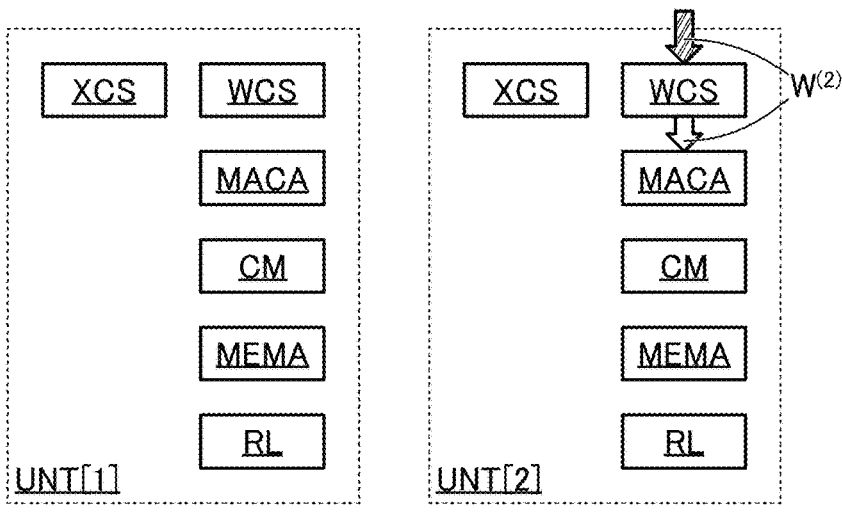

FIG. 15C illustrates the following operation: $W^{(2)}$ as the first data, which is digital data, is input to the circuit WCS of the circuit UNT[2] from the outside of the arithmetic circuit CDV, $W^{(2)}$ as the first data is converted into analog data (current) by the circuit WCS, and $W^{(2)}$ as the first data that is converted into the analog data (current) is written to the arithmetic cell array MACA of the circuit UNT[2]. Note that $W^{(2)}$ as the first data is a matrix of s rows and s columns like $W^{(1)}$.

Figure 16A:
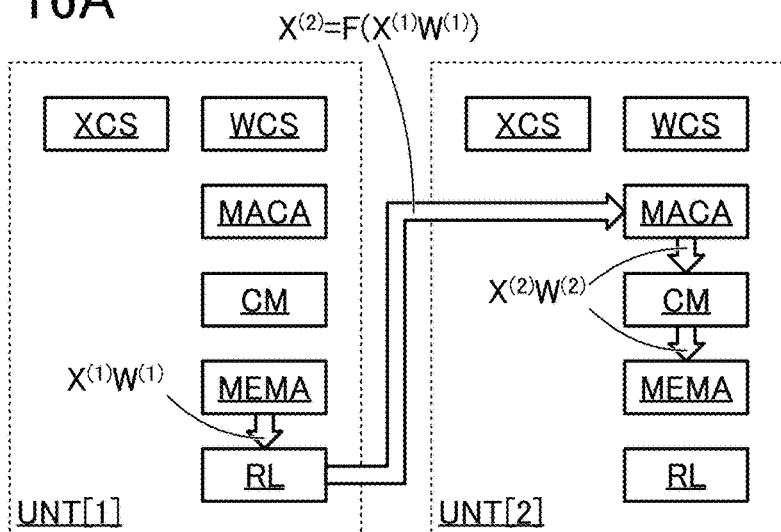
FIG. 16A to FIG. 16C are block diagrams illustrating an operation example of a semiconductor device.

FIG. 16A illustrates the following operation: the memory cell array MEMA of the circuit UNT[1] outputs $X^{(1)}W^{(1)}$ written at the stage of FIG. 15B, and the current generation circuit RL of the circuit UNT[1] obtains $X^{(1)}W^{(1)}$ and outputs $F(X^{(1)}W^{(1)})$. Note that F(x) is a function for an arithmetic operation performed in the current generation circuit RL, and specifically, $F(X^{(1)}W^{(1)})=X^{(2)}$ is defined. $X^{(2)}$ is used as the second data for performing the second product-sum operation. Furthermore, $X^{(2)}$ is transmitted to the arithmetic cell array MACA of the circuit UNT[2].

FIG. 16A also illustrates the following operation: $X^{(2)}W^{(2)}$, which is the result of the second product-sum operation of $W^{(2)}$ as the first data written to the arithmetic cell array MACA of the circuit UNT[2] at the stage of FIG. 15C and $X^{(2)}$ input to the arithmetic cell array MACA of the circuit UNT[2], is output, and $X^{(2)}W^{(2)}$ is written to the memory cell array MEMA of the circuit UNT[2]. Note that $X^{(2)}W^{(2)}$ is a matrix of s rows and s columns like $X^{(1)}W^{(1)}$.

Figure 16B:
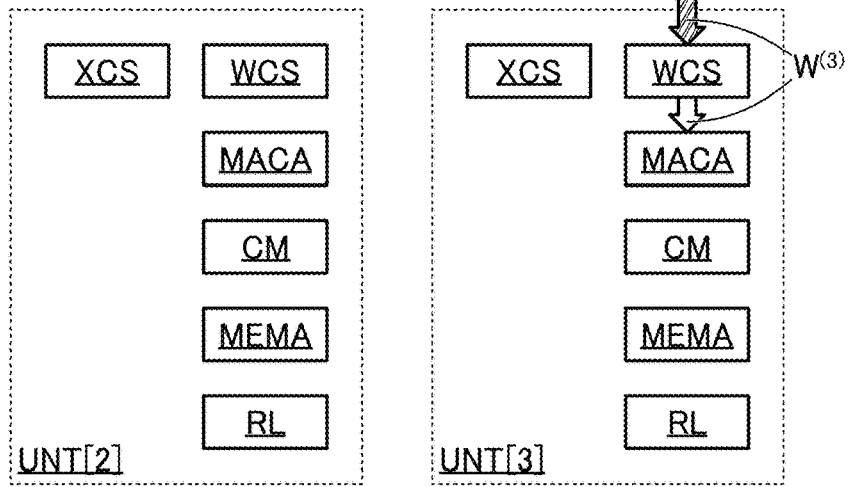

FIG. 16B illustrates the following operation: $W^{(3)}$ as the first data, which is digital data, is input to the circuit WCS of the circuit UNT[3] from the outside of the arithmetic circuit CDV, $W^{(3)}$ as the first data is converted into analog data (current) by the circuit WCS, and $W^{(3)}$ as the first data that is converted into the analog data (current) is written to the arithmetic cell array MACA of the circuit UNT[3]. Note that $W^{(3)}$ as the first data is a matrix of s rows and s columns like $W^{(1)}$ and $W^{(2)}$.

Figure 16C:
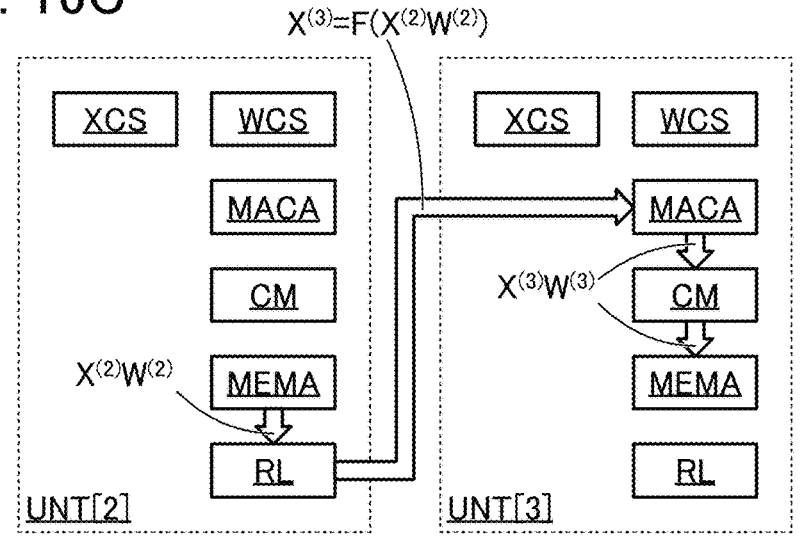

FIG. 16C illustrates the following operation: the memory cell array MEMA of the circuit UNT[2] outputs $X^{(2)}W^{(2)}$ written at the stage of FIG. 16A, and the current generation circuit RL of the circuit UNT[2] obtains $X^{(2)}W^{(2)}$ and outputs $F(X^{(2)}W^{(2)})$. Note that the current generation circuit RL of the circuit UNT[2] also performs an arithmetic operation of a function $F(x)$ like the current generation circuit RL of the circuit UNT[1]. In addition, $F(X^{(2)}W^{(2)}=X^{(3)}$ is defined, and $X^{(3)}$ is used as the second data for performing the third product-sum operation. Furthermore, $X^{(3)}$ is transmitted to the arithmetic cell array MACA of the circuit UNT[3].

FIG. 16C also illustrates the following operation: $X^{(3)}W^{(3)}$, which is the result of the third product-sum operation of $W^{(3)}$ as the first data written to the arithmetic cell array MACA of the circuit UNT[3] at the stage of FIG. 16B and $X^{(3)}$ input to the arithmetic cell array MACA, is output, and $X^{(3)}W^{(3)}$ is written to the memory cell array MEMA of the circuit UNT[3]. Note that $X^{(3)}W^{(3)}$ is also a matrix of s rows and s columns like $X^{(1)}W^{(1)}$ and $X^{(2)}W^{(2)}$.

After that, the following operation is performed as in the circuit UNT[1] to the circuit UNT[3]: $W^{(4)}$ as the first data, which is digital data, is input to the circuit WCS of the circuit UNT[4], $W^{(4)}$ as the first data is converted into analog data (current) by the circuit WCS, and $W^{(4)}$ as the first data that is converted into the analog data (current) is written to the arithmetic cell array MACA of the circuit UNT[4] (not illustrated). Note that $W^{(4)}$ as the first data is a matrix of s rows and s columns like $W^{(1)}$, $W^{(2)}$, and $W^{(3)}$.

Next, the following operation is performed: the memory cell array MEMA of the circuit UNT[3] outputs $X^{(3)}W^{(3)}$ written at the stage in FIG. 16C, and the current generation circuit RL of the circuit UNT[3] obtains $X^{(3)}W^{(3)}$ and outputs $F(X^{(3)}W^{(3)})$ (not illustrated). Note that the current generation circuit RL of the circuit UNT[3] also performs an arithmetic operation of the function $F(x)$ like the current generation circuit RL of the circuit UNT[1] and the current generation circuit RL of the circuit UNT[2]. In addition, $F(X^{(3)}W^{(3)}=X^{(4)}$ is defined, and $X^{(4)}$ is used as the second data for performing the fourth product-sum operation. Furthermore, $X^{(4)}$ is transmitted to the arithmetic cell array MACA of the circuit UNT[4].

Furthermore, the following operation is performed: $X^{(4)}W^{(4)}$, which is the result of the fourth product-sum operation of the first data $W^{(4)}$ written to the arithmetic cell array MACA of the circuit UNT[4] and $X^{(4)}$ input to the arithmetic cell array MACA, is output, and $X^{(4)}W^{(4)}$ is written to the memory cell array MEMA of the circuit UNT[4] (not illustrated). Note that $X^{(4)}W^{(4)}$ is also a matrix of s rows and s columns like $X^{(1)}W^{(1)}$, $X^{(2)}W^{(2)}$, and $X^{(3)}W^{(3)}$.

After that, the following operation is performed: $W^{(5)}$ as the first data, which is digital data, is input to the circuit WCS of the circuit UNT[1], $W^{(5)}$ as the first data is converted into analog data (current) by the circuit WCS, and $W^{(5)}$ as the first data that is converted into the analog data (current) is written to the arithmetic cell array MACA of the circuit UNT[1] (not illustrated). Furthermore, the memory cell array MEMA of the circuit UNT[4] outputs $X^{(4)}W^{(4)}$ written, the current generation circuit RL of the circuit UNT[4] obtains $X^{(4)}W^{(4)}$, and outputs $F(X^{(4)}W^{(4)}=X^{(5)}$ (not illustrated). Furthermore, $X^{(5)}$ is transmitted to the arithmetic cell array MACA of the circuit UNT[1]. Furthermore, $X^{(5)}$ w (5), which is the result of the fifth product-sum operation of $W^{(5)}$ as the first data written to the arithmetic cell array MACA of the circuit UNT[1] and $X^{(5)}$ input to the arithmetic cell array MACA, is output, and $X^{(5)}$ $W^{(5)}$ is written to the memory cell array MEMA of the circuit UNT[1] (not illustrated).

As described above, the operations of the circuit UNT[1] to the circuit UNT[4] are sequentially performed, whereby a product-sum operation and an arithmetic operation of a function system can be successively performed a plurality of times. When the output result of the circuit UNT[4] is transmitted to the circuit UNT[1], a product-sum operation and an arithmetic operation of a function system can be performed five or more times.

Figure 17:
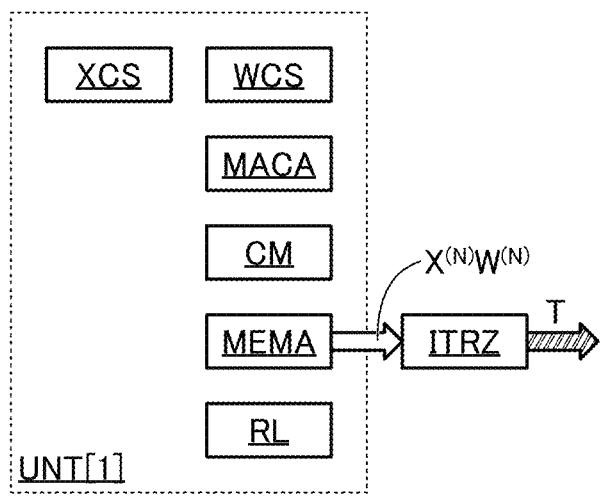
FIG. 17 is a block diagram illustrating an operation example of a semiconductor device.

FIG. 17 show operations of the case where the last product-sum operation is performed.

At the stage of FIG. 17, $X^{(N)}W^{(N)}$ (here, N is a positive integer), which is the result of performing the last product-sum operation in the arithmetic cell array MACA, is retained in the memory cell array MEMA. In FIG. 17, the memory cell array MEMA outputs $X^{(N)}W^{(N)}$ and the circuit ITRZ obtains $X^{(N)}W^{(N)}$ and outputs T, which is data output from the arithmetic circuit CDV. Note that the circuit ITRZ also performs an arithmetic operation of a function $F(x)$ like the current generation circuit RL. Thus, $T=F(X^{(N)}W^{(N)})$ can be described.

Note that in the case where the first product-sum operation and arithmetic operation of a function system are performed in the circuit UNT[1] and the result of the product-sum operation is transmitted from the memory cell array MEMA of the circuit UNT[1] to the circuit ITRZ, N in $T=F(X^{(N)}W^{(N)})$ is 1+4×p (p is an integer greater than or equal to 0). That is, the product-sum operation and the arithmetic operation of a function system are performed 1+4p times in this case. In the case where the first product-sum operation and arithmetic operation of a function system are performed in the circuit UNT[2] and the result of the product-sum operation is transmitted from the memory cell array MEMA of the circuit UNT[1] to the circuit ITRZ, N in $T=F(X^{(N)}W^{(N)})$ is 4×(1+p) (p is an integer greater than or equal to 0). In other words, a product-sum operation and an arithmetic operation of a function system are performed 4×(1+p) times in this case. In the case where the first product-sum operation and arithmetic operation of a function system are performed in the circuit UNT[3] and the result of the product-sum operation is transmitted from the memory cell array MEMA of the circuit UNT[1] to the circuit ITRZ, N in $T=F(X^{(N)}W^{(N)})$ is 3+4×p (p is an integer greater than or equal to 0). That is, the product-sum operation and the arithmetic operation of a function system are performed 3+4×p times in this case. In the case where the first product-sum operation and arithmetic operation of a function system are performed in the circuit UNT[4] and the result of the product-sum operation is transmitted from the memory cell array MEMA of the circuit UNT[1] to the circuit ITRZ, N in $T=F(X^{(N)}W^{(N)}$ is 2+4×p (p is an integer greater than or equal to 0). That is, the product-sum operation and the arithmetic operation of a function system are performed 2+4×p times in this case.

For example, in the case where a product-sum operation and an arithmetic operation of a function system are performed five times, the first product-sum operation and arithmetic operation of a function system are performed in the circuit UNT[1], and then the second to fourth product-sum operations and arithmetic operations of a function system are performed in the circuit UNT[2], the circuit UNT[3], and the circuit UNT[4] in this order, and then the fifth product-sum operation and arithmetic operation of a function system are performed in the circuit UNT[1] and the circuit ITRZ. For example, in the case where a product-sum operation and an arithmetic operation of a function system are performed eight times, the first product-sum operation and arithmetic operation of a function system are performed in the circuit UNT[2], and then the second to seventh product-sum operations and arithmetic operations of a function system are performed in the circuit UNT[3], the circuit UNT[4], the circuit UNT[1], the circuit UNT[2], the circuit UNT[3], and the circuit UNT[4] in this order, and then the eighth product-sum operation and arithmetic operation of a function system are performed in the circuit UNT[1] and the circuit ITRZ.

As described above, the number of product-sum operations and arithmetic operations of a function system in the arithmetic circuit CDV depend on which of the circuit UNT[1] to the circuit UNT[4] performs the first product-sum operation and arithmetic operation of a function system.

The operation method of the arithmetic circuit CDV is described above with reference to FIG. 15A to FIG. 17. Hereinafter, detailed operations of the circuits included in the arithmetic circuit CDV in FIG. 15A to FIG. 17 are described below.

<Operation Method Example 2 of Arithmetic Circuit CDV>

Figure 18:
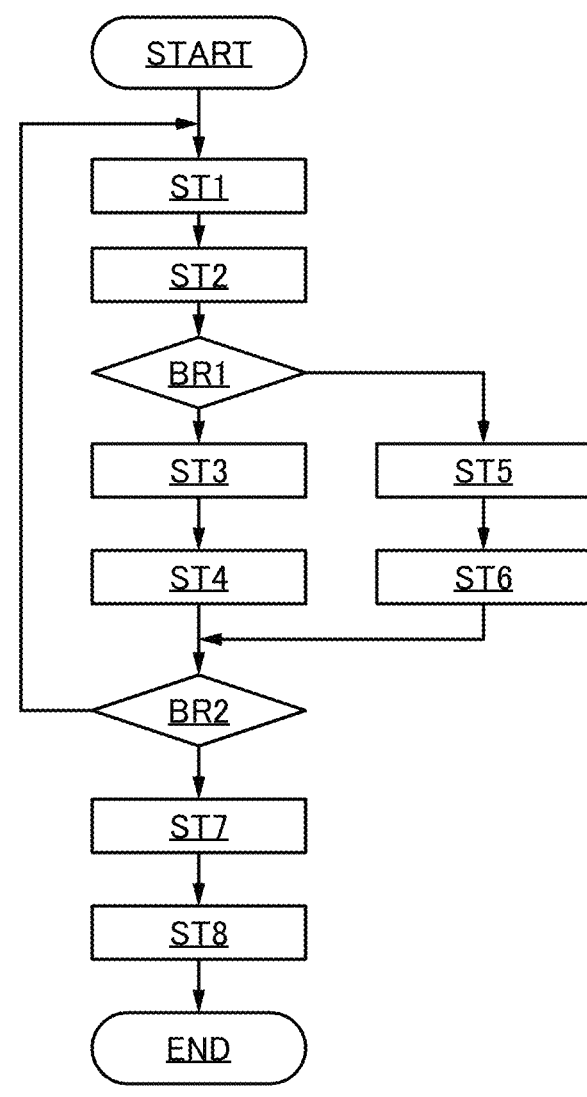
FIG. 18 is a flow chart showing an operation example of a semiconductor device.

FIG. 18 is a flowchart showing an example of an operation method of the arithmetic circuit CDV in FIG. 1. As shown in FIG. 18, the operation method of the arithmetic circuit CDV in FIG. 1 includes Step ST1 to Step ST8, Step BR1, and Step BR2.

Note that the following description is made on the assumption that the product-sum operation and the arithmetic operation of a function system are performed by any one of circuits UNT[q] included in the arithmetic circuit CDV (q is an integer greater than or equal to 1 and less than or equal to 4). The circuit UNT[1] has a structure in the block diagram illustrated in FIG. 2, and the circuit UNT[2] to the circuit UNT[4] have a structure in the block diagram illustrated in FIG. 3.

[Step ST1]

To perform the N-th product-sum operation (N is an integer greater than or equal to 1), Step ST1 includes a prior operation for writing a plurality of pieces of the first data to the arithmetic cell array MACA of the circuit UNT[q]. Note that in the case where Step ST1 is performed for the first time, N is 1. In the case where Step ST1 is performed for the second time, N is 2.

For example, in the current generation circuit CM of the circuit UNT[q], Step ST1 includes an operation in which the circuit SWCC establishes a non-conduction state between the wiring WCL[k] and the circuit CG[k] and the circuit SWCD establishes a non-conduction state between the circuit CG[k] and the wiring BL[k].

Specifically, in the circuit SWCC included in the current generation circuit CM in any one of FIG. 10A to FIG. 11, a low-level potential is supplied from the wiring SWLC to the control terminal of the switch SC[k] to turn off the switch SC[k], and in the circuit SWCD included in the current generation circuit CM in any one of FIG. 10A to FIG. 11, a low-level potential is supplied from the wiring SWLD to the control terminal of the switch SD[k] to turn off the switch SD[k]. Note that this operation corresponds to the operation of the switching circuit SWC1 from Time T11 to Time T12 in the timing chart in FIG. 14.

Step ST1 includes, for example, an operation in which the switching circuit SWC1 of the circuit UNT[q] establishes a non-conduction state between the terminal T1a[k] and the terminal T1b[k] and a non-conduction state between the terminal T1a[k] and the terminal T1c[k].

Specifically, in the switching circuit SWC1 in FIG. 9A, the switch S1a[k] is turned on by supplying a high-level potential from the wiring SWL1a to the control terminal of the switch S1a[k], and the switch S1b[k] is turned off by supplying a low-level potential from the wiring SWL1b to the control terminal of the switch S1b[k].

Step ST1 includes, for example, an operation of establishing a conduction state between the circuit WCSa[k] and the wiring WCL[k] in the circuit WCS of the circuit UNT[g].

Specifically, in the circuit SWCA in FIG. 4, the switch SA[k] is turned on by supplying a high-level potential from the wiring SWLA to the control terminal of the switch SA[k].

In the above manner, preparation for writing a plurality of pieces of the first data to the arithmetic cell array MACA of the circuit UNT[q] is completed.

[Step ST2]

To perform the N-th product-sum operation (N is 1 in the case where Step ST2 is performed for the first time), Step ST2 includes an operation of writing a plurality of pieces of the first data to the arithmetic cell array MACA of the circuit UNT[q].

For example, the first data is written to each of the cell IM[1, 1] to the cell IM[s, s] of the arithmetic cell array MACA of the circuit UNT[q] with reference to the above description of the period from Time T11 to Time T20 in the timing chart of FIG. 14. Note that the first data written to the cell IM[i, j] of the arithmetic cell array MACA of the circuit UNT[q] is referred to as $W^{(N)}[i, j]$. Note that N in $W^{(N)}[i, j]$ represents what number product-sum operation the product-sum operation is, and for example, $W^{(1)}[i, j]$ means the first data used when the first product-sum operation is performed.

At this time, the first data written to the arithmetic cell array MACA of the circuit UNT[q] is referred to as $W^{(N)}$ as a matrix. $W^{(N)}$ can be expressed as follows.

[Formula 19]

$$W^{(N)} = \begin{pmatrix} W^{(N)}[1, 1] & \cdots & W^{(N)}[1, s] \\ \vdots & \ddots & \vdots \\ W^{(N)}[s, 1] & \cdots & W^{(N)}[s, s] \end{pmatrix} \qquad (1.19)$$

Note that in the case where the operations in Step ST1 and Step ST2 are performed in the circuit UNT[1] and N=1, the operations in Step ST1 and Step ST2 correspond to the operations in the block diagram illustrated in FIG. 15A. FIG. 15C shows the case where the operations in Step ST1 and Step ST2 are performed in the circuit UNT[2] and N=2. FIG. 16B shows the case where the operations in Step ST1 and Step ST2 are performed in the circuit UNT[3] and N=3.

[Step BR1]

In Step BR1, whether N is 1 or not is determined in the operation of the arithmetic circuit CDV. The operation of the arithmetic circuit CDV proceeds to Step ST3 when N is 1, and the operation of the arithmetic circuit CDV proceeds to Step ST5 when N is not 1.

[Step ST3]

Step ST3 includes a prior operation for inputting a plurality of pieces of the second data to the arithmetic cell array MACA of the circuit UNT[q] and a prior operation for performing the first product-sum operation in the case where the first product-sum operation is performed (in the case where N is 1).

First, the prior operation for inputting a plurality of pieces of the second data to the arithmetic cell array MACA of the circuit UNT[q] is described.

Step ST3 includes, for example, an operation in which the switching circuit SWC1 of the circuit UNT[q] establishes a conduction state between the terminal T1$a$[k] and the terminal T1$b$[k] and a non-conduction state between the terminal T1$a$[k] and the terminal T1$c$[k].

Specifically, in the switching circuit SWC1 in FIG. 9A, the switch S1$a$[k] is turned on by supplying a high-level potential from the wiring SWL1$a$ to the control terminal of the switch S1$a$[k], and the switch S1$b$[k] is turned off by supplying a low-level potential from the wiring SWL1$b$ to the control terminal of the switch S1$b$[k].

Through the above steps, the prior operation for inputting a plurality of pieces of the second data to the arithmetic cell array MACA is completed.

Next, a prior operation for performing the first product-sum operation in the arithmetic cell array MACA is described.

Step ST3 includes, for example, an operation in which the circuit SWCC establishes a conduction state between the wiring WCL[k] and the circuit CG[k] and the circuit SWCD establishes a conduction state between the circuit CG[k] and the wiring BL[k] in the current generation circuit CM of the circuit UNT[q].

Specifically, in the circuit SWCC included in the current generation circuit CM in any one of FIG. 10A to FIG. 11, a high-level potential is supplied from the wiring SWLC to the control terminal of the switch SC[k] to turn on the switch SC[k], and in the circuit SWCD included in the current generation circuit CM in any one of FIG. 10A to FIG. 11, a high-level potential is supplied from the wiring SWLD to the control terminal of the switch SD[k] to turn on the switch SD[k]. Note that this operation corresponds to the operation of the switching circuit SWC1 from Time T21 to Time T22 in the timing chart in FIG. 14.

Step ST3 includes, for example, an operation of establishing a non-conduction state between the circuit WCSa[k] and the wiring WCL1[k] in the circuit WCS of the circuit UNT[q].

Specifically, in the circuit SWCA in FIG. 4, the switch SA[k] is turned off by supplying a low-level potential from the wiring SWLA to the control terminal of the switch SA[k].

In the case where the circuit UNT[q] is the circuit UNT[1] (e.g., the circuit UNT[1] illustrated in FIG. 2 and FIG. 5), Step ST3 includes, for example, an operation in which the switching circuit SWC2 in FIG. 9B establishes a conduction state between the terminal T2$a$[k] and the terminal T2$b$[k] and a non-conduction state between the terminal T2$b$[k] and the terminal T2$c$[k].

Specifically, in the switching circuit SWC2 in FIG. 9B, the switch S2$a$[k] is turned on by supplying a high-level potential from the wiring SWL2$a$ to the control terminal of the switch S2$a$[k], and the switch S2$b$[k] is turned off by supplying a low-level potential from the wiring SWL2$b$ to the control terminal of the switch S2$b$[k].

Alternatively, in the case where the circuit UNT[q] is any one of the circuit UNT[2] to the circuit UNT[4] (e.g., the circuit UNT[t] illustrated in FIG. 3), Step ST3 includes, for example, an operation in which the current generation circuit RL of the circuit UNT[q] establishes a non-conduction state between the current generation circuit RL of the circuit UNT[q] and the wiring BL[k].

In the above manner, preparation for performing the first product-sum operation in the arithmetic cell array MACA of the circuit UNT[g] is completed.

[Step ST4]

Step ST4 includes an operation of performing the first product-sum operation in the arithmetic cell array MACA of the circuit UNT[q]. Note that a product-sum operation of $W^{(1)}$ as the first data and $X^{(1)}$ as the second data is performed here. Note that $X^{(1)}$ will be described later.

In Step ST4, the second data is transmitted to each of the cell IMD[1] to the cell IMD[s] and the cell IM[1, 1] to cell IM[s, s] of the arithmetic cell array MACA of the circuit UNT[q], with reference to the above description of the period from Time T22 to Time T23 in the timing chart of FIG. 14.

Note that in Step ST4, the circuit XCS sequentially generates currents corresponding to the first set to the s-th set of the second data, and transmits the sets of the second data to the cell IMD[1] to the cell IMD[s] and the cells IM[1, 1] to IM[s, s] of the arithmetic cell array MACA of the circuit UNT[q].

Specifically, for example, the circuit XCS of the circuit UNT[q] generates currents with amounts of $X^{(1)}_{(1)}[1] \times I_{Xut}$ to $X^{(1)}_{(1)}[s] \times I_{Xut}$ as the first set of the second data and transmits the currents to the arithmetic cell array MACA. Note that N in $X^{(N)}_{(h)}[i]$ represents what number product-sum operation the product-sum operation is, and $X^{(1)}_{(h)}[i]$ means the second data used when the first product-sum operation is performed. Furthermore, h in $X^{(N)}_{(h)}[i]$ means that the second data is included in the h-th set (h is an integer greater than or equal to 1 and less than or equal to s).

For example, the circuit XCS of the circuit UNT[q] generates currents with amounts of $X^{(1)}_{(s)}[1] \times I_{Xut}$ to $X^{(1)}_{(s)}[s] \times I_{Xut}$ as the s-th set of the second data and transmits the currents to the arithmetic cell array MACA of the circuit UNT[q], Specifically, for example, the circuit XCS of the circuit UNT[q] generates currents with amounts of $X^{(1)}_{(1)}[1] \times I_{Xut}$ to $X^{(1)}_{(1)}[s] \times I_{Xut}$ as the first set of the second data and transmits the currents to the arithmetic cell array MACA of the circuit UNT[q]. Note that N in $X^{(N)}_{(h)}[i]$ represents what number product-sum operation the product-sum operation is, and $X^{(1)}_{(h)}[i]$ means the second data used when the first product-sum operation is performed. Furthermore, h in $X^{(1)}_{(h)}[i]$ means that the second data is included in the h-th set (h is an integer greater than or equal to 1 and less than or equal to s). Furthermore, i in $X^{(1)}_{(h)}[i]$ means that the second data is transmitted to the i-th row of the arithmetic cell array MACA of the circuit UNT[q], i.e., the wiring XCL[i], and $X^{(1)}_{(h)}[1]$ is the second data transmitted to the wiring XCL[1].

For example, the circuit XCS of the circuit UNT[q] generates currents with amounts of $X^{(1)}_{(s)}[1] \times I_{Xut}$ to $X^{(1)}_{(s)}[s] \times I_{Xut}$ as the s-th set of the second data and transmits the currents to the arithmetic cell array MACA of the circuit UNT[q].

Here, the second data input to the arithmetic cell array MACA of the circuit UNT[q] in Step ST4 is referred to as $X^{(1)}$ as a matrix. Note that $X^{(1)}_{(h)}[i]$ included in the h-th set and input to the i-th row of the arithmetic cell array MACA the circuit UNT[q] refers to the h-th row and the i-th column of $X^{(1)}$. In this case, $X^{(1)}$ can be expressed by the following formula.

[Formula 20]

$$X^{(1)} = \begin{pmatrix} X_{(1)}^{(1)}[1] & \cdots & X_{(1)}^{(1)}[s] \\ \vdots & \ddots & \vdots \\ X_{(s)}^{(1)}[1] & \cdots & X_{(s)}^{(1)}[s] \end{pmatrix} \quad (1.20)$$

Here, the case where the h-th set of the second data is input to the arithmetic cell array MACA of the circuit UNT[q] is considered. At this time, in the circuit UNT[q], the amount of current flowing from the terminal CTi[j] of the current generation circuit CM to the wiring WCL[j] extending in the arithmetic cell array MACA is $I_{SUM}^{(1)}{}_{(h)}[j]$. Note that N in $I_{SUM}^{(N)}{}_{(h)}[j]$ represents what number product-sum operation the product-sum operation is, and $I_{SUM}^{(1)}{}_{(h)}[j]$ means the current amount corresponding to the arithmetic operation result obtained by the first product-sum operation. Furthermore, h in $I_{SUM}^{(1)}{}_{(h)}[j]$ means that the second data included in the h-th set is used.

In Step ST4, since the switch SC[j] of the circuit SWCC in the current generation circuit CM of the circuit UNT[q] is in an on state, a current of $I_{SUM}^{(1)}{}_{(h)}[j]$ to the cell IM[1, j] to the cell IM[s, j] in the j-th column of the arithmetic cell array MACA of the circuit UNT[q] flows from the terminal CTi[j] of the current generation circuit CM of the circuit UNT[q] through the wiring WCL[j].

In this case, in the circuit UNT[q], the amounts of currents flowing from the terminal CTi[1] to the terminal CTi[s] of the current generation circuit CM to the wiring WCL[1] to the wiring WCL[s] extending in the arithmetic cell array MACA can be expressed by the following formula using Formula (1.17).

[Formula 21]

$$(I_{SUM(h)}^{(1)}[1] \quad \cdots \quad I_{SUM(h)}^{(1)}[s]) = \quad (1.21)$$

$$I_{ref0}\left(\sum_{i=1}^{s} X_{(h)}^{(1)}[i] \times W^{(1)}[i, 1] \quad \cdots \quad \sum_{i=1}^{s} X_{(h)}^{(1)}[i] \times W^{(1)}[i, s]\right)$$

Furthermore, a current of $I_{SUM}^{(1)}{}_{(h)}[j]$ is output from the terminal CTi[j] of the current generation circuit CM of the circuit UNT[q], and thus, a current of $I_{SUM}^{(1)}{}_{(h)}[j]$ is also output from the terminal CTo[j] of the current generation circuit CM of the circuit UNT[q].

In Step ST4, in the current generation circuit CM of the circuit UNT[q], the switch SD[j] of the circuit SWCD is in an on state; thus, a current of $I_{SUM}^{(1)}{}_{(h)}[j]$ from the terminal CTo[j] of the current generation circuit CM of the circuit UNT[q] flows to the wiring BL[j] in the j-th column of the memory cell array MEMA of the circuit UNT[q].

Here, the memory cell array MEMA in FIG. 5 or FIG. 6 is considered. The wiring WWL[h] and the wiring RWL[h] in the memory cell array MEMA of the circuit UNT[q] are supplied with high-level potentials from the circuit WWD and the circuit RWD, respectively. Accordingly, in the h-th row in the memory cell array MEMA, a high-level potential is applied to each of the gates of the transistors F7 and the transistors F9 included in the cell MC[h, 1] to the cell MC[h, s], so that the transistors F7 and the transistors F9 are turned on. At this time, a low-level potential is supplied from the circuit WWD to each of the wiring WWL[1] to the wiring WWL[s] other than the wiring WWL[h], and a low-level potential is supplied from the circuit RWD to each of the wiring RWL[1] to the wiring RWL[s] other than the wiring RWL[h]. Thus, the transistors F7 and the transistors F9 included in the cell MC[1, 1] to the cell MC[s, s] in the rows other than the h-th row of the memory cell array MEMA are in an off state.

At this time, a conduction state is established between the wiring BL[j] and the first terminal of the transistor F8 included in the cell MC[h, j] in the h-th row of the memory cell array MEMA, and a non-conduction state is established between the wiring BL[j] and the first terminals of the transistors F8 included in the cell MC[1, j] to the cell MC[s, j] in the rows other than the h-th row of the memory cell array MEMA; accordingly, a current with a current amount $I_{SUM}^{(1)}{}_{(h)}[j]$ flows from the wiring BL[j] to the cell MC[h, j].

When the transistor F7 included in the cell MC[h, j] is turned on, a conduction state is established between the gate and the drain of the transistor F8 included in the cell MC[h, j] (diode connection). Therefore, when a current flows from the wiring BL[j] to the cell MC[h, j], the potentials of the gate of the transistor F8 and the second terminal of the transistor F8 are substantially equal to each other. The potentials are determined by the amount of current flowing from the wiring BL[j] to the cell MC[h, j], the potential of the first terminal of the transistor F8, and the like. The potentials are supplied to the wiring VE2 and are the ground potential GND, for example, in this operation example. In this operation example, a current with a current amount $I_{SUM}^{(1)}{}_{(h)}[j]$ flows from the wiring BL[j] to the cell MC[h, j], whereby the potential of the gate of the transistor F8 becomes $V_{MEM}[h, j]$, for example. That is, the gate-source voltage of the transistor F8 is $V_{MEM}[h, j]$–GND, and a current amount $I_{SUM}^{(1)}{}_{(h)}[j]$ is set as a current flowing between the first terminal and the second terminal of the transistor F8.

Next, the wiring WWL[h] and the wiring RWL[h] in the memory cell array MEMA of the circuit UNT[q] (circuit structure shown in FIG. 5 or FIG. 6) are supplied with low-level potentials from the circuit WWD and the circuit RWD, respectively. Accordingly, in the h-th row in the memory cell array MEMA, a low-level potential is applied to each of the gates of the transistors F7 and the transistors F9 included in the cell MC[h, 1] to the cell MC[h, s], so that the transistors F7 and the transistors F9 are turned off.

When the transistor F7 included in the cell MC[h, j] is turned off, $V_{MEM}[h, j]$–GND, which is the potential difference between the potential of the gate of the transistor F8 and the potential of the wiring VE3 (here, the ground potential GND, for example), is retained in the capacitor C6. Accordingly, $I_{SUM}^{(1)}{}_{(h)}[j]$, which is the amount of current flowing between the source and the drain of the transistor F8 in the cell MC[h, j], can be maintained. When the transistor F9 included in the cell MC[h, j] is turned off, a current with a current amount $I_{SUM}^{(1)}{}_{(h)}[j]$ set in the cell MC[h, j] does not flow from the wiring BL[j] to the cell MC[h, j].

As described above, a current amount $I_{SUM}^{(1)}{}_{(h)}[j]$ corresponding to the value of the result of a product-sum operation of $W^{(1)}[1, j]$ to $W^{(1)}[s, j]$ in the j-th column in $W^{(1)}$ as the first data and $X^{(1)}{}_{(h)}[1]$ to $X^{(1)}{}_{(h)}[s]$ as the h-th set of the second data is set in MC[h, j] of the memory cell array MEMA of the circuit UNT[q].

Specifically, for example, a current amount $I_{SUM}^{(1)}(1)$ [1] corresponding to the value of the result of a product-sum operation of $W^{(1)}[1, 1]$ to $W^{(1)}[s, 1]$ in the first column in $W^{(1)}$ as the first data and $X^{(1)}{}_{(1)}[1]$ to $X^{(1)}{}_{(1)}[s]$ as the first set of the second data is set in the cell MC[1, 1] of the memory cell array MEMA. For another example, a current amount $I_{SUM}^{(1)}{}_{(s)}[s]$ corresponding to the value of the result of a product-sum operation of $W^{(1)}[1, s]$ to $W^{(1)}[s, s]$ in the s-th column in $W^{(1)}$ as the first data and $X^{(1)}_{(s)}[1]$ to $X^{(1)}_{(s)}[s]$ as the s-th set of the second data is set in MC[s, s] of the memory cell array MEMA of the circuit UNT[q].

In the arithmetic cell array MACA of the circuit UNT[q], the first set to the s-th set of the second data from the circuit XCS are sequentially input, and every time the second data is input from the circuit XCS, the arithmetic operation result is written sequentially from the first row of the memory cell array MEMA of the circuit UNT[g], whereby current amounts are set in the cell MC[1, 1] to the cell MC[s, s] of the memory cell array MEMA; these current amounts are referred to as $I_{SUM}^{(1)}$ as a matrix. A current amount $I_{SUM}^{(1)}{}_{(h)}[j]$ corresponding to the value of the result of a product-sum operation of $W^{(1)}[1, j]$ to $W^{(1)}[s, j]$ in the j-th column in $W^{(1)}$ as the first data and $X^{(1)}_{(h)}[1]$ to $X^{(1)}_{(h)}[s]$ as the h-th set of the second data refers to the h-th row and the j-th column of $I_{SUM}^{(1)}$. In this case, $I_{SUM}^{(1)}$ can be expressed by the following formula.

[Formula 22]

$$I_{SUM}^{(1)} = \begin{pmatrix} I_{SUM(1)}^{(1)}[1] & \cdots & I_{SUM(1)}^{(1)}[s] \\ \vdots & \ddots & \vdots \\ I_{SUM(s)}^{(1)}[1] & \cdots & I_{SUM(s)}^{(1)}[s] \end{pmatrix} \quad (1.22)$$

By Step ST4, the first product-sum operation is completed. Note that after Step ST4, the operation proceeds to Step BR2.

Note that in the case where the operation of the product-sum operation in Step ST4 is performed in the circuit UNT[1], the above-described operations in Step ST4 correspond to the operations in the block diagram in FIG. 15B. Here, $I_{SUM}^{(1)}$ corresponds to $X^{(1)}W^{(1)}$.

[Step ST5]

To perform the N-th product-sum operation (here, N is an integer greater than or equal to 2), Step ST5 includes a prior operation for inputting a plurality of pieces of the second data to the arithmetic cell array MACA and a prior operation for performing the N-th product-sum operation. Note that in the case where Step ST5 is performed for the first time, N is 2.

First, a prior operation for inputting a plurality of pieces of the second data to the arithmetic cell array MACA of the circuit UNT[q] is described.

Step ST5 includes, for example, an operation in which the switching circuit SWC1 of the circuit UNT[q] establishes a non-conduction state between the terminal T1a[k] and the terminal T1b[k] and a conduction state between the terminal T1b[k] and the terminal T1c[k].

Specifically, in the switching circuit SWC1 in FIG. 9A, the switch S1a[k] is turned off by supplying a low-level potential from the wiring SWL1a to the control terminal of the switch S1a[k], and the switch S1b[k] is turned on by supplying a high-level potential from the wiring SWL1b to the control terminal of the switch S1b[k].

Through the above steps, the prior operation for inputting the plurality of pieces of the second data to the arithmetic cell array MACA of the circuit UNT[q] is completed.

Next, a prior operation for performing the N-th product-sum operation in the arithmetic cell array MACA of the circuit UNT[q] will be described.

Step ST5 includes, for example, an operation in which the circuit SWCC establishes a non-conduction state between the wiring WCL[k] and the circuit CG[k] and the circuit SWCD establishes a non-conduction state between the circuit CG[k] and the wiring BL[k] in the current generation circuit CM of a circuit UNT[q−1] (note that the circuit UNT[0] (i.e., when q=1) is the circuit UNT[4]).

Specifically, in any one of the circuits SWCC in FIG. 10A to FIG. 11, a low-level potential is supplied from the wiring SWLC to the control terminal of the switch SC[k] to turn on the switch SC[k], and in any one of the circuits SWCD in FIG. 10A to FIG. 11, a low-level potential is supplied from the wiring SWLD to the control terminal of the switch SD[k] to turn on the switch SD[k].

Step ST5 includes, for example, an operation of establishing a conduction state between the current generation circuit RL of the circuit UNT[q−1] and the wiring BL[k] in the current generation circuit RL of the circuit UNT[q−1].

Step ST5 includes, for example, an operation in which the circuit SWCC establishes a conduction state between the wiring WCL[k] and the circuit CG[k] and the circuit SWCD establishes a conduction state between the circuit CG[k] and the wiring BL[k] in the current generation circuit CM of the circuit UNT[q].

Specifically, in any one of the circuits SWCC in FIG. 10A to FIG. 11, a high-level potential is supplied from the wiring SWLC to the control terminal of the switch SC[k] to turn on the switch SC[k], and in any one of the circuits SWCD in FIG. 10A to FIG. 11, a high-level potential is supplied from the wiring SWLD to the control terminal of the switch SD[k] to turn on the switch SD[k]. Note that this operation corresponds to the operation of the switching circuit SWC1 from Time T21 to Time T22 in the timing chart in FIG. 14.

Step ST5 includes, for example, an operation of establishing a non-conduction state between the circuit WCSs[k] and the wiring WCL1[k] in the circuit WCS of the circuit UNT[g].

Specifically, in the circuit SWCA in FIG. 4, the switch SA[k] is turned off by supplying a low-level potential from the wiring SWLA to the control terminal of the switch SA[k].

In the case where the circuit UNT[g] is the circuit UNT[1] (e.g., the circuit UNT[1] illustrated in FIG. 2 and FIG. 5), Step ST5 includes, for example, an operation in which the switching circuit SWC2 in FIG. 9B establishes a non-conduction state between the terminal T2a[k] and the terminal T2b[k] and a non-conduction state between the terminal T2b[k] and the terminal T2c[k].

Specifically, in the switching circuit SWC2 in FIG. 9B, the switch S2a[k] is turned off by supplying a low-level potential from the wiring SWL2a to the control terminal of the switch S2a[k], and the switch S2b[k] is turned off by supplying a low-level potential from the wiring SWL2b to the control terminal of the switch S2b[k].

Alternatively, in the case where the circuit UNT[q] is any one of the circuit UNT[2] to the circuit UNT[4] (e.g., the circuit UNT[t] illustrated in FIG. 3), Step ST5 includes, for example, an operation in which the current generation circuit RL of the circuit UNT[q] establishes a non-conduction state between the current generation circuit RL of the circuit UNT[q] and the wiring BL[k].

In the above manner, preparation for performing the N-th product-sum operation of a plurality of pieces of the first data and a plurality of pieces of the second data in the arithmetic cell array MACA of the circuit UNT[q] is completed.

[Step ST6]

Step ST6 includes an operation of performing the N-th product-sum operation (in Step ST6, N is an integer greater than or equal to 2) in the arithmetic cell array MACA of the circuit UNT[q]. A product-sum operation of WW) as the first data and $X^{(N)}$ as the second data is performed here. Note that $X^{(N)}$ will be described later.

In Step ST6, the results of the N−1-th product-sum operations in the first row to the s-th row are sequentially read from the memory cell array MEMA of the circuit UNT[q−1].

Here, the case where the results of the N−1-th arithmetic operations are read from the cell MC[h, 1] to the cell MC[h, s] in the h-th row of the memory cell array MEMA of the circuit UNT[q−1] is considered. Specifically, the wiring RWL[h] in the memory cell array MEMA of the circuit UNT[q−1] is supplied with a high-level potential from the circuit RWD, for example. Accordingly, in the h-th row in the memory cell array MEMA of the circuit UNT[q−1], a high-level potential is applied to each of the gates of the transistors F9 included in the cell MC[h, 1] to the cell MC[h, s], so that the transistors F9 are turned on. At this time, a low-level potential is supplied from the circuit RWD to each of the wiring RWL[1] to the wiring RWL[s] other than the wiring RWL[h]. Thus, the transistors F9 included in the cell MC[1, 1] to the cell MC[s, s] in the rows other than the h-th row of the memory cell array MEMA of the circuit UNT [q−1] are in an off state.

At this time, a conduction state is established between the wiring BL[j] and the first terminal of the transistor F8 included in the cell MC[h, j] in the h-th row of the memory cell array MEMA of the circuit UNT[q−1], and a non-conduction state is established between the wiring BL[j] and the first terminals of the transistors F8 included in the cell MC[1, j] to the cell MC[s, j] in the rows other than the h-th row of the memory cell array MEMA of the circuit UNT [q−1]. Furthermore, a non-conduction state is established between the wiring BL[k] and the circuit CG[k] of the current generation circuit CM of the circuit UNT[q−1], and a conduction state is established between the current generation circuit RL of the circuit UNT[q−1] and the wiring BL[j]; thus, a current with a current amount $I_{SUM}^{(N-1)}{}_{(h)}[j]$ flows from the terminal RTi[j] of the current generation circuit RL of the circuit UNT[q−1] to the cell MC[h, j] through the wiring BL[j].

The current generation circuit RL of the circuit UNT[q−1] performs an arithmetic operation of a function system with the use of a value corresponding to a current amount $I_{SUM}^{(N-1)}{}_{(h)}[j]$ input to the terminal RTi[j] as an input value and outputs a current with an amount corresponding to the result of the arithmetic operation to the terminal RTo[j]. Here, when a function is F(x) (x is an input value) and the input value is $I_{SUM}^{(N-1)}{}_{(h)}[j]$, the result of the arithmetic operation of the function is defined as $F(I_{SUM}^{(N-1)}{}_{(h)}[j])=$ $X^{(N)}{}_{(h)}[j]×I_{Xut}$. That is, in the current generation circuit RL of the circuit UNT[q−1], when a current with a current amount $I_{SUM}^{(N-1)}{}_{(h)}[j]$ is input to the terminal RTi[j], a current amount $X^{(N)}{}_{(h)}[j]×I_{Xut}$ is output from the terminal RTo[j]. Furthermore, $X^{(N)}{}_{(h)}[j]$ is the second data in the N-th product-sum operation.

Here, the second data output from the terminal RTo[1] to the terminal RTo[s] of the current generation circuit RL of the circuit UNT[q−1] is referred to as $X^{(N)}$ as a matrix. Note that when a current with a current amount $I_{SUM}^{(N-1)}{}_{(h)}[j]$ flows from the terminal RTi[j] of the current generation circuit RL of the circuit UNT[q−1] to the cell MC[h, j] in the h-th row of the memory cell array MEMA of the circuit UNT[q−1], $X^{(N)}{}_{(h)}[j]$ as the second data output from the terminal RTo[j] refers to the h-th row and the j-th column of $X^{(N)}$.

[Formula 23]

$$X^{(N)} = \begin{pmatrix} X^{(N)}_{(1)}[1] & \cdots & X^{(N)}_{(1)}[s] \\ \vdots & \ddots & \vdots \\ X^{(N)}_{(s)}[1] & \cdots & X^{(N)}_{(s)}[s] \end{pmatrix} \quad (1.23)$$

Note that $X^{(N)}{}_{(h)}[1]$ to $X^{(N)}{}_{(h)}[s]$ of the h-th row of $X^{(N)}$ are the h-th set of the second data in the N-th arithmetic circuit.

Since a conduction state is established between the terminal RTo[i] in the current generation circuit RL of the circuit UNT[q−1] and the wiring XCL[i] of the circuit UNT[q] by the switching circuit SWC1, a current with a current amount $I_{SUM}^{(N)}{}_{(h)}[i]$ flows from the terminal RTo[i] in the current generation circuit RL of the circuit UNT[q−1] to the cell IMD[i] and the cell IM[i, 1] to the cell IM[i, s] included in the arithmetic cell array MACA of the circuit UNT[q] through the wiring XCL[i] of the circuit UNT[g].

Here, the results of the N−1-th product-sum operations in the first row to the s-th row are read row by row from the memory cell array MEMA of the circuit UNT[q−1], so that currents corresponding to the first set to the s-th set of the second data are sequentially output from the terminal RTo[1] to the terminal RTo[s] of the current generation circuit RL of the circuit UNT[q−1]. Accordingly, sequentially from the first row to the s-th row of the memory cell array MEMA of the circuit UNT[q−1], one set of the second data set in each row is transmitted to the cell IMD[1] to the cell IMD[s] and the cell IM[1, 1] to the cell IM[s, s] of the arithmetic cell array MACA of the circuit UNT[q].

After that, a product-sum operation is performed in the arithmetic cell array MACA of the circuit UNT[q] as in Step ST4, and the arithmetic operation result is written to the memory cell array MEMA of the circuit UNT[q]. Here, the current amounts set in the cell MC[1, 1] to the cell MC[s, s] of the memory cell array MEMA of the circuit UNT[q] are referred to as $I_{SUM}^{(N)}$ as a matrix. A current amount $I_{SUM}^{(N)}{}_{(h)}[j]$ corresponding to the value of the result of a product-sum operation of $W^{(N)}[1, j]$ to $W^{(N)}[s, j]$ in the j-th column in $W^{(N)}$ as the first data and $X^{(N)}{}_{(h)}[1]$ to $X^{(N)}{}_{(h)}[s]$ as the h-th set of the second data refers to the h-th row and the j-th column of $I_{SUM}^{(N)}$. In this case, $I_{SUM}^{(N)}$ can be expressed by the following formula. In this case, $I_{SUM}^{(N)}$ can be expressed by the following formula.

[Formula 24]

$$I_{SUM}^{(N)} = \begin{pmatrix} I_{SUM(1)}^{(N)}[1] & \cdots & I_{SUM(1)}^{(N)}[s] \\ \vdots & \ddots & \vdots \\ I_{SUM(s)}^{(N)}[1] & \cdots & I_{SUM(s)}^{(N)}[s] \end{pmatrix} \quad (1.24)$$

By Step ST6, the N-th product-sum operation is completed. Note that after Step ST6, the operation proceeds to Step BR2.

Note that in the case where the operation of the product-sum operation in Step ST6 is performed in the circuit UNT[2] and N=2, the above-described operation in Step ST6 corresponds to the operation in the circuit UNT[2] illustrated in FIG. 16A. Here, $I_{SUM}^{(2)}$ corresponds to $X^{(2)}W^{(2)}$. In the case where the product-sum operation in Step ST6 is performed in the circuit UNT[3] and N=3, the above-described operation in Step ST6 corresponds to the operation in the circuit UNT[3] illustrated in FIG. 16C. Here, $I_{SUM}^{(3)}$ corresponds to $X^{(3)}W^{(3)}$.

[Step BR2]

In Step BR2, whether or not the operation is terminated with the N-th product-sum operation (e.g., N is 1 in the case where Step BR2 is performed for the first time) is determined in the operation of the arithmetic circuit CDV. In the case where the operation of the arithmetic circuit CDV is not terminated with the N-th product-sum operation, the value N of the arithmetic circuits CDV is increased by one and the operation proceeds to Step ST1. In the case where the operation is terminated with the N-th product-sum operation, the operation proceeds to Step ST7. Note that in the case where the N-th product-sum operation is terminated, the N-th product-sum operation is performed in the circuit UNT[1] of the arithmetic circuit CDV.

[Step ST7]

Step ST7 includes a prior operation for performing an arithmetic operation of a function system with the use of $X^{(N)}W^{(N)}$ obtained by an arithmetic operation in the arithmetic cell array MACA as an input value and outputting the result of the arithmetic operation to the outside of the arithmetic circuit CDV.

As described above, Step ST7 is performed in the circuit UNT[1].

Step ST7 includes, for example, an operation in which the circuit SWCC establishes a non-conduction state between the wiring WCL[k] and the circuit CG[k] and the circuit SWCD establishes a non-conduction state between the circuit CG[k] and the wiring BL[k] in the current generation circuit CM of the circuit UNT[1].

Specifically, in any one of the circuits SWCC in FIG. 10A to FIG. 11, a low-level potential is supplied from the wiring SWLC to the control terminal of the switch SC[k] to turn off the switch SC[k], and in any one of the circuits SWCD in FIG. 10A to FIG. 11, a low-level potential is supplied from the wiring SWLD to the control terminal of the switch SD[k] to turn off the switch SD[k].

Step ST7 includes, for example, an operation in which the switching circuit SWC2 of the circuit UNT[1] establishes a non-conduction state between the terminal T2a[k] and the terminal T2b[k] and a conduction state between the terminal T2b[k] and the terminal T2c[k].

Specifically, in the switching circuit SWC2 in FIG. 9B, the switch S2a[k] is turned off by supplying a low-level potential from the wiring SWL2a to the control terminal of the switch S2a[k], and the switch S2b[k] is turned on by supplying a high-level potential from the wiring SWL2b to the control terminal of the switch S2b[k].

As described above, in the switching circuit SWC2 of the circuit UNT[1], a conduction state is established between the terminal T2b[k] and the terminal T2c[k], whereby a conduction state is established between the circuit ITRZa[k] and the wiring BL[k].

In the above manner, the preparation for performing an arithmetic operation of a function system with the use of $X^{(N)}W^{(N)}$ obtained by the arithmetic operation in the arithmetic cell array MACA of the circuit UNT[1] as an input value and outputting the result of the arithmetic operation to the outside of the arithmetic circuit CDV is completed.

[Step ST8]

Step ST8 includes an operation in which an arithmetic operation of a function system is performed with the use of $X^{(N)}W^{(N)}$ as an input value and the result of the arithmetic operation is output to the outside of the arithmetic circuit CDV.

In Step ST8, the results of the N-th product-sum operations in the first row to the s-th row are sequentially read from the memory cell array MEMA of the circuit UNT[g].

Note that for a method for sequentially reading the results of the N-th product-sum operations in the first row to the s-th row in the memory cell array MEMA, the content of Step ST6 is referred to.

At this time, a non-conduction state is established between the wiring BL[j] and the circuit CG[j] of the current generation circuit CM of the circuit UNT[g], a non-conduction state is established between the current generation circuit RL of the circuit UNT[q] and the wiring BL[j], and a conduction state is established between the wiring BL[j] and the terminal OT[j] of the circuit UNT[q], so that current with the current amount $I_{SUM}^{(N)}{}_{(h)}[j]$ flows from the terminal ZT[j] of the circuit ITRZ to the cell MC[h, j] through the wiring BL[j].

Note that N in $I_{SUM}^{(N)}{}_{(h)}[j]$ represents what number product-sum operation the product-sum operation is, and $I_{SUM}^{(N)}{}_{(h)}[j]$ means the current amount corresponding to the arithmetic operation result obtained by the N-th product-sum operation. Furthermore, h in $I_{SUM}^{(N)}{}_{(h)}[j]$ means that the second data included in the h-th set is used.

The result of the N-th product-sum operation is read row by row from the memory cell array MEMA of the circuit UNT[q] in the h-th row, whereby the current amounts $I_{SUM}^{(N)}{}_{(h)}[1]$ to $I_{SUM}^{(N)}{}_{(h)}[s]$ flow to the cell MC[h, 1] to the cell MC[h, s] from the terminal ZT[1] to the terminal ZT[s] of the circuit ITRZ. Here, in the case where the amount of current input to the terminal ZT[1] to the terminal ZT[s] of the circuit ITRZ is denoted by $I_{SUM}^{(N)}$ as a matrix, $I_{SUM}^{(N)}$ is expressed by Formula (1.22) when N is 1 and Formula (1.24) when N is 2 or more.

Specifically, the current amounts flowing from the circuit ITRZa[1] to the circuit ITRZa[s] in the circuit ITRZ to the cell MC[h, 1] to the cell MC[h, s] of the memory cell array MEMA in the h-th row can be expressed by Formula (1.18) as follows.

[Formula 25]

$$\left( I_{SUM(h)}^{(N)}[1] \quad \cdots \quad I_{SUM(h)}^{(N)}[s] \right) = \tag{1.25}$$

$$I_{ref0}\left( \sum_{i=1}^{s} X_{(h)}^{(N)}[i] \times W^{(N)}[i, 1] \quad \cdots \quad \sum_{i=1}^{s} X_{(h)}^{(N)}[i] \times W^{(N)}[i, s] \right)$$

In this operation example, the circuit ITRZ is described as having a structure of the circuit ITRZ illustrated in FIG. 13A.

In each of the circuit ITRZa[1] to the circuit ITRZa[s], the converter circuit RL3[j] performs an arithmetic operation of a function system with the use of a value corresponding to a current amount $I_{SUM}^{(N)}{}_{(h)}[j]$ input to the terminal R3Ti[j] as an input value and outputs a current with an amount corresponding to the result of the arithmetic operation to the terminal R3To[j]. Here, when a function is F(x) (x is an input value) and the input value is $I_{SUM}^{(N)}{}_{(h)}[j]$, the result of the arithmetic operation of the function is defined as $F(I_{SUM}^{(N)}{}_{(h)}[j])=T_{(h)}[j] \times I_{Tut}$. Note that $I_{Tut}$ is a reference current that flows when $T_{(h)}[j]$ is 1. In the converter circuit RL3, when a current with a current amount $I_{SUM}^{(N)}{}_{(h)}[j]$ is input to the terminal R3Ti[j], a current amount $T_{(h)}[j] \times I_{Tut}$ is output from the terminal R3To[j]. Furthermore, $T_{(h)}[j]$ is the arithmetic operation result obtained with the arithmetic circuit CDV.

Here, the arithmetic operation results output from the terminal R3To[1] to the terminal R3To[s] of the converter circuit RL3[1] to the converter circuit RL3[s] are referred to as T as a matrix. Note that when a current with a current amount $I_{SUM}{}^{(N)}{}_{(h)}[j]$ flows from the terminal R3Ti[j] of the converter circuit RL3[j] to the cell MC[h, j] in the h-th row of the memory cell array MEMA1, $T_{(h)}[j]$, which is the arithmetic result output from the terminal R3To[j], refers to the h-th row and the j-th column of T.

[Formula 26]

$$T = \begin{pmatrix} T_{(1)}[1] & \cdots & T_{(1)}[s] \\ \vdots & \ddots & \vdots \\ T_{(s)}[1] & \cdots & T_{(s)}[s] \end{pmatrix} \quad (1.26)$$

Note that $T_{(h)}[1]$ to $T_{(h)}[s]$ of the h-th row of T are the results that are obtained using the h-th set of the second data in the N-th product-sum operation and output from the terminal R3To[1] to the terminal R3To[s] of the converter circuit RL3[1] to the converter circuit RL3[s].

On another note, when the first set to the s-th set of the second data are sequentially input in the memory cell array MEMA of the circuit UNT[q], the results of arithmetic operations of a function system in the cases of the first set to the s-th set are sequentially output from the terminal R3To[1] to the terminal R3To[s] of the converter circuit RL3.

After that, the arithmetic operation results T (1) [j] to T(s) [j] sequentially output from the terminal R3To[j] of the converter circuit RL3 in the circuit ITRZa[j] are converted into digital signals by the analog-digital converter circuit ADC, and the digital signals are output from the terminal FT[j].

Note that the operations performed in Step ST7 and Step ST8 correspond to the operations in the block diagram in FIG. 17.

With the use of the arithmetic circuit CDV described in this embodiment, a product-sum operation can be performed once or a plurality of times. In the case where a conventional arithmetic circuit performs a product-sum operation a plurality of times, digital-analog conversion and analog-digital conversion are performed before and after one arithmetic operation; however, with the use of the arithmetic circuit CDV, the digital-analog conversion only needs generation of an analog current in the circuit WCS and generation of an analog current in the circuit XCS performed prior to the first product-sum operation, and the analog-digital conversion only needs processing by the analog-digital converter circuit ADC in the circuit ITRZ. That is, the use of the arithmetic circuit CDV can reduce the number of digital-analog converter circuits and the number of analog-digital converter circuits, and thus, the circuit area of the arithmetic circuit CDV is smaller than that of the conventional structure. The power consumption of the arithmetic circuit CDV can be lower than that of the conventional structure.

Although this embodiment describes an example in which the plurality of arithmetic cells included in the arithmetic cell array MACA and the plurality of memory cells included in the memory cell array MEMA are arranged in a matrix of s rows and s columns, all or some of the arithmetic cell array MACA and the memory cell array MEMA may have different numbers of columns. All or some of the arithmetic cell array MACA and the memory cell array MEMA may have different numbers of columns.

The semiconductor device of one embodiment of the present invention is not limited to the structure of the arithmetic circuit CDV described in this embodiment. The semiconductor device of one embodiment of the present invention may have an appropriately modified structure of the arithmetic circuit CDV described in this embodiment.

Figure 19:
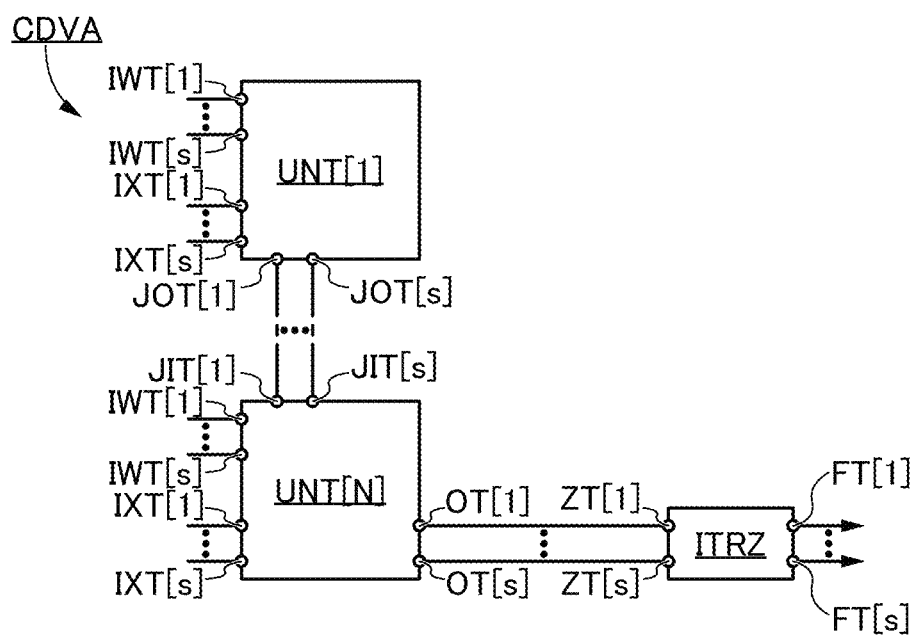
FIG. 19 is a block diagram illustrating a structure example of a semiconductor device.

For example, the arithmetic circuit CDV illustrated in FIG. 1 may be changed to an arithmetic circuit CDVA illustrated in FIG. 19. While the arithmetic circuit CDV illustrated in FIG. 1 has a structure in which the circuit UNT[1] to the circuit UNT[4] are electrically connected to each other to have a ring shape, the arithmetic circuit CDVA illustrated in FIG. 19 does not have a ring shape as illustrated in FIG. 1 but has a structure in which the circuit UNT[1] to the circuit UNT[N] (here, N is an integer greater than or equal to 1) are electrically connected to each other in series.

The number of the circuits UNT included in the arithmetic circuit CDVA illustrated in FIG. 19 is, for example, the same as the number of times of the desired product-sum operation and the arithmetic operation of a function system.

The arithmetic circuit CDVA illustrated in FIG. 19 has a structure in which the circuit UNT[1] to the circuit UNT[N] are electrically connected to each other in series; thus, the sum operation and the arithmetic operation of a function system are preferably performed sequentially from the circuit UNT[1] to the circuit UNT[M].

When the arithmetic operation of a circuit UNT[S] (S is an integer greater than or equal to 2 and less than or equal to N) is performed, the circuit UNT[1] to a circuit UNT[S−1] are in an idle state because the arithmetic operation has already been performed. Thus, when an arithmetic operation is performed in the circuit UNT[S], another arithmetic operation may be performed in the circuit UNT[1] to the circuit UNT[S−1].

Figure 20:
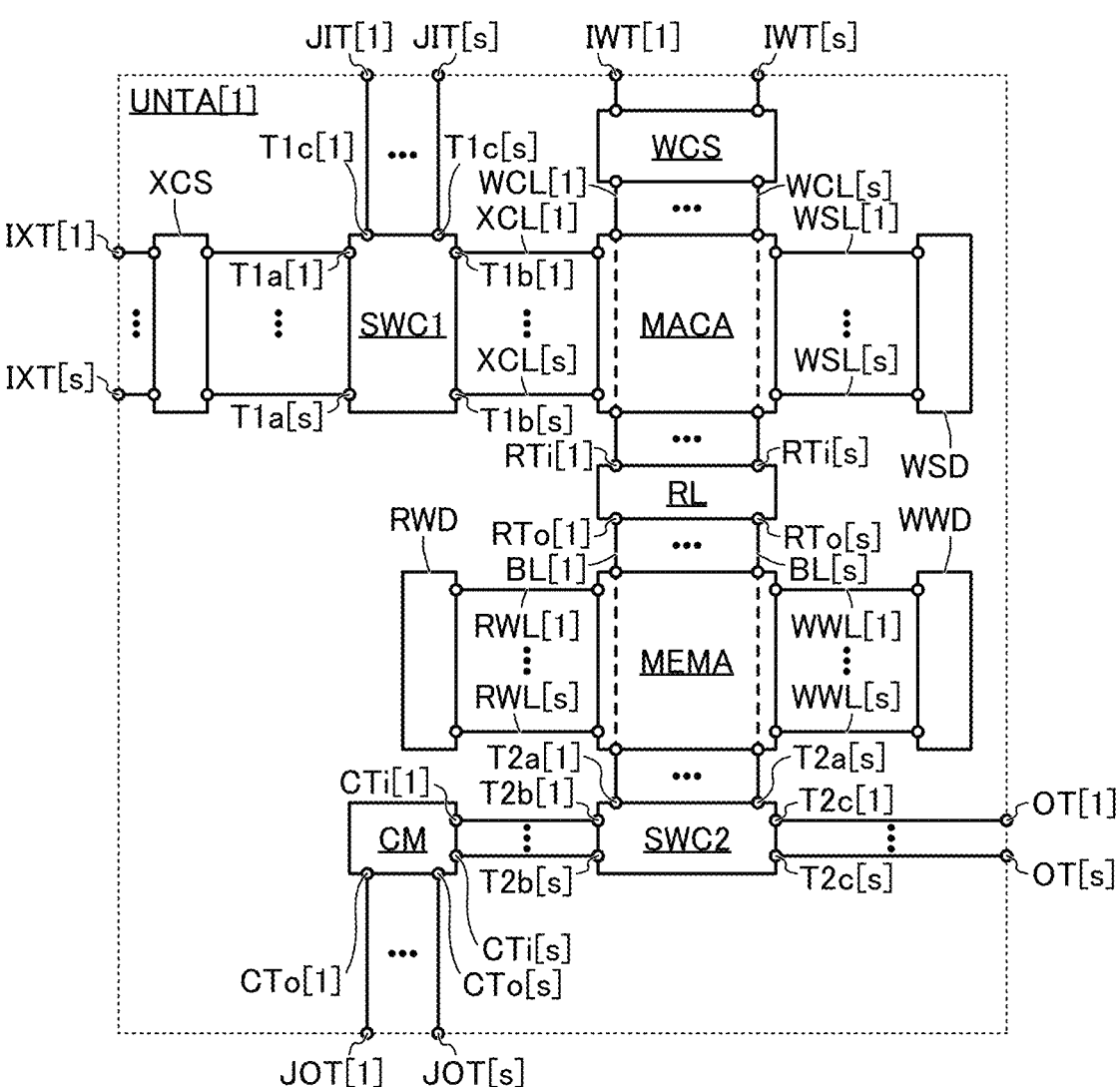
FIG. 20 is a block diagram illustrating a structure example of a semiconductor device.

Alternatively, for example, the circuit UNT[1] illustrated in FIG. 2 may be changed to the circuit UNTA[1] illustrated in FIG. 20. The circuit UNTA[1] is a modification example of the structure of the circuit UNT[1], which is different from the circuit UNT[1] in that the positions of the current generation circuit CM and the current generation circuit RL are interchanged with each other.

Specifically, the wiring WCL[k] is electrically connected to the terminal RTi[k], the terminal RTo[k] is electrically connected to the wiring BL[k], the terminal T2b[k] is electrically connected to the terminal CTi[k], and the terminal CTo[k] is electrically connected to the terminal JOT [k].

Thus, in the circuit UNTA[1], a potential corresponding to the amount of current output from the current generation circuit RL is written to the memory cell array MEMA. Even with such a structure, the circuit UNTA[1] can perform a product-sum operation and an arithmetic operation of a function system a plurality of times like the circuit UNT[1]. Although not illustrated, the current generation circuit CM and the current generation circuit RL in the circuit UNT[+] illustrated in FIG. 3 may also be interchanged with each other.

Figure 21:
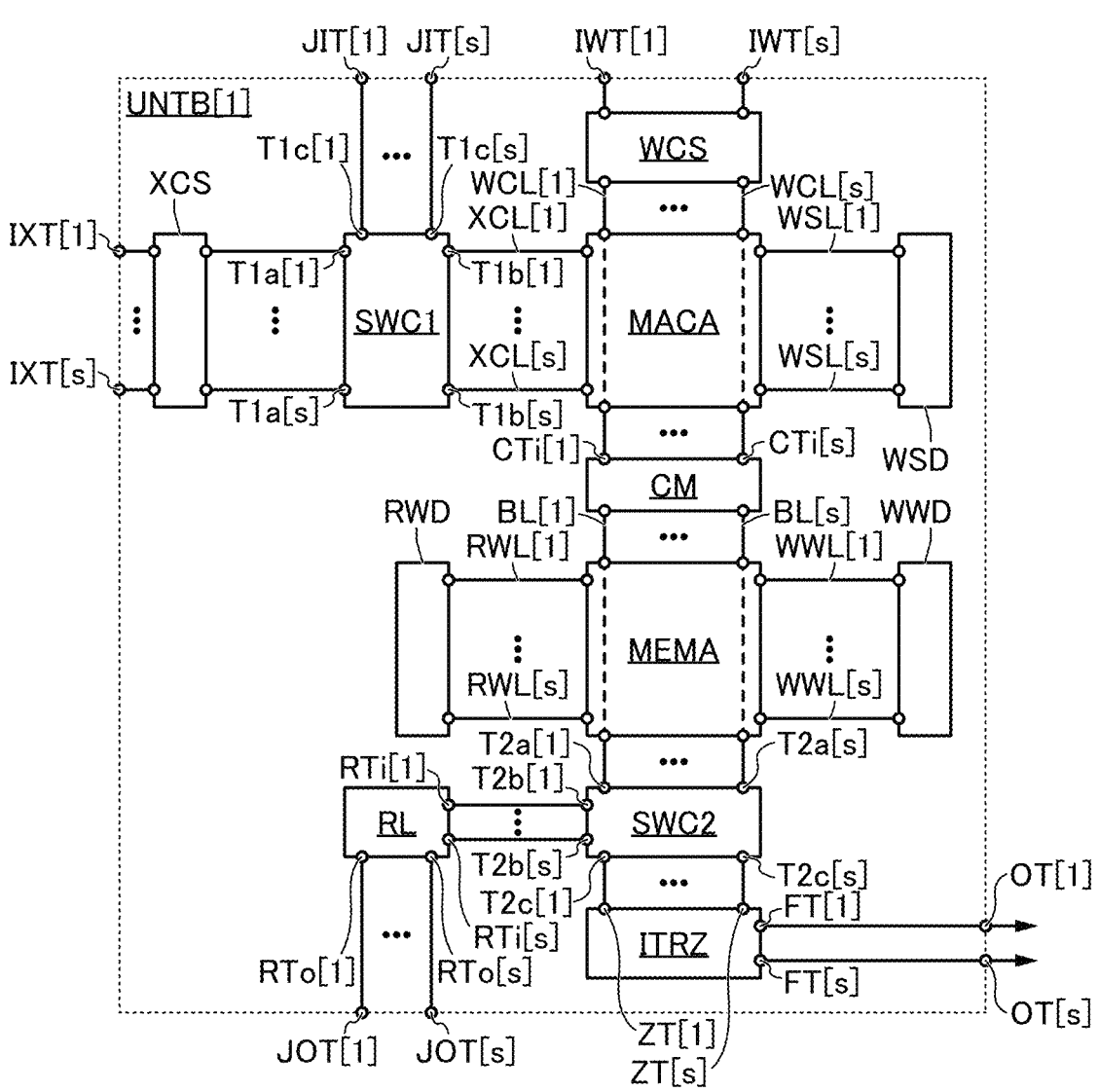
FIG. 21 is a block diagram illustrating a structure example of a semiconductor device.

For example, the circuit UNT[1] illustrated in FIG. 2 may be changed to the circuit UNTB[1] illustrated in FIG. 21. The circuit UNTB[1] is a modification example of the structure of the circuit UNT[1], which is different from the circuit UNT[1] in that the circuit ITRZ is provided inside the circuit UNTB[1].

Specifically, the terminal ZT[1] is electrically connected to the terminal T2c[1], the terminal ZT[s] is electrically connected to the terminal T2c[s], the plurality of output terminals of the circuit ITRZ are electrically connected to the terminal OT[1] to the terminal OT[s], and the terminal OT[1] to the terminal OT[s] are electrically connected to the terminal FT[1] to the terminal FT[s], respectively.

Even with such a structure, the circuit UNTA[1] can perform a product-sum operation and an arithmetic operation of a function system a plurality of times like the circuit UNT[1]. Although not illustrated, similarly, the circuit ITRZ may be provided inside the circuit UNT[t] illustrated in FIG. 3.

Note that this embodiment can be combined with any of the other embodiments described in this specification as appropriate. For example, the configurations, structures, methods, and the like described in this embodiment can be used in combination with the configurations, structures, methods, and the like described in the other embodiments and the like as appropriate.

Embodiment 2

In this embodiment, a structure example of the arithmetic circuit CDV described in the above embodiment and the circuit UNT included in the arithmetic circuit CDV are described.

<Structure Example of Circuit UNT>

First, the circuit UNT will be described.

Figure 22A:
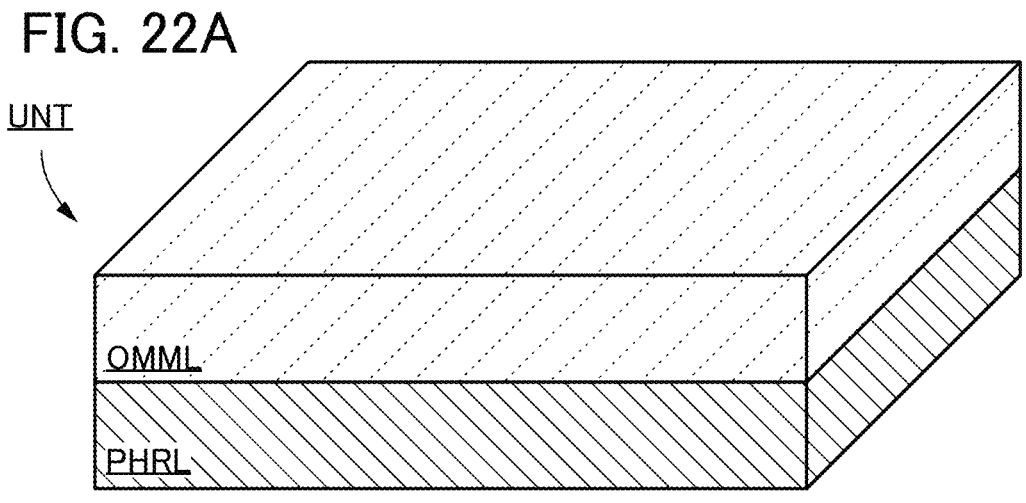
FIG. 22A is a schematic perspective view illustrating a structure example of a circuit included in a semiconductor device.

FIG. 22A is a perspective view schematically illustrating the circuit UNT[1] in FIG. 2 that is included in the semiconductor device of one embodiment of the present invention. The circuit UNT illustrated in FIG. 22A includes a layer PHRL and a layer OMML, for example. The layer PHRL is positioned below the layer OMML. That is, the circuit UNT in FIG. 22A has a structure in which the layer PHRL and the layer OMML are stacked.

Figure 22B:
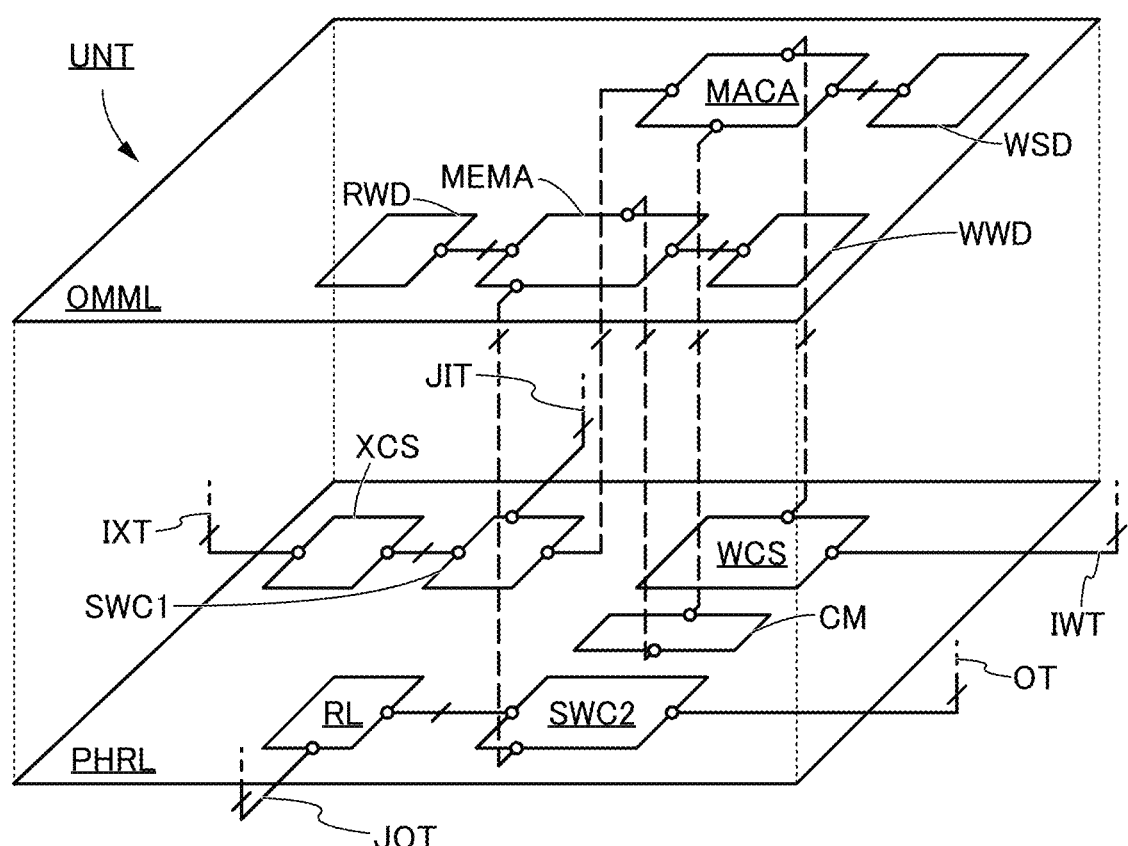
FIG. 22B is a block diagram illustrating the structure example of the circuit included in the semiconductor device.

FIG. 22B is a block diagram illustrating structure examples of the layer PHRL and the layer OMML illustrated in FIG. 22A.

In FIG. 22B, the layer PHRL includes, for example, the circuit WCS, the circuit XCS, the circuit XCS, the current generation circuit CM, the current generation circuit RL, the switching circuit SWC1, and the switching circuit SWC2 illustrated in FIG. 2. The layer OMML includes, for example, the arithmetic cell array MACA, the memory cell array MEMA, the circuit WWD, the circuit RWD, and the circuit WSD illustrated in FIG. 2.

In FIG. 22B, the terminal IWT[1] to the terminal IWT[s] in FIG. 2 are illustrated as the terminal IWT, the terminal IXT[1] to the terminal IXT[s] in FIG. 2 are illustrated as the terminal IXT, the terminal JIT[1] to the terminal JIT[s] in FIG. 2 are illustrated as the terminal JIT, the terminal JOT[1] to the terminal JOT[s] in FIG. 2 are illustrated as the terminal JOT, and the terminal OT[1] to the terminal OT[s] in FIG. 2 are illustrated as the terminal OT.

Although FIG. 22B illustrates the structure in which the switching circuit SWC1 and the switching circuit SWC2 are included in the layer PHRL, the switching circuit SWC1 and the switching circuit SWC2 may be included in the layer OMML.

The layer PHRL can be formed by providing a circuit element such as a transistor or a capacitor over a substrate, for example. As the substrate, a semiconductor substrate (e.g., a single crystal substrate formed of silicon or germanium) can be used. Besides such a semiconductor substrate, for example, any of the following can be used: an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, and paper and a base film each including a fibrous material. Examples of the glass substrate include a barium borosilicate glass substrate, an aluminoborosilicate glass substrate, and a soda lime glass substrate. Examples of materials for the flexible substrate, the attachment film, or the base film include plastics typified by polyethylene terephthalate (PET), polyethylene naphthalate (PEN), polyethersulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, an epoxy resin, an inorganic vapor-deposited film, and paper. Note that in the case where the manufacturing process of the arithmetic circuit CDV involves heat treatment, a highly heat-resistant material is preferably selected for the substrate.

Note that the substrate included in the layer PHRL is described as a semiconductor substrate including silicon in this embodiment. That is, the circuit UNT is described as a die (referred to a silicon die in some cases).

When the substrate included in the layer PHRL is a semiconductor substrate including silicon as a material, for example, the transistors included in the circuit WCS, the circuit XCS, the current generation circuit CM, and the current generation circuit RL can be formed on the semiconductor substrate. In that case, the transistors are Si transistors. The Si transistor has high field-effect mobility and thus can make a high on-state current flow. Accordingly, the driving speed of each of the above-described circuits can be increased, and the range of a signal can be expanded, for example.

The stacked-layer structure of the layer PHRL and the layer OMML can be manufactured by directly forming the layer OMML on the layer PHRL. Alternatively, the stacked-layer structure can be manufactured in the following manner: the layer OMML is formed by providing a circuit element such as a transistor or a capacitor over a substrate, and the substrate is mounted over the layer PHRL.

In the case where the layer OMML is directly formed on the layer PHRL, the layer OMML preferably includes an OS transistor. The OS transistor can be formed not only over a semiconductor substrate but also over an insulator substrate or a conductor substrate or over a conductive film, an insulating film, or a semiconductor film and thus can be easily provided over a semiconductor substrate where a Si transistor is formed (over the layer PHRL).

In the case where the layer OMML is formed by forming a circuit element such as a transistor or a capacitor over a substrate and the substrate is mounted over the layer PHRL, a flip-chip bonding method or a wire bonding method can be used. Alternatively, the layer OMML may be mounted over the layer PHRL in the following manner: a first bonding layer is provided on the layer PHRL side, a second bonding layer is provided on the substrate of the layer OMML, and the first bonding layer and the second bonding layer are bonded to each other by one or both of a surface activated bonding method and a hydrophilic bonding method. Specifically, in what is called Cu—Cu bonding, the first bonding layer and the second bonding layer each include copper (Cu) as a conductor, and copper (Cu) of the first bonding layer and that of the second bonding layer are bonded to each other.

<Structure Example of Arithmetic Circuit CDV>

Next, a structure example of the arithmetic circuit CDV will be described.

Figure 23:
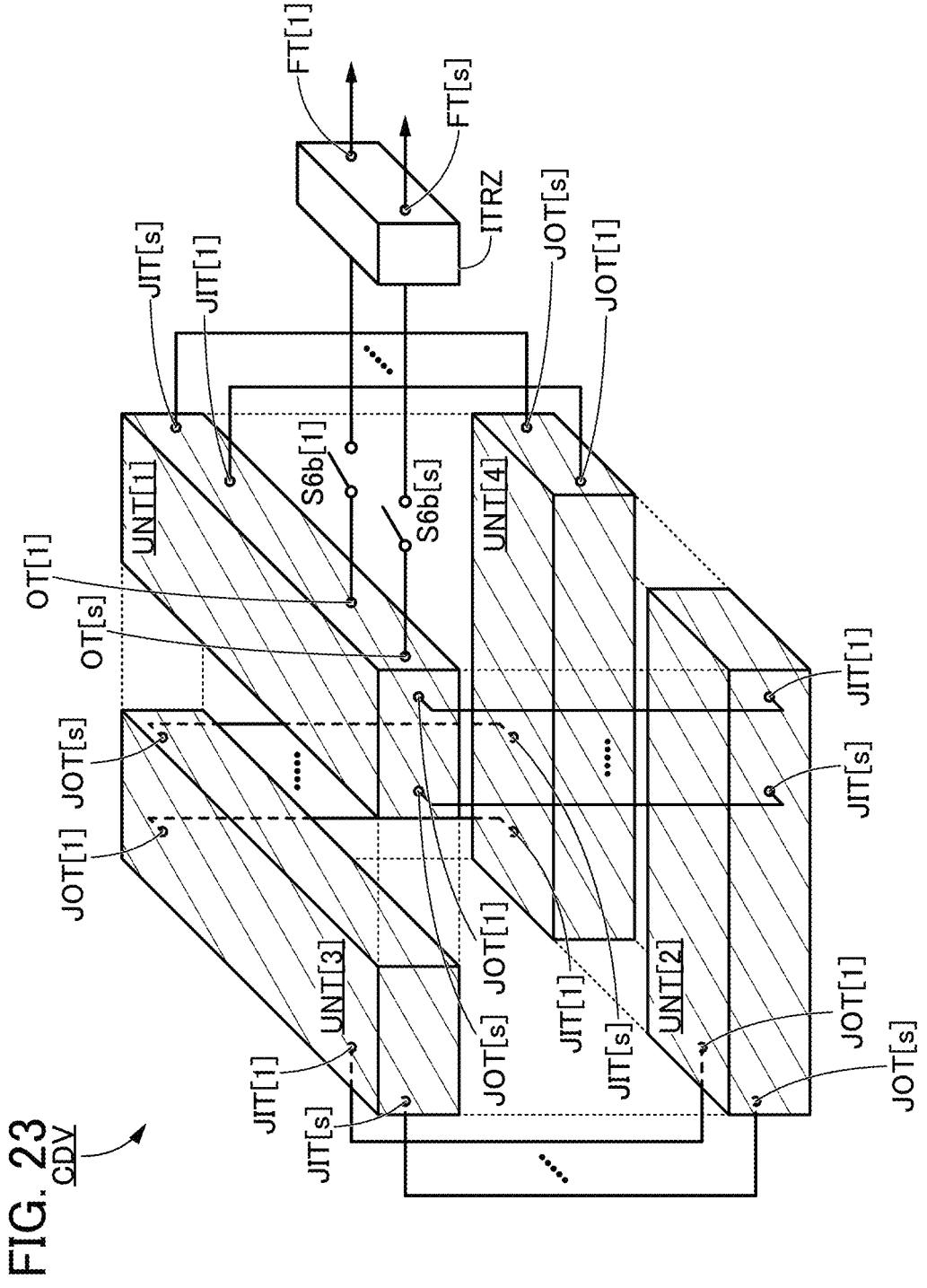
FIG. 23 is a schematic perspective view illustrating a structure example of a semiconductor device.

The arithmetic circuit CDV in FIG. 1, which is described in the above embodiment, can have a structure as illustrated in FIG. 23 with the use of the circuit UNT described above, for example.

The arithmetic circuit CDV illustrated in FIG. 23 has a structure in which the circuit UNT[1] and the circuit UNT[3] are provided above the circuit UNT[2] and the circuit UNT[4]. Specifically, the circuit UNT[1] overlaps with a region that includes part of the circuit UNT[2] and part of the circuit UNT[4], and the circuit UNT[3] overlaps with a region that includes another part of the circuit UNT[2] and another part of the circuit UNT[4].

The circuit UNT[1] and the circuit UNT[3] may be formed over the same substrate or may be formed over different substrates. That is, the circuit UNT[1] and the circuit UNT[3] may be the same die or different dies. Similarly, the circuit UNT[2] and the circuit UNT[4] may be formed over the same substrate or may be formed over different substrates. That is, the circuit UNT[2] and the circuit UNT[4] may be the same die or different dies.

FIG. 23 illustrates the terminal JIT[1] to the terminal JIT[s] and the terminal JOT[1] to the terminal JOT[s] included in each of the circuit UNT[1] to the circuit UNT[4]. FIG. 23 also illustrates the circuit ITRZ. FIG. 23 selectively illustrates a switch S6*b*[1] to a switch S6*b*[s] included in the switching circuit SWC2.

FIG. 23 illustrates the terminal OT[1] to the terminal OT[s] included in the circuit UNT[1]. Note that the terminal OT[1] to the terminal OT[s] may be provided not only in the circuit UNT[1] but also in the circuit UNT[2] to the circuit UNT[4].

In the circuit UNT[1], it is preferable that the terminal JIT[1] to the terminal JIT[s] be positioned in one of both end regions of the circuit UNT[1], and the terminal JOT[1] to the terminal JOT[s] be positioned in the other of the both end regions of the circuit UNT[1]. As described above, when the terminal JIT[1] to the terminal JIT[s] and the terminal JOT[1] to the terminal JOT[s] are provided at the both ends of the circuit UNT[1], in the circuit UNT[1], data flows from one of the both ends of the circuit UNT[1] (the terminal JIT[1] to the terminal JIT[s]) to the other of the both ends of the circuit UNT[1] (the terminal JOT[1] to the terminal JOT[s]). In the circuit UNT[1], the substantial direction in which data flows can be set to one direction as described above, so that the installation area of wirings inside the circuit UNT[1] can be reduced. Thus, parasitic resistance and parasitic capacitance of the wirings extended in the circuit UNT[1] can be reduced. The same applies to the circuit UNT[2] to the circuit UNT[4].

In the case where the terminal JIT[1] to the terminal JIT[s] and the terminal JOT[1] to the terminal JOT[s] are provided at both ends of each of the circuit UNT[1] to the circuit UNT[4], electrical connection between the circuit UNT[1] and the circuit UNT[2], electrical connection between the circuit UNT[2] and the circuit UNT[3], electrical connection between the circuit UNT[3] and the circuit UNT[4], and electrical connection between the circuit UNT[4] and the circuit UNT[1] are preferably as illustrated in FIG. 23. With the connection structure illustrated in FIG. 23, as described above, the substantial direction in which data flows can be set to one direction in each of the circuit UNT[1] to the circuit UNT[4], so that the installation area of wirings inside the circuit UNT[1] to the circuit UNT[4] can be reduced.

Note that in FIG. 23, to clearly illustrate electrical connection, the terminal JIT[1] to the terminal JIT[s] and the terminal JOT[1] to the terminal JOT[s] of each of the circuit UNT[1] to the circuit UNT[4] and the terminal OT[1] to the terminal OT[s] of the circuit UNT[1] are illustrated on the side surfaces of the circuit UNT[1] to the circuit UNT[4]; however the terminals may be actually provided on the bottom surfaces of the circuit UNT[1] and the circuit UNT[3] and on the top surfaces of the circuit UNT[2] and the circuit UNT[4].

Electrical connection between the terminal JOT[k] (not illustrated) of the circuit UNT[1] and the terminal JIT[k] (not illustrated) of the circuit UNT[2], electrical connection between the terminal JOT[k] (not illustrated) of the circuit UNT[2] and the terminal JIT[k] (not illustrated) of the circuit UNT[3], electrical connection between the terminal JOT[k] (not illustrated) of the circuit UNT[3] and the terminal JIT[k] (not illustrated) of the circuit UNT[4], and electrical connection between the terminal JOT[k] (not illustrated) of the circuit UNT[4] and the terminal JIT[k] (not illustrated) of the circuit UNT[1], for example, may be formed by a flip-chip bonding method, a wire bonding method, or Cu—Cu bonding.

Next, a structure example of the arithmetic circuit CDVA in FIG. 19 described in the above embodiment is described. The arithmetic circuit CDVA in FIG. 19 can have a structure illustrated in FIG. 24 using the above-described circuit UNT, for example.

Figure 24:
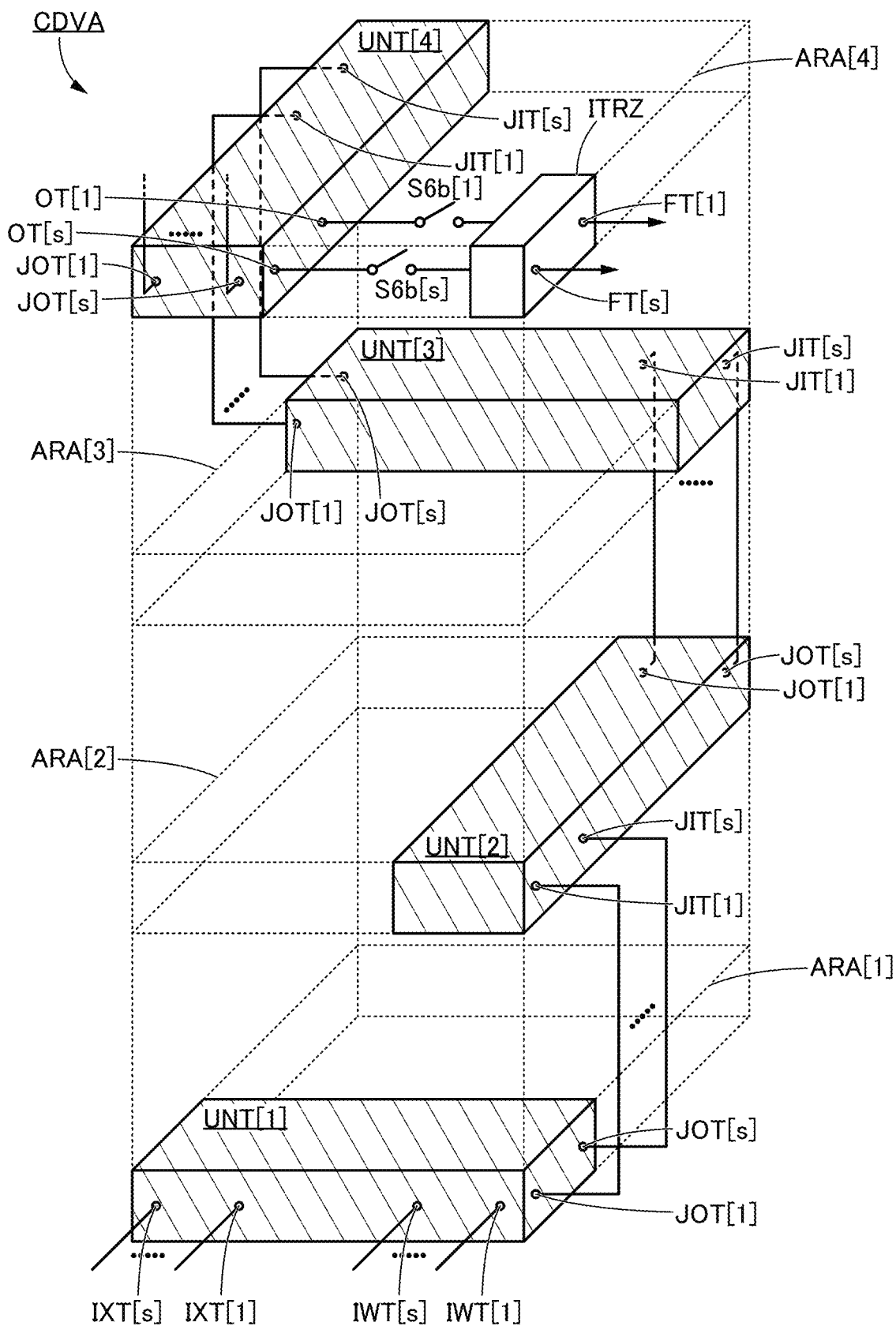
FIG. 24 is a schematic perspective view illustrating a structure example of a semiconductor device.

The arithmetic circuit CDVA illustrated in FIG. 24 has a structure in which the circuit UNT[2] is provided above the circuit UNT[1], the circuit UNT[3] is provided above the circuit UNT[2], and the circuit UNT[4] is provided above the circuit UNT[3]. Specifically, part of the circuit UNT[1] overlaps with part of the circuit UNT[2], part of the circuit UNT[2] overlaps with part of the circuit UNT[3], and part of the circuit UNT[3] overlaps with part of the circuit UNT[4]. When four circuits UNT are stacked, part of the circuit UNT in the lowermost layer overlaps with part of the circuit UNT in the uppermost layer. That is, in the arithmetic circuit CDVA illustrated in FIG. 24, part of the circuit UNT[4] overlaps with part of the circuit UNT[1].

The circuit UNT[2] may be provided over a substrate including the circuit UNT[1]. For example, assuming that a region ARA[1] illustrated in FIG. 24 is provided over the substrate including the circuit UNT[1], the circuit UNT[2] may be provided to overlap with part of the circuit UNT[1] and part of the region ARA[1]. Similarly, the circuit UNT[3] may be provided over a substrate including the circuit UNT[2]. For example, assuming that a region ARA[2] illustrated in FIG. 24 is provided over a substrate including the circuit UNT[2], the circuit UNT[3] may be provided to overlap with part of the circuit UNT[2] and part of the region ARA[2]. Similarly, the circuit UNT[4] may be provided over a substrate including the circuit UNT[3]. For example, assuming that the region ARA[3] illustrated in FIG. 24 is provided over the substrate including the circuit UNT[3], the circuit UNT[4] may be provided to overlap with part of the circuit UNT[3] and part of a region ARA[3].

A region ARA[4] provided over the substrate including the circuit UNT[4] may be positioned over the substrate including the circuit UNT[3] and the region ARA[3].

That is, the arithmetic circuit CDVA illustrated in FIG. 24, has a structure in which the stack of the circuit UNT[1] to the circuit UNT[4] forms a helix.

When the connection structure of the circuit UNT[1] to the circuit UNT[4] is the connection structure illustrated in FIG. 24, the substantial direction in which data flows can be set to one direction in each of the circuit UNT[1] to the circuit UNT[4] as in the arithmetic circuit CDV in FIG. 23, so that the length of lead wirings inside the circuit UNT[1] to the circuit UNT[4] can be shortened. That is, the installation area of the wirings can be reduced.

In the region ARA[1] to the region ARA[4], for example, part of a circuit included in the circuit UNT[1] illustrated in FIG. 2 or part of a circuit included in the circuit UNT[t] illustrated in FIG. 3 may be provided. Note that one or more selected from the switching circuit SWC1, the switching circuit SWC2, the circuit WCS, the circuit XCS, the current generation circuit CM, and the current generation circuit RL can be given as examples of part of the circuits.

FIG. 24 illustrates the terminal JIT[1] to the terminal JIT[s] and the terminal JOT[1] to the terminal JOT[s] included in each of the circuit UNT[1] to the circuit UNT[4]. FIG. 24 also illustrates the terminal IWT[1] to the terminal IWT[s] and the terminal IXT[1] to the terminal IXT[s] included in the circuit UNT[1]. FIG. 24 also illustrates the terminal OT[1] to the terminal OT[s] included in the circuit UNT[4]. FIG. 24 also illustrates the circuit ITRZ provided over a substrate including the circuit UNT[4] and the terminal FT[1] to the terminal FT[s] included in the circuit ITRZ. FIG. 24 selectively illustrates the switch S6b[1] to the switch S6b[s] included in the switching circuit SWC2.

Note that the circuit structure of the circuit UNT[1] illustrated in FIG. 2 is assumed to be applied to the circuit UNT[4] illustrated in FIG. 24. FIG. 24 also illustrates the terminal OT[1] to the terminal OT[s] included in the circuit UNT[4]. Note that the terminal OT[1] to the terminal OT[s] may be provided not only in the circuit UNT[4] but also in the circuit UNT[1] to the circuit UNT[3].

Note that in FIG. 24, to clearly illustrate electrical connection, as in FIG. 23, the terminal JIT[1] to the terminal JIT[s] and the terminal JOT[1] to the terminal JOT[s] of each of the circuit UNT[1] to the circuit UNT[4] and the terminal OT[1] to the terminal OT[s] of the circuit UNT[4] are illustrated on the side surfaces of the circuit UNT[1] to the circuit UNT[4]; actually, the terminals are preferably provided on the bottom surfaces of the circuit UNT[1] and the circuit UNT[3] and the top surfaces of the circuit UNT[2] and the circuit UNT[4]. At this time, electrical connection between the circuit UNT[1] and the circuit UNT[2], electrical connection between the circuit UNT[2] and the circuit UNT[3], and electrical connection between the circuit UNT[3] and the circuit UNT[4] may be formed by, for example, a flip-chip bonding method, a wire bonding method, or Cu—Cu bonding.

While the arithmetic circuit CDVA in FIG. 24 has a structure in which the stack of the circuit UNT[1] to the circuit UNT[4] forms a helix, the number of the circuits UNT that form a helix may be five or more. The number of the circuits UNT included in the arithmetic circuit CDVA in FIG. 24 may be two or three.

By the way, in the arithmetic circuit CDVA in FIG. 24, in the case where the number of circuits UNT included in the stack that forms a helix is large, it becomes difficult to align the circuits UNT positioned in relatively upper layers with the circuits UNT directly therebelow in some cases. Therefore, the allowable gap width (referred to as an allowable margin in some cases) in bonding between the circuits UNT is preferably larger as the circuits UNT to be bonded are in upper layers. Specifically, for example, the contact area of the terminals of the circuits UNT in each of the upper layer and the lower layer is preferably large. For example, the distance between a plurality of terminals of the circuits UNT for electrical connection to the circuits UNT in a lower layer is preferably wide. To increase the contact area of the terminals of the circuits UNT and to increase the distance between the plurality of terminals of the circuits UNT, for example, the circuit density included in the circuits UNT is preferably low. Specifically, for example, the cell density of the arithmetic cell array MACA and the memory cell array MEMA included in the circuits UNT positioned in relatively upper layers is preferably low.

Calculation of a fully connected artificial neural network model may be performed using the arithmetic circuit CDVA illustrated in FIG. 24. In this case, the number of the circuits UNT stacked is the sum of the number of intermediate layers in the artificial neural network and one output layer, for example. For example, when the number of intermediate layers of the artificial neural network is three, the number of the circuits UNT stacked is four.

In a fully connected artificial neural network, the number of neurons included in an intermediate layer close to an input layer tends to increase, and the number of neurons included in an output layer or the intermediate layer close to the output layer tends to decrease. Thus, the circuit UNT that corresponds to the intermediate layer close to the input layer preferably has a high cell density of the arithmetic cell array MACA and the memory cell array MEMA, for example. Meanwhile, the circuit UNT corresponding to the output layer or the intermediate layer close to the output layer may have a low cell density of the arithmetic cell array MACA and the memory cell array MEMA, for example.

As described above, in the case where the number of the circuits UNT stacked in the arithmetic circuit CDVA in FIG. 24 is large, the circuit density in the circuits UNT is preferably lower than the circuits UNT positioned in upper layers. Thus, the circuits UNT corresponding to the intermediate layer close to the input layer is preferably positioned in relatively lower layers of the circuits UNT stacked, whereas the circuits UNT corresponding to the output layer or the intermediate layer close to the output layer are preferably positioned in relatively upper layers of the circuits UNT stacked.

By the way, in the semiconductor device of one embodiment of the present invention, the structure of the arithmetic circuit CDVA is not limited to that in FIG. 24. The semiconductor device of one embodiment of the present invention may have a structure in which the arithmetic circuit CDVA in FIG. 24 is changed as appropriate.

For example, in the arithmetic circuit CDVA in FIG. 24, the circuit UNT[1] to the circuit UNT[4] that are different from the circuit UNT[1] to the circuit UNT[4] illustrated in FIG. 24 may be provided in each of the region ARA[1] to the region ARA[4].

Figure 25:
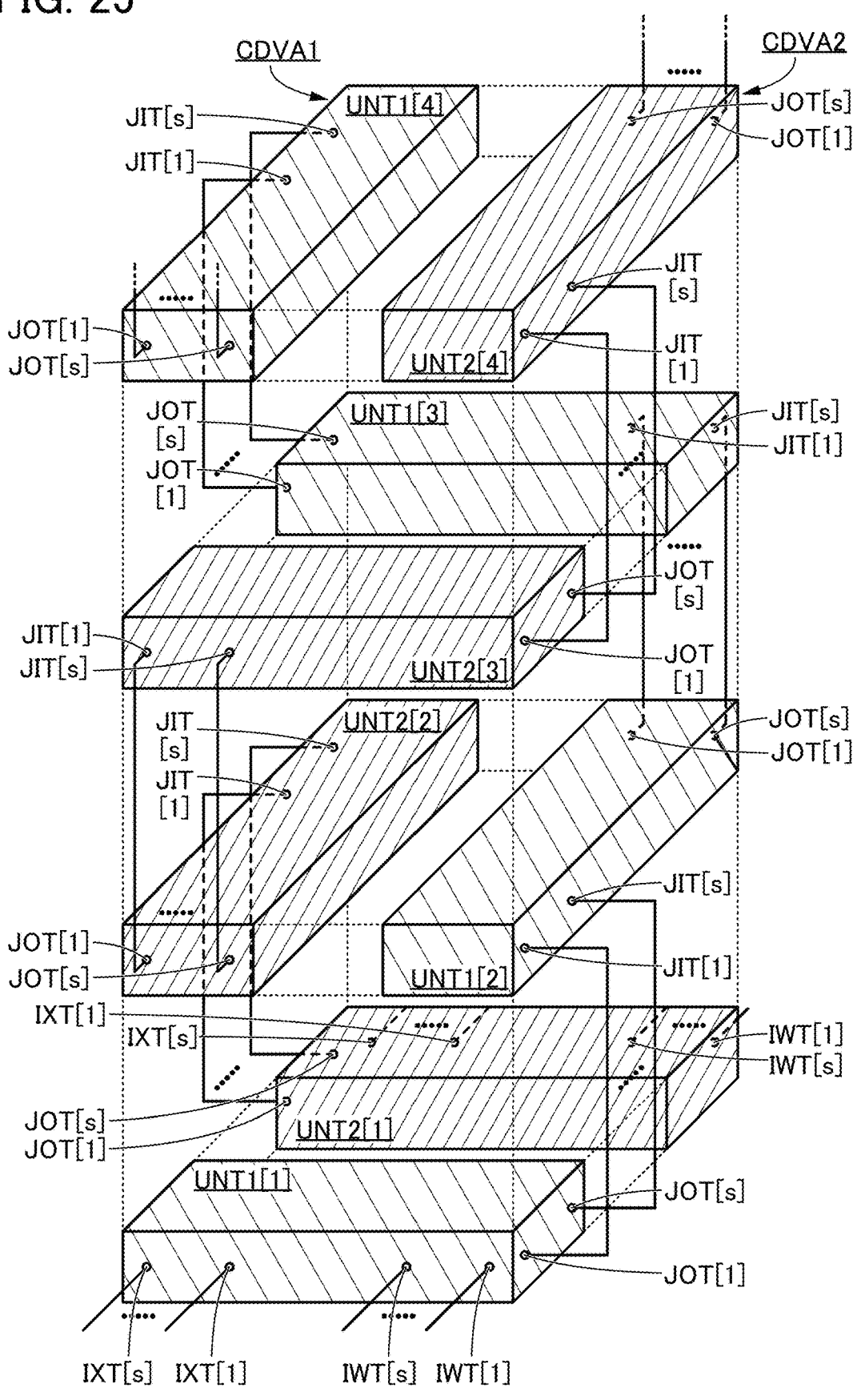
FIG. 25 is a schematic perspective view illustrating a structure example of a semiconductor device.

FIG. 25 illustrates a specific example of the above-described structure. FIG. 25 illustrates a structure of an arithmetic circuit CDVA1, which is similar to that of the arithmetic circuit CDVA illustrated in FIG. 24 and a structure of an arithmetic circuit CDVA2 provided in the region ARA[1] to the region ARA[4].

In FIG. 25, the arithmetic circuit CDVA1 includes a circuit UNT1[1] to a circuit UNT1[4], and the arithmetic circuit CDVA2 includes a circuit UNT2[1] to a circuit UNT2[4]. The circuits UNT illustrated in FIG. 22 can be used for each of the circuit UNT1[1] to the circuit UNT1[4] and the circuit UNT2[1] to the circuit UNT2[4].

Note that in FIG. 25, the circuit UNT1[1] to the circuit UNT1[4] included in the arithmetic circuit CDVA1 are hatched with oblique lines with a wide distance and the circuit UNT2[1] and the circuit UNT2[4] included in the arithmetic circuit CDVA2 are hatched with oblique lines with a short distance.

FIG. 25 illustrates the terminal JIT[1] to the terminal JIT[s] and the terminal JOT[1] to the terminal JOT[s] included in the circuit UNT1[1] to the circuit UNT1[4] and the circuit UNT2[1] to the circuit UNT2[4]. FIG. 25 also illustrates the terminal IWT[1] to the terminal IWT[s] and the terminal IXT[1] to the terminal IXT[s] included in the circuit UNT1[1] and the circuit UNT2[1]. While the circuit ITRZ illustrated in FIG. 24 is not illustrated in FIG. 25, the circuit ITRZ may be provided over a substrate including any of the circuit UNT1[1] to the circuit UNT1[4] (or the circuit UNT2[1] to the circuit UNT2[4]).

The circuit UNT1[1] and the circuit UNT2[1] may be provided over the same substrate or different substrates. Similarly, the circuit UNT1[2] and the circuit UNT2[2] may be provided over the same substrate or different substrates. Similarly, the circuit UNT1[3] and the circuit UNT2[3] may be provided over the same substrate or different substrates. Similarly, the circuit UNT1[4] to the circuit UNT2[4] may be provided over the same substrate or different substrates.

In the arithmetic circuit CDVA1 illustrated in FIG. 25, the stack of the circuit UNT1[1] to the circuit UNT1[4] forms a helix like the circuit UNT1[1] to the circuit UNT1[4] of the arithmetic circuit CDVA illustrated in FIG. 24.

The arithmetic circuit CDVA2 illustrated in FIG. 25 has a structure in which the circuit UNT2[2] is provided above the circuit UNT2[1], the circuit UNT2[3] is provided above the circuit UNT2[2], and the circuit UNT2[4] is provided above the circuit UNT2[3]. Specifically, the circuit UNT2[1] overlaps with part of the circuit UNT2[2], the circuit UNT2[2] overlaps with part of the circuit UNT2[2], and the circuit UNT2[3] overlaps with part of the circuit UNT2[4].

That is, like the arithmetic circuit CDVA1, the arithmetic circuit CDVA2 illustrated in FIG. 25 has a structure in which the stack of the circuit UNT2[1] to the circuit UNT2[4] forms a helix.

Thus, the arithmetic circuit CDVA1 and the arithmetic circuit CDVA2 illustrated in FIG. 25 have a structure in which the stack of the circuit UNT1[1] to the circuit UNT1[4] and the stack of the circuit UNT2[1] to the circuit UNT2[4] form a double-helix.

<Cross-Sectional Structure Example 1>

Figure 26:
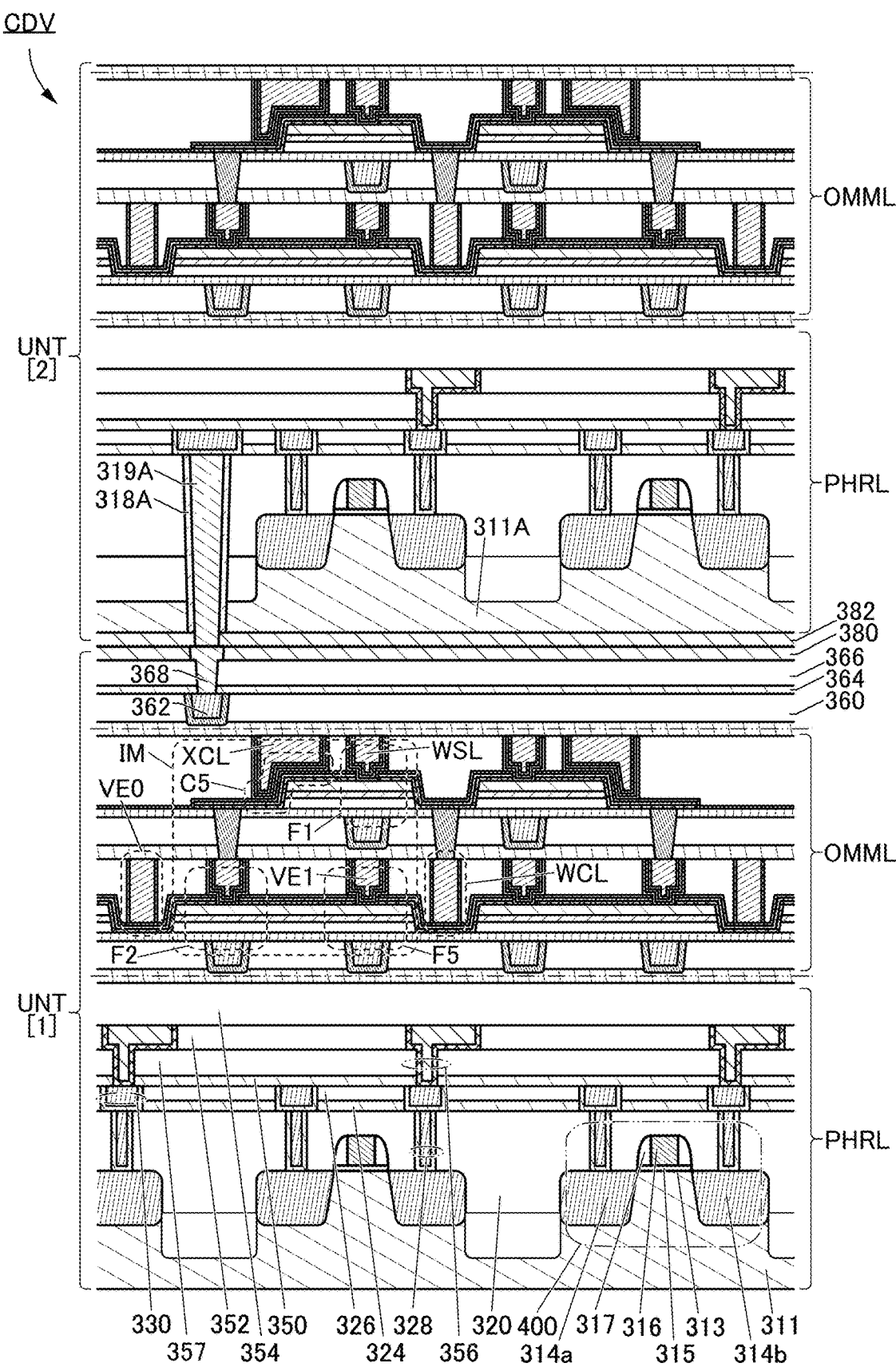
FIG. 26 is a schematic cross-sectional view illustrating a structure example of a semiconductor device.

Next, a specific structure example of the arithmetic circuit CDV illustrated in FIG. 23 and FIG. 24 is described. FIG. 26 is a schematic cross-sectional view of an example of the arithmetic circuit CDV illustrated in FIG. 23 or FIG. 24.

As an example, FIG. 26 illustrates a schematic cross-sectional view of a stacked-layer structure of the circuit UNT[1] and the circuit UNT[2]. As illustrated in FIG. 26, each of the circuit UNT[1] and the circuit UNT[2] includes the layer PHRL and the layer OMML. Note that the arithmetic circuit CDV in FIG. 26 has a structure in which the circuit UNT[1] and the circuit UNT[2] are stacked by Cu—Cu bonding, for example.

First, the circuit UNT[1] is described.

FIG. 26 illustrates a transistor 400 included in the layer PHRL. The transistor 400 is provided on a substrate 311 and includes a conductor 316 functioning as a gate, an insulator 315 and an insulator 317 functioning as gate insulators, a semiconductor region 313 that includes part of the substrate 311, and a low-resistance region 314a and a low-resistance region 314b functioning as a source region and a drain region. The transistor 400 may be a p-channel transistor or an n-channel transistor. As the substrate 311, a single crystal silicon substrate can be used, for example.

In the transistor 400 illustrated in FIG. 26, the semiconductor region 313 (part of the substrate 311) in which a channel is formed has a protruding shape. Furthermore, the conductor 316 is provided to cover the side and top surfaces of the semiconductor region 313 with the insulator 315 therebetween. Note that the conductor 316 may be formed using a material for adjusting the work function. Such a transistor 400 is also referred to as a FIN-type transistor because it utilizes a protruding portion of a semiconductor substrate. An insulator functioning as a mask for forming the protruding portion may be provided in contact with an upper portion of the protruding portion. Although the case where the protruding portion is formed by processing part of the semiconductor substrate is described here, a semiconductor film having a protruding shape may be formed by processing an SOI substrate.

Note that the transistor 400 illustrated in FIG. 26 is just an example and is not limited to the structure illustrated therein; an appropriate transistor may be used in accordance with a circuit structure or a driving method.

Wiring layers including an interlayer film, a wiring, a plug, and the like may be provided between the structure bodies. A plurality of wiring layers can be provided in accordance with the design. Furthermore, in this specification and the like, a wiring and a plug electrically connected to the wiring may be a single component. That is, part of a conductor functions as a wiring in some cases and part of the conductor functions as a plug in other cases.

For example, an insulator 320, an insulator 324, and an insulator 326 are stacked over the transistor 400 in this order as interlayer films. A conductor 328 or the like is embedded in the insulator 320. A conductor 330 or the like is embedded in the insulator 324 and the insulator 326. Note that the conductor 328 and the conductor 330 function as contact plugs or wirings.

The insulator functioning as an interlayer film may function as a planarization film that covers an uneven shape thereunder. For example, the top surface of the insulator 320 may be planarized by planarization treatment using a chemical mechanical polishing (CMP) method to improve planarity.

A wiring layer may be provided over the insulator 326 and the conductor 330. For example, in FIG. 26, an insulator 350, an insulator 357, an insulator 352, and an insulator 354 are stacked in this order over the insulator 326 and the conductor 330. A conductor 356 is formed in the insulator 350, the insulator 357, and the insulator 352. The conductor 356 functions as a contact plug or a wiring.

The insulator 354 is provided over the insulator 352 and the conductor 356. In the insulator 354, a contact plug or a wiring for electrical connection to an upper circuit (e.g., a circuit included in the layer OMML) may be embedded.

FIG. 26 illustrates the cell IM of the arithmetic cell array MACA included in the layer OMML. Specifically, FIG. 26 illustrates the transistor F1, the transistor F2, the transistor F5, and the capacitor C5 included in the cell IM. Note that the cell IM can be any one of the cell IM[1, 1] to the cell IM[s, s] and the cell IM[1, 1] to the cell IM[s, s] described in the above embodiment.

Note that although not illustrated in FIG. 26, the layer OMML includes the memory cell array MEMA, the circuit WSD, the circuit WWD, and the circuit RWD as illustrated in FIG. 22B.

In the layer OMML of the arithmetic circuit CDV illustrated in FIG. 26, the transistor F1 and the capacitor C5 are positioned above the transistor F2 and the transistor F5.

In the layer OMML illustrated in FIG. 26, the transistor F2 and the transistor F5 are provided to share one island-shaped semiconductor layer. Specifically, a gate insulating film and a gate electrode of the transistor F8 are formed in one of two regions of the one island-shaped semiconductor layer, and a gate insulating film and a gate electrode of the transistor F5 are formed in the other of the two regions of the one island-shaped semiconductor layer.

In the layer OMML in FIG. 26, a transistor that includes a back gate is used as each of the transistor F2 and the transistor F5. Specifically, the back gate of the transistor F2 is positioned in a region overlapping with the gate insulating film and the gate electrode of the transistor F2 that are below the above-described one island-shaped semiconductor layer, and the back gate of the transistor F5 is positioned in a region overlapping with the gate insulating film and the gate electrode of the transistor F5 that are below the above-described one island-shaped semiconductor layer.

A conductor corresponding to the wiring VE0 is electrically connected to one of a source electrode and a drain electrode of the transistor F2. A conductor corresponding to the wiring WLC is electrically connected to one of a source electrode and a drain electrode of the transistor F5. Note that the wiring WCL can be any one of the wiring WCL[1] to the wiring WCL[s] and the wiring WCL[1] to the wiring WCL[s] described in the above embodiment. The wiring VE0 and the wiring WLC extend in the channel width direction of the transistor F2 or the transistor F5, for example.

A conductor as the gate electrode of the transistor F5 extends in the channel width direction. This conductor corresponds to the wiring VE1.

An insulator serving as an interlayer film is formed between the transistor F1 and each of the transistor F2 and the transistor F5. The insulator includes an opening portion in each of a region overlapping with the gate electrode of the transistor F2 and a region overlapping with the wiring WCL, and conductors are embedded in the opening portions. One conductor is electrically connected to one of a source electrode and a drain electrode of the transistor F1, and the other conductor is electrically connected to the other of the source electrode and the drain electrode of the transistor F1.

As already described above, the transistor F1 is positioned above the transistor F2 and the transistor F5. A dielectric of the capacitor C5 is formed to cover an end portion of an island-shaped semiconductor layer of the transistor F1, and a conductor corresponding to the second terminal of the capacitor C5 is formed over the dielectric. The conductor corresponds to the wiring XCL. Note that the wiring XCL can be any one of the wiring XCL[1] to the wiring XCL[s] described in the above embodiment.

In a region of the island-shaped semiconductor layer of the transistor F1, a gate insulating film and a gate electrode of the transistor F1 are formed. Specifically, a conductor as the gate electrode of the transistor F1 extends in the channel width direction. This conductor corresponds to the wiring WSL. Note that the wiring WSL can be any one of the wiring WSL[1] to the wiring WSL[s] described in the above embodiment.

The transistor F1 is a transistor that includes a back gate like the transistor F2 and the transistor F5. Specifically, the back gate of the transistor F1 is positioned in a region overlapping with the gate insulating film and the gate electrode of the transistor F1 that are below the island-shaped semiconductor layer.

As described above, in each of the transistor F1, the transistor F2, and the transistor F5, the gate and the back gate are positioned to interpose a channel formation region of the semiconductor. The gate and the back gate are each formed using a conductor. The back gate can function in a manner similar to that of the gate. In addition, by changing the potential of the back gate, the threshold voltage of the transistor can be changed. The potential of the back gate may be the same as the potential of the gate or may be a ground potential or a given potential.

Each of the gate and the back gate is formed using a conductor and thus has a function of preventing an electric field generated in the outside of the transistor from influencing the semiconductor in which the channel is formed (particularly, a function of blocking static electricity). That is, a variation in the electrical characteristics of the transistor due to the influence of an external electric field such as static electricity can be prevented. By providing the back gate, the amount of change in threshold voltage of the transistor before and after a bias-temperature stress test (which is sometimes referred to as BT test) can be reduced.

For example, when a transistor including a back gate is used as the transistor F1, the transistor F1 is less affected by an external electric field and can be stably maintained in the off state. As a result, data written to the first terminal of the capacitor C5 can be stably retained. Providing the back gate can make the operation of the cell IM stable and increase the reliability of the layer OMML that includes the cell IM.

For each of the semiconductor layers in which the channels of the transistor F1, the transistor F2, and the transistor F5 are formed, one or a combination of a single crystal semiconductor, a polycrystalline semiconductor, a microcrystalline semiconductor, an amorphous semiconductor, and the like can be used. As a semiconductor material, for example, silicon, germanium, or the like can be used as described in Embodiment 1. For another example, a compound semiconductor such as silicon germanium, silicon carbide, gallium arsenide, an oxide semiconductor, or a nitride semiconductor may be used.

Each of the transistor F1, the transistor F2, and the transistor F5 is preferably a transistor using an oxide semiconductor, which is a kind of metal oxide, in a semiconductor layer where a channel is formed (such a transistor is also referred to as an OS transistor). An oxide semiconductor has a band gap greater than or equal to 2 eV and thus enables an extremely low off-state current. Thus, power consumption of the cell MC can be reduced. Accordingly, power consumption of the arithmetic circuit CDV that includes the cell MC can be reduced.

A memory cell including an OS transistor can be referred to as an "OS memory". The arithmetic circuit CDV that includes the memory cell can also be referred to as an "OS memory".

In addition, the OS transistor operates stably even in a high-temperature environment and has small fluctuation in characteristics. For example, the off-state current hardly increases even in a high-temperature environment. Specifically, the off-state current hardly increases even at an environment temperature higher than or equal to room temperature and lower than or equal to 200° C. In addition, the on-state current is less likely to decrease even in a high-temperature environment. Thus, the OS memory can operate stably and have high reliability even in a high-temperature environment.

An insulator 360 is formed above the transistor F1.

As the insulator 360, an insulating film having a barrier property that prevents diffusion of impurities such as hydrogen, oxygen, and water (referred to as a barrier insulating film) is preferably used. Accordingly, for the insulator 360, it is preferable to use an insulating material that has a function of inhibiting diffusion of impurities such as a hydrogen atom, a hydrogen molecule, and a water molecule (through which the above impurities are less likely to pass). Furthermore, depending on the situation, for the insulator 360, it is preferable to use an insulating material that has a function of inhibiting diffusion of impurities such as a nitrogen atom, a nitrogen molecule, a nitrogen oxide molecule (e.g., $N_2O$, NO, and $NO_2$), and a copper atom (through which the above oxygen is less likely to pass). In addition, it is preferable that the insulator 360 have a function of inhibiting diffusion of oxygen (e.g., one or both of an oxygen atom and an oxygen molecule).

For the film having a barrier property against hydrogen, silicon nitride deposited by a CVD (Chemical Vapor Deposition) method can be used, for example.

An opening portion is formed in part of a region of the insulator 360, and the conductor 362 is provided to fill the opening portion. Note that the conductor 362 functions as a wiring extended inside the circuit UNT[1].

As a material of the conductor 362, for example, a single layer or a stacked layer of one or more conductive materials selected from a metal material, an alloy material, a metal nitride material, and a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used for formation. The use of a low-resistance conductive material can reduce wiring resistance.

An insulator 364 and an insulator 366 are formed in this order over the insulator 360 and the conductor 362.

Note that like the insulator 360, the insulator 364 is preferably formed using an insulator having a barrier property against one or more selected from hydrogen, oxygen, and water. The insulator 364 has functions of an interlayer insulating film and a planarization film.

The insulator 366 is preferably formed using an insulator having a relatively low dielectric constant to reduce parasitic capacitance generated between wirings. Furthermore, the insulator 366 preferably includes an insulator having a barrier property against one or more selected from hydrogen, oxygen, and water.

An opening portion is formed in regions of the insulator 364 and the insulator 366 which overlap with part of conductor 362, and the conductor 368 is provided to fill the opening portion. The conductor 368 is also formed over the insulator 366. After that, the conductor 368 is patterned into a form of a wiring, a terminal, or a pad through an etching step or the like.

For the conductor 368, for example, copper, aluminum, tin, zinc, tungsten, silver, platinum, or gold can be used. The conductor 368 preferably contains the same component as the material used for a later-described conductor 319A.

Then, an insulator 380 is deposited to cover the insulator 366 and the conductor 368 and is subsequently subjected to, for example, planarization treatment by a CMP method until the conductor 368 is exposed. In this manner, the conductor 368 serving as a wiring, a terminal, or a pad can be formed in the circuit UNT[1]

Next, the circuit UNT[2] is described.

The structure of the circuit UNT[2] is substantially the same as that of the circuit UNT[1], and the layer PHRL and the layer OMML are sequentially formed over the substrate 311A in the circuit UNT[2].

Note that as the substrate 311A, a semiconductor substrate usable as the substrate 311 can be used, for example.

The insulator 382 is formed on a surface of the substrate 311A opposite to a surface where the transistor 400 is formed. For the insulator 382, a material usable for the insulator 380 can be used.

In addition, an opening portion is formed in a region overlapping with the conductor 368 in the insulator 320 provided in the layer PHRL of the circuit UNT[2], an insulator 318A is formed on the side surface of the opening portion, and a conductor 319A is formed in the remaining part of the opening portion. In particular, the conductor 319A is sometimes referred to as a TSV (Through Silicon Via).

For the conductor 319A, a material usable for the conductor 368 can be used, as described above. The insulator 318A has a function of insulating the conductor 319A from the substrate 311A, for example. Note that for the insulator 318A, for example, any of the materials usable for the insulator 320 or the insulator 324 is preferably used.

The insulator 380 and the conductor 368 serve as bonding layers for the substrate 311 side, and the insulator 382 and the conductor 319A serve as bonding layers for the substrate 311A side. That is, the insulator 380 and the conductor 368 that are formed over the substrate 311 can be bonded to the insulator 382 and the conductor 319A that are formed on the substrate 311A in a bonding step, for example.

Before the bonding step, for example, planarization treatment is performed to make the surfaces of the insulator 380 and the conductor 368 level with each other on the substrate the circuit UNT[1] side. In a similar manner, planarization treatment is performed to make the surfaces of the insulator 382 and the conductor 319A level with each other on the circuit UNT[2] side.

In the bonding step, for bonding of the insulator 380 and the insulator 382, i.e., bonding of insulating layers, hydrophilic bonding or the like can be employed in which, after high planarity is obtained by polishing (e.g., a CMP method), the surfaces are subjected to hydrophilicity treatment with oxygen plasma or the like, arranged in contact with and bonded to each other temporarily, and then dehydrated by heat treatment to perform final bonding. The hydrophilic bonding method can also cause bonding at an atomic level; thus, mechanically excellent bonding can be obtained.

When bonding of the conductor 368 and the conductor 319A, i.e., bonding of the conductors, is performed, a surface activated bonding method can be employed in which an oxide film, a layer adsorbing impurities, and the like on the surface are removed by sputtering treatment or the like and the cleaned and activated surfaces are brought into contact to be bonded to each other. Alternatively, a diffusion bonding method in which surfaces are bonded to each other by using temperature and pressure together, or the like can be used. Both methods cause bonding at an atomic level; thus, not only electrically but also mechanically excellent bonding can be obtained.

Through the above-described bonding step, the conductor 368 on the circuit UNT[1] side can be electrically connected to the conductor 319A on the circuit UNT[2] side. Moreover, a mechanically strong connection can be obtained between the insulator 380 on the circuit UNT[1] side and the insulator 382 on the circuit UNT[2] side.

When the circuit UNT[1] and the circuit UNT[2] are bonded together, the insulating layers and the metal layers coexist on their bonding surfaces; therefore, the surface activated bonding method and the hydrophilic bonding method are performed in combination, for example. For example, it is possible to use a method in which the surfaces are made clean after polishing, the surfaces of the metal layers are subjected to anti-oxidation treatment and then hydrophilicity treatment, and bonding is performed. Alternatively, hydrophilicity treatment may be performed with the metal layers having surfaces of a hardly oxidizable metal such as gold.

Note that a bonding method other than the above-described methods may be used in the bonding of the circuit UNT[1] and the circuit UNT[2]. For example, as the bonding method of the circuit UNT[1] and the circuit UNT[2], flip-chip bonding may be employed. In the case of employing a flip-chip bonding method, a connection terminal such as a bump may be provided above the conductor 368 on the circuit UNT[1] side or provided below the conductor 319A on the circuit UNT[2] side. Flip-chip bonding can be performed by, for example, injecting a resin containing anisotropic conductive particles between the insulator 380 and the insulator 382 and between the conductor 368 and the conductor 319A, or by using a Sn—Ag solder. Alternatively, an ultrasonic wave bonding method can be employed in the case where the bump and a conductor connected to the bump are gold. To reduce thermal stress or physical stress such as an impact, the above-described flip-chip bonding method may be combined with injection of an underfill agent between the insulator 380 and the insulator 382 and between the conductor 368 and the conductor 319A. Alternatively, for example, a die bonding film may be used in bonding of the circuit UNT[1] and the circuit UNT[2].

<Cross-Sectional Structure Example 2>

Figure 27:
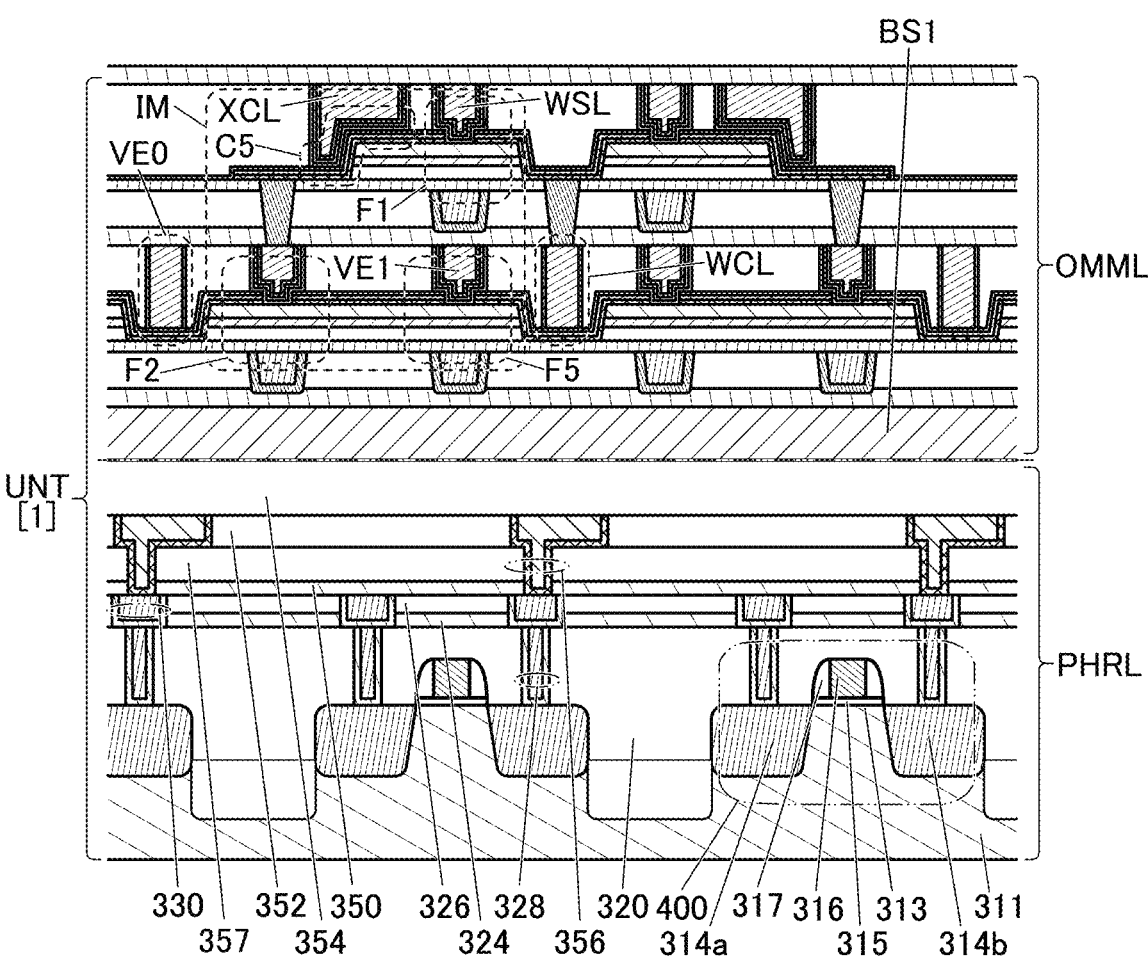
FIG. 27 is a schematic cross-sectional view illustrating a structure example of a semiconductor device.

FIG. 27 is a schematic cross-sectional view of an example of the arithmetic circuit CDV illustrated in FIG. 23 and FIG. 24, which is different from that in FIG. 26.

The arithmetic circuit CDV in FIG. 27 is different from the arithmetic circuit CDV in FIG. 26 in that a substrate is included between the layer PHRL and the layer OMML.

The layer OMML of the arithmetic circuit CDV in FIG. 27 includes a substrate BS1. The transistor F1, the transistor F2, the transistor F5, and the capacitor C5 are formed over the substrate BS1. The structure of the cell IM formed over the substrate BS1 is the same as that of the cell MC of the arithmetic circuit CDV in FIG. 26; however, the structure of the cell MC in FIG. 27 may be changed depending on circumstances.

That is, in the arithmetic circuit CDV in FIG. 27, the substrate BS1 included in the layer OMML is mounted on the substrate 311 over which the circuit XCS, the circuit WCS, the current generation circuit CM, and the current generation circuit RL are formed.

As the substrate BS1, a substrate that can be applied to the substrate (e.g., the substrate 311) included in the layer PHRL can be used. For example, when a semiconductor substrate containing silicon as a material is used as the substrate BS1, the transistor F1, the transistor F2, and the transistor F5 can be Si transistors.

As a method for mounting the substrate BS1 over the substrate 311, a flip-chip bonding method or a wire bonding method can be used as described above. A bonding layer may be provided between the substrates to be bonded, and one or both of a surface activated bonding method and a hydrophilic bonding method may be used.

Note that the circuit UNT of the semiconductor device of one embodiment of the present invention is not limited to the structures illustrated in FIG. 22A, FIG. 22B, FIG. 26, and FIG. 27. Structures in FIG. 22A, FIG. 22B, FIG. 26, and FIG. 27 may be modified as appropriate to be used for the semiconductor device of one embodiment of the present invention.

Figure 28:
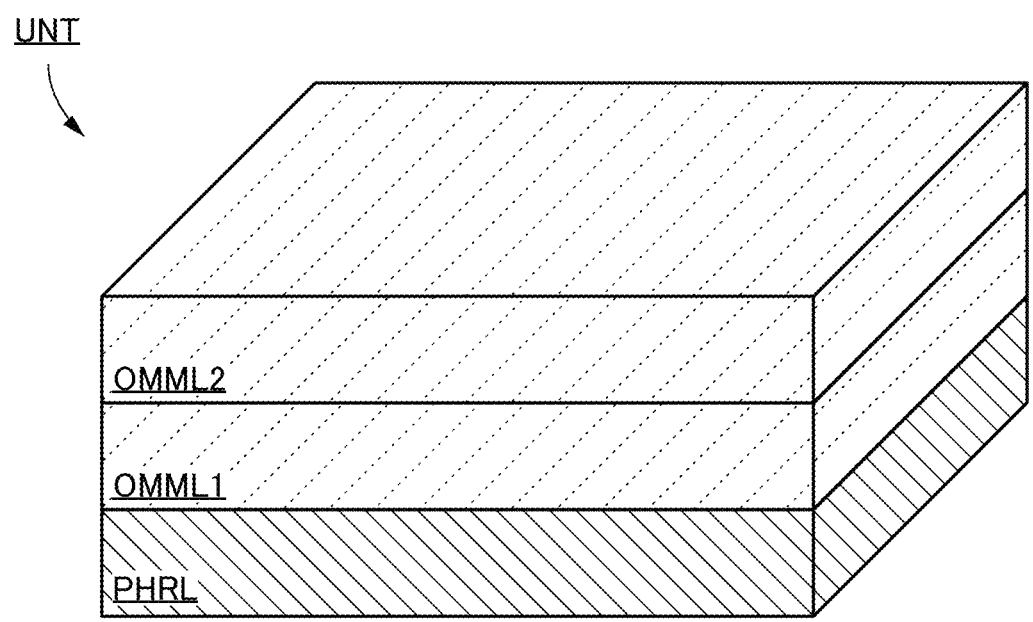
FIG. 28 is a schematic perspective view illustrating a structure example of a semiconductor device.

FIG. 28 illustrates a modification example of the circuit UNT illustrated in FIG. 22A. The arithmetic circuit CDV illustrated in FIG. 28 is different from the circuit UNT in FIG. 22A in that a layer OMML1 and a layer OMML2 are included instead of the layer OMML. That is, the circuit UNT in FIG. 28 includes the layer PHRL, the layer OMML1, and the layer OMML2.

Figure 29:
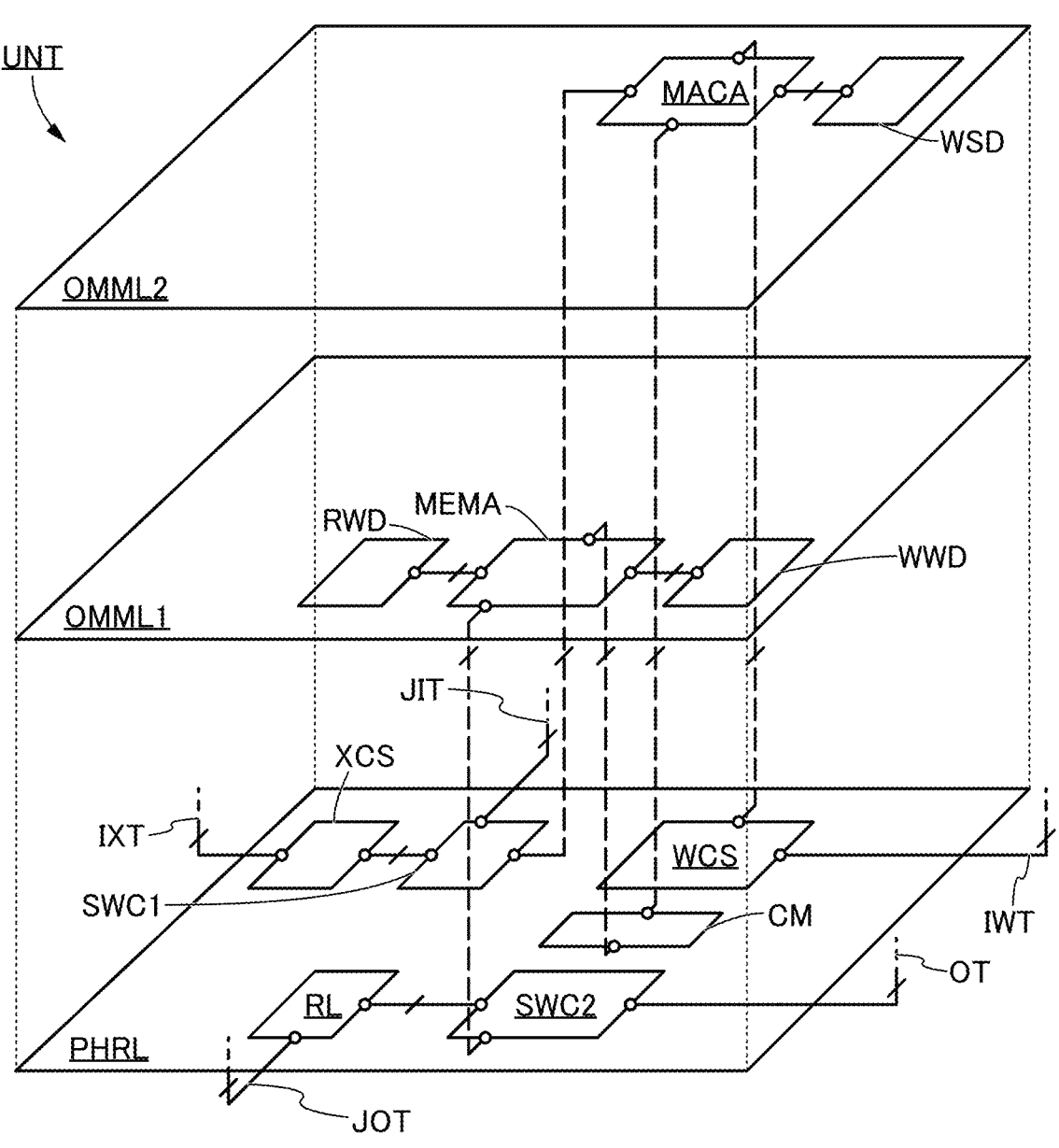
FIG. 29 is a block diagram illustrating a structure example of a semiconductor device.

FIG. 29 is a block diagram illustrating structure examples of the layer PHRL, the layer OMML1, and the layer OMML2 illustrated in FIG. 28.

In FIG. 29, the layer PHRL includes, for example, the circuit WCS, the circuit XCS, the current generation circuit CM, the current generation circuit RL, the switching circuit SWC1, and the switching circuit SWC2 illustrated in FIG. 2 like the layer PHRL illustrated in FIG. 22B. The layer OMML1 includes, for example, the memory cell array MEMA, the circuit WWD, and the circuit RWD illustrated in FIG. 2. The layer OMML includes, for example, the arithmetic cell array MACA and the circuit WSD.

As described above, in the circuit UNT, the two layers OMML can be provided above the layer PHRL. Note that the total number of the layers OMML provided over the layer PHRL may be three or more.

Figure 30:
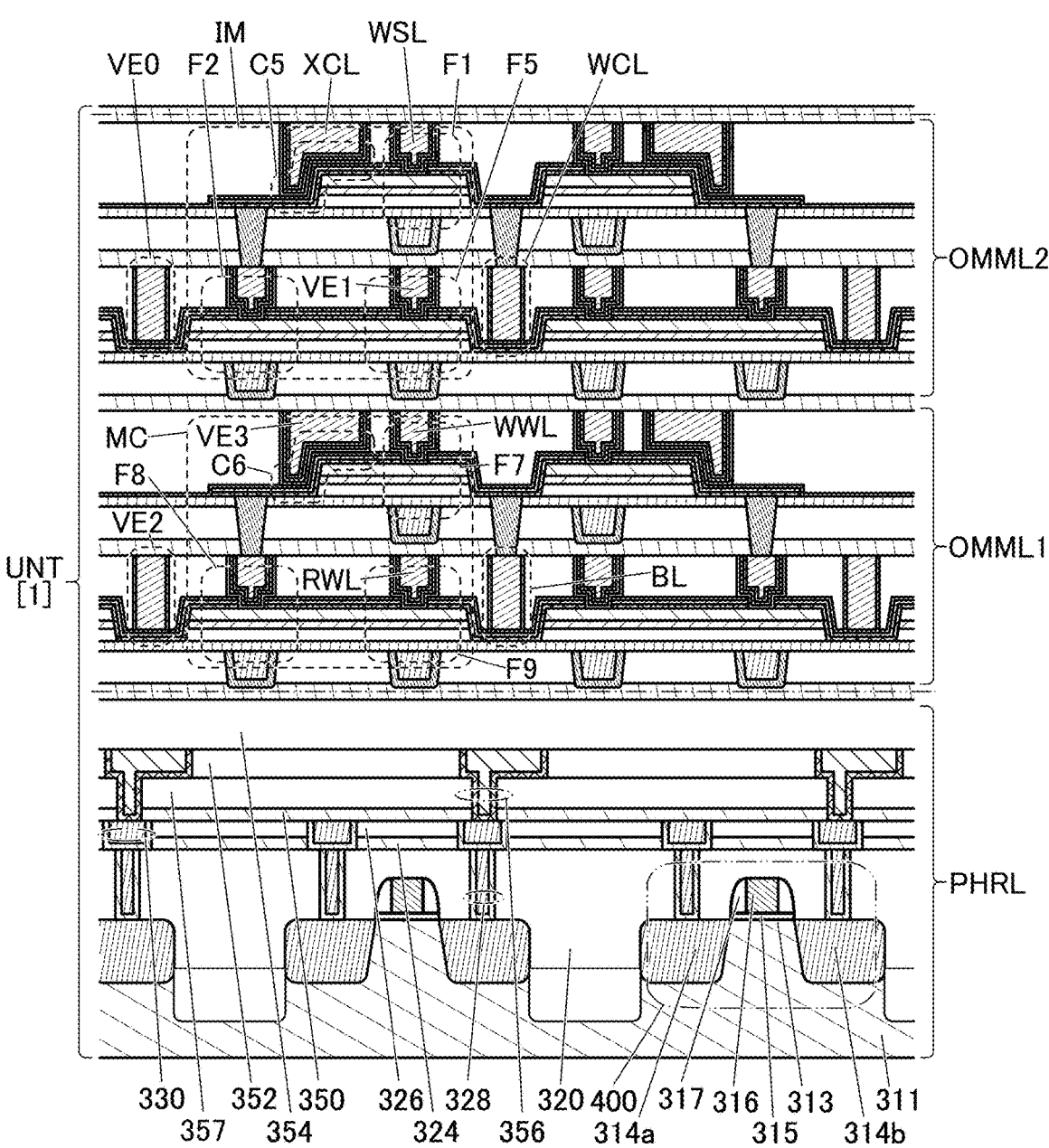
FIG. 30 is a schematic cross-sectional view illustrating a structure example of a semiconductor device.

FIG. 30 illustrates a schematic cross-sectional view of the circuit UNT illustrated in FIG. 29, as an example. The circuit UNT illustrated in FIG. 30 has a structure in which the layer PHRL, the layer OMML1, and the layer OMML2 are stacked.

For the layer PHRL and the layer OMML2, the description of the layer PHRL and the layer OMML of the circuit UNT[1] illustrated in FIG. 26 is referred to.

In FIG. 30, the layer OMML1 includes the memory cell array MEMA as described above. Specifically, FIG. 30 illustrates the transistor F7, the transistor F8, the transistor F9, and the capacitor C6 included in the cell MC. Note that the cell MC can be any one of the cell MC[1, 1] to the cell MC[s, s] described in the above embodiment.

As illustrated in FIG. 30, the structure of the cell MC included in the layer OMML1 can be the same as that of the cell IM included in the layer OMML illustrated in FIG. 26. Thus, the above description of the cell IM included in the layer OMML1 illustrated in FIG. 26 is to be referred to for the structure of the cell MC included in the layer OMML in FIG. 30. The description of the cell IM included in the layer OMML in FIG. 30 is made when, in the description of the cell MC included in the layer OMML1 in FIG. 26, the transistor F1 is replaced with the transistor F7, the transistor F2 is replaced with the transistor F8, the transistor F5 is replaced with the transistor F9, the capacitor C5 is replaced with the capacitor C6, the wiring WCL is replaced with a wiring BL, the wiring VE0 is replaced with a wiring VE2, the wiring VE1 is replaced with a wiring RWL, the wiring XCL is replaced with a wiring VE3, and the wiring WSL is replaced with a wiring WWL.

Note that the wiring WCL can be any one of the wiring WCL[1] to the wiring WCL[s] described in the above embodiment. The wiring WSL can be any one of the wiring WSL[1] to the wiring WSL[s] described in the above embodiment. The wiring XCL can be any one of the wiring XCL[1] to the wiring XCL[s] described in the above embodiment.

Note that this embodiment can be combined with any of the other embodiments described in this specification as appropriate. For example, the configurations, structures, methods, and the like described in this embodiment can be used in combination with the configurations, structures, methods, and the like described in the other embodiments and the like as appropriate.

Embodiment 3

In this embodiment, a transistor whose channel formation region includes an oxide semiconductor (OS transistor) is described. In the description of the OS transistor, comparison with a transistor whose channel formation region includes silicon (also referred to as Si transistor) is also described briefly.

[OS Transistor]

An oxide semiconductor having a low carrier concentration is preferably used for the OS transistor. For example, the carrier concentration in a channel formation region of an oxide semiconductor is lower than or equal to $1\times10^{18}$ cm$^{-3}$, preferably lower than $1\times10^{17}$ cm$^{-3}$, further preferably lower than $1\times10^{16}$ cm$^{-3}$, still further preferably lower than $1\times10^{13}$ cm$^{-3}$, yet still further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases. Charge trapped by the trap states in the oxide semiconductor takes a long time to disappear and might behave like fixed charge. A transistor whose channel formation region is formed in an oxide semiconductor having a high density of trap states has unstable electrical characteristics in some cases.

Accordingly, in order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. As examples of the impurity, hydrogen, nitrogen, and the like are given. Note that an impurity in an oxide semiconductor refers to, for example, elements other than the main components of the oxide semiconductor. For example, an element with a concentration lower than 0.1 atomic % is regarded as an impurity.

When impurities and oxygen vacancies are in a channel formation region of an oxide semiconductor in an OS transistor, electrical characteristics of the OS transistor easily vary and the reliability thereof might worsen. In the OS transistor, a defect that is an oxygen vacancy in the oxide semiconductor into which hydrogen enters (hereinafter sometimes referred to as $V_OH$) may be formed and may generate an electron serving as a carrier. When $V_OH$ is formed in the channel formation region, the donor concentration in the channel formation region increases in some cases. As the donor concentration in the channel formation region increases, the threshold voltage might vary. Accordingly, when the channel formation region in the oxide semiconductor includes oxygen vacancies, the transistor tends to have normally-on characteristics (a state where a channel exists and a current flows through the transistor even when the gate-source voltage is 0 V). Therefore, the impurities, oxygen vacancies, and $V_OH$ are preferably reduced as much as possible in the channel formation region in the oxide semiconductor.

The band gap of the oxide semiconductor is preferably larger than the band gap of silicon (typically 1.1 eV), further preferably larger than or equal to 2 eV, still further preferably larger than or equal to 2.5 eV, yet still further preferably larger than or equal to 3.0 eV. With use of an oxide semiconductor having a larger band gap than silicon, the off-state current (also referred to as Ioff) of the transistor can be reduced.

In a Si transistor, a short-channel effect (also referred to as SCE) appears as miniaturization of the transistor proceeds. Thus, it is difficult to miniaturize the Si transistor. One factor that causes the short-channel effect is a small band gap of silicon. By contrast, the OS transistor includes an oxide semiconductor that is a semiconductor material having a wide band gap, and thus can suppress the short-channel effect. In other words, a short-channel effect does not appear or hardly appears in an OS transistor.

The short-channel effect refers to degradation of electrical characteristics which becomes obvious along with miniaturization of a transistor (a decrease in channel length). Specific examples of the short-channel effect include a decrease in threshold voltage, an increase in subthreshold swing value (sometimes referred to as S value), and an increase in leakage current. Here, the S value means the amount of change in gate voltage in the subthreshold region when the drain voltage keeps constant and the drain current changes by one order of magnitude.

The characteristic length is widely used as an indicator of resistance to a short-channel effect. The characteristic length is an indicator of curving of potential in a channel formation region. When the characteristic length is shorter, the potential rises more sharply, which means that the resistance to a short-channel effect is high.

The OS transistor is an accumulation-type transistor and the Si transistor is an inversion-type transistor. Accordingly, an OS transistor has a shorter characteristic length between a source region and a channel formation region and a shorter characteristic length between a drain region and the channel formation region than a Si transistor. Therefore, an OS transistor has higher resistance to a short-channel effect than a Si transistor. That is, in the case where a transistor with a short channel length is to be manufactured, an OS transistor is more suitable than a Si transistor.

Even in the case where the carrier concentration in the oxide semiconductor is reduced until the channel formation region becomes an i-type or substantially i-type region, the conduction band minimum of the channel formation region in a short-channel transistor decreases because of the Conduction-Band-Lowering (CBL) effect; thus, the energy difference between the conduction band minimum of the source region or the drain region and that of the channel formation region might decrease to greater than or equal to 0.1 eV and less than or equal to 0.2 eV. Accordingly, the OS transistor can be regarded as having an n$^+$/n$^-$/n$^+$ accumulation-type junction-less transistor structure or an n$^+$/n$^-$/n$^+$ accumulation-type non-junction transistor structure in which the channel formation region becomes an n"-type region and the source and drain regions become n$^+$-type regions in the OS transistor.

An OS transistor having the above structure enables a semiconductor device to have favorable electrical characteristics even when the semiconductor device is miniaturized or highly integrated. For example, the semiconductor device can have favorable electrical characteristics even when the OS transistor has a gate length less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. In contrast, it is sometimes difficult for a Si transistor to have a gate length less than or equal to 20 nm or less than or equal to 15 nm because of appearance of a short-channel effect. Therefore, an OS transistor can be suitably used as a transistor having a short channel length as compared with a Si transistor. Note that the gate length refers to the length of a gate electrode in a direction in which carriers move inside a channel formation region during an operation of the transistor and to the width of a bottom surface of the gate electrode in a plan view of the transistor.

Miniaturization of an OS transistor can improve the high frequency characteristics of the transistor. Specifically, the cutoff frequency of the transistor can be improved. When the gate length of the OS transistor is within the above range, the cutoff frequency of the transistor can be greater than or equal to 50 GHz, preferably greater than or equal to 100 GHz, further preferably greater than or equal to 150 GHz at room temperature, for example.

As described above, an OS transistor has an effect superior to that of a Si transistor, such as a low off-state current and capability of having a short channel length.

Note that this embodiment can be combined with any of the other embodiments in this specification as appropriate. For example, the configurations, structures, methods, and the like described in this embodiment can be used in an appropriate combination with any of the configurations, structures, methods, and the like described in the other embodiments and the like.

Embodiment 4

In this embodiment, electronic components, electronic devices, a large computer, space equipment, and a data center (also referred to as DC) in which the semiconductor device described in the above embodiment can be used will be described. Electronic components, electronic devices, a large computer, space equipment, and a data center in which the semiconductor device of one embodiment of the present invention is used are effective in improving performance, e.g., reducing power consumption.

[Electronic Component]

Figure 31A:
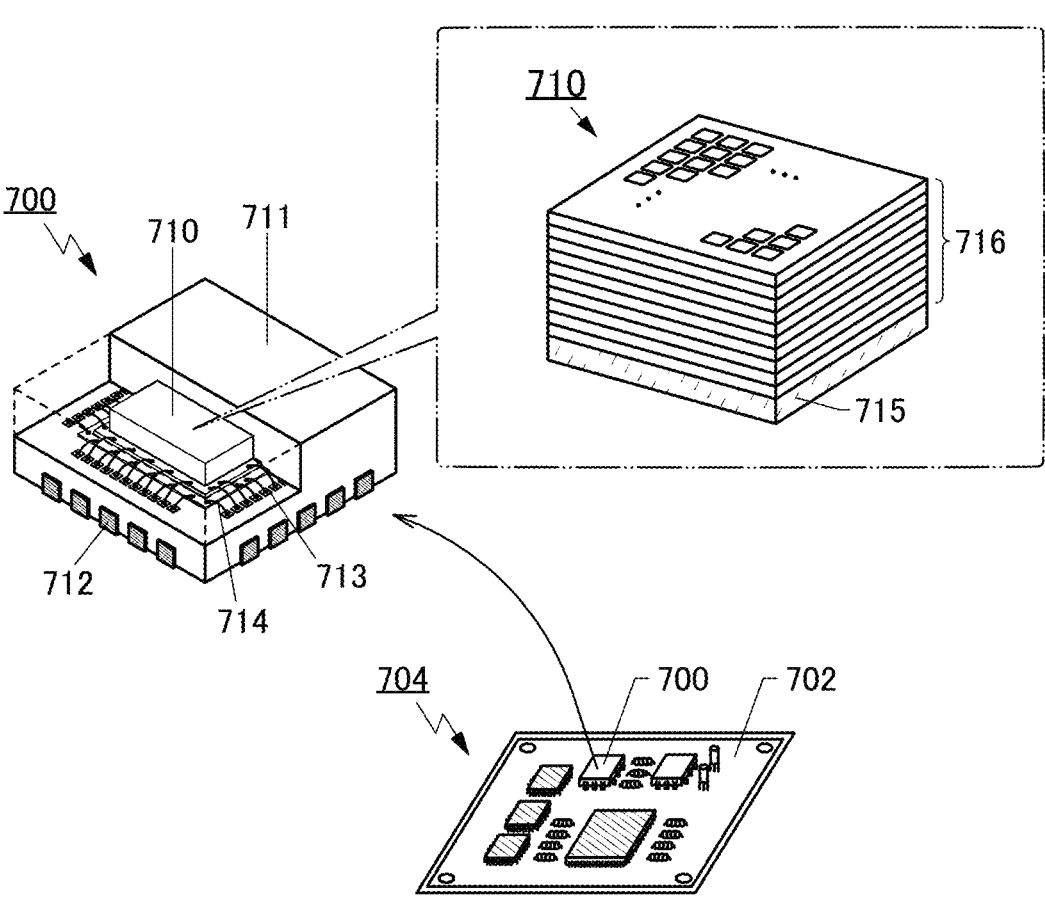
FIG. 31A and FIG. 31B are diagrams each illustrating an example of an electronic component.

FIG. 31A is a perspective view of a substrate (a circuit board 704) on which an electronic component 700 is mounted. The electronic component 700 illustrated in FIG. 31A includes a semiconductor device 710 in a mold 711. Some components are omitted in FIG. 31A to show the inside of the electronic component 700. The electronic component 700 includes a land 712 outside the mold 711. The land 712 is electrically connected to an electrode pad 713, and the electrode pad 713 is electrically connected to the semiconductor device 710 through a wire 714. The electronic component 700 is mounted on a printed circuit board 702, for example. A plurality of such electronic components are combined and electrically connected to each other on the printed circuit board 702, which forms the circuit board 704.

The semiconductor device 710 includes a driver circuit layer 715 and a memory layer 716. The memory layer 716 has a structure in which a plurality of memory cell arrays are stacked. A stacked-layer structure of the driver circuit layer 715 and the memory layer 716 can be a monolithic stacked-layer structure. In the monolithic stacked-layer structure, layers can be connected to each other without using a through electrode technique such as TSV or a bonding technique such as Cu-to-Cu direct bonding. The monolithic stacked-layer structure of the driver circuit layer 715 and the memory layer 716 enables, for example, what is called an on-chip memory structure in which a memory is directly formed on a processor. The on-chip memory structure allows an interface portion between the processor and the memory to operate at high speed.

With the on-chip memory structure, the sizes of a connection wiring and the like can be smaller than those in the case where the through electrode technique such as TSV is employed; thus, the number of connection pins can be increased. An increase in the number of connection pins enables parallel operations, which can increase the bandwidth of the memory (also referred to as a memory bandwidth).

It is preferable that the plurality of memory cell arrays included in the memory layer 716 be formed using OS transistors and be monolithically stacked. Monolithically stacking the plurality of memory cell arrays can improve one or both of a memory bandwidth and a memory access latency. Note that a bandwidth refers to a data transfer volume per unit time, and an access latency refers to time from access to start of data transmission. In the case where the memory layer 716 is formed using Si transistors, it is difficult to obtain the monolithic stacked-layer structure as compared with the case where the memory layer 716 is formed using OS transistors. Thus, an OS transistor is superior to a Si transistor in the monolithic stacked-layer structure.

The semiconductor device 710 may be referred to as a die. In this specification and the like, a die refers to each of chip pieces obtained by dividing a circuit pattern formed on a circular substrate (also referred to as a wafer) or the like into dice in the manufacturing process of a semiconductor chip, for example. Examples of a semiconductor material that can be used for a die include silicon (Si), silicon carbide (SiC), and gallium nitride (GaN). A die obtained from a silicon substrate (also referred to as a silicon wafer) may be referred to as a silicon die, for example.

Figure 31B:
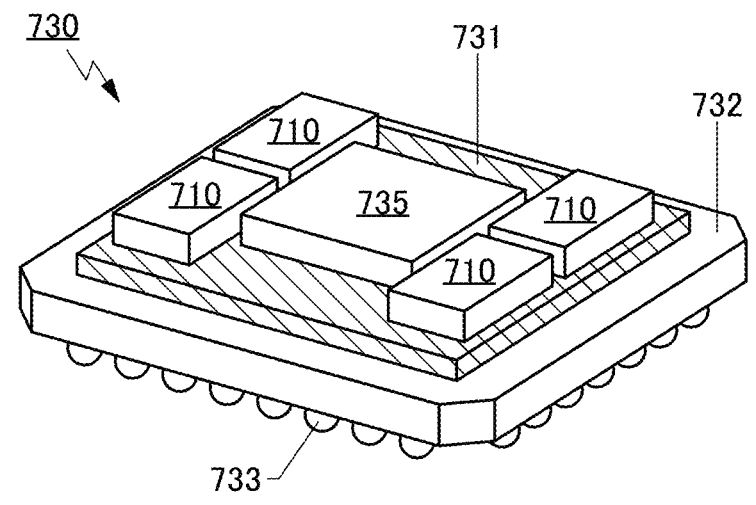

FIG. 31B is a perspective view of an electronic component 730. The electronic component 730 is an example of a SiP (System in Package) or an MCM (Multi Chip Module). In the electronic component 730, an interposer 731 is provided over a package substrate 732 (printed circuit board), and a semiconductor device 735 and a plurality of the semiconductor devices 710 are provided over the interposer 731.

The electronic component 730 that includes the semiconductor device 710 as a high bandwidth memory (HBM) is illustrated as an example. The semiconductor device 735 can be used for an integrated circuit such as a CPU (Central Processing Unit), a GPU (Graphics Processing Unit), or an FPGA (Field Programmable Gate Array).

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings are provided in a single layer or multiple layers. In addition, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. Furthermore, a through electrode is provided in the interposer 731 and the through electrode is used to electrically connect an integrated circuit and the package substrate 732 in some cases. Moreover, in the case of using a silicon interposer, a TSV can also be used as the through electrode.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP or an MCM that includes a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

Meanwhile, in the case where a plurality of integrated circuits with different terminal pitches are electrically connected to each other using a silicon interposer and TSV and the like, a space for the width of the terminal pitches and the like is needed. Thus, in the case where the size of the electronic component 730 is to be reduced, the width of the terminal pitches causes a problem, which sometimes makes it difficult to provide a large number of wirings for a wide memory bandwidth. For this reason, the above-described monolithic stacked-layer structure using OS transistors is suitable. A composite structure combining memory cell arrays stacked using TSV and monolithically stacked memory cell arrays may be employed.

In addition, a heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 710 and the semiconductor device 735 are preferably equal to each other.

To mount the electronic component 730 on another substrate, an electrode 733 may be provided on a bottom portion of the package substrate 732. FIG. 31B illustrates an example in which the electrode 733 is formed of a solder ball. Solder balls are provided in a matrix on the bottom portion of the package substrate 732, so that BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by any of various mounting methods not limited to BGA and PGA. Examples of a mounting method include an SPGA (Staggered Pin Grid Array), an LGA (Land Grid Array), a QFP (Quad Flat Package), a QFJ (Quad Flat J-leaded package), and a QFN (Quad Flat Non-leaded package).

[Electronic Device]

Figures 32A, 32B:
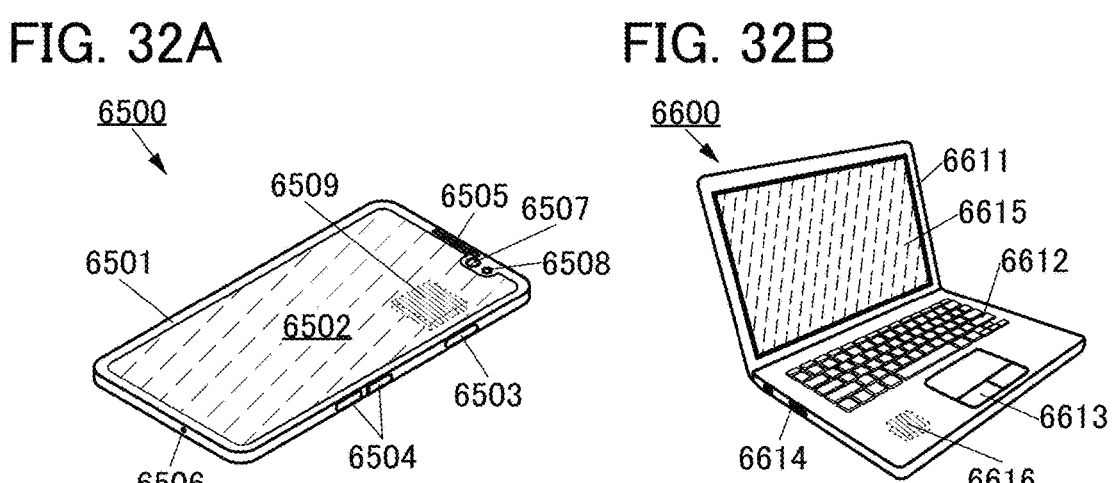
FIG. 32A and FIG. 32B are diagrams each illustrating an example of an electronic device.

FIG. 32A is a perspective view of an electronic device 6500. The electronic device 6500 illustrated in FIG. 32A is a portable information terminal that can be used as a smartphone. The electronic device 6500 includes a housing 6501, a display portion 6502, a power button 6503, buttons 6504, a speaker 6505, a microphone 6506, a camera 6507, a light source 6508, and a control device 6509. One or more selected from a CPU, a GPU, and a memory device are provided as the control device 6509, for example. The semiconductor device of one embodiment of the present invention can be used for the display portion 6502, the control device 6509, and the like.

An electronic device 6600 illustrated in FIG. 32B is an information terminal that can be used as a notebook personal computer. The electronic device 6600 includes a housing 6611, a keyboard 6612, a pointing device 6613, an external connection port 6614, a display portion 6615, and a control device 6616. One or more selected from a CPU, a GPU, and a memory device are provided as the control device 6616, for example. The semiconductor device of one embodiment of the present invention can be used for one or both of the display portion 6615 and the control device 6616. Note that the semiconductor device of one embodiment of the present invention is preferably used for the above-described control device 6509 and control device 6616, in which case power consumption can be reduced.

[Large Computer]

Figure 32C:
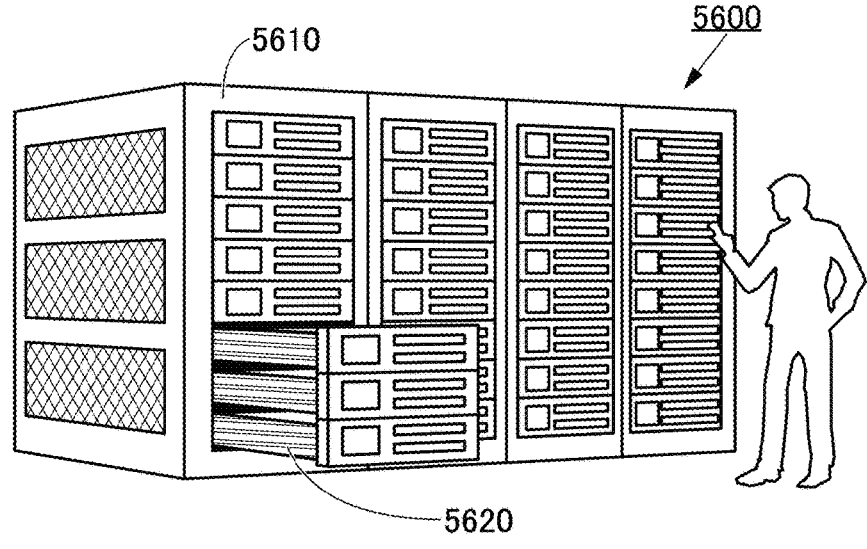
FIG. 32C to FIG. 32E are diagrams each illustrating an example of a large computer.

FIG. 32C is a perspective view of a large computer 5600. In the large computer 5600 illustrated in FIG. 32C, a plurality of rack mount computers 5620 are stored in a rack 5610. Note that the large computer 5600 may be referred to as a supercomputer.

Figures 32D, 32E:
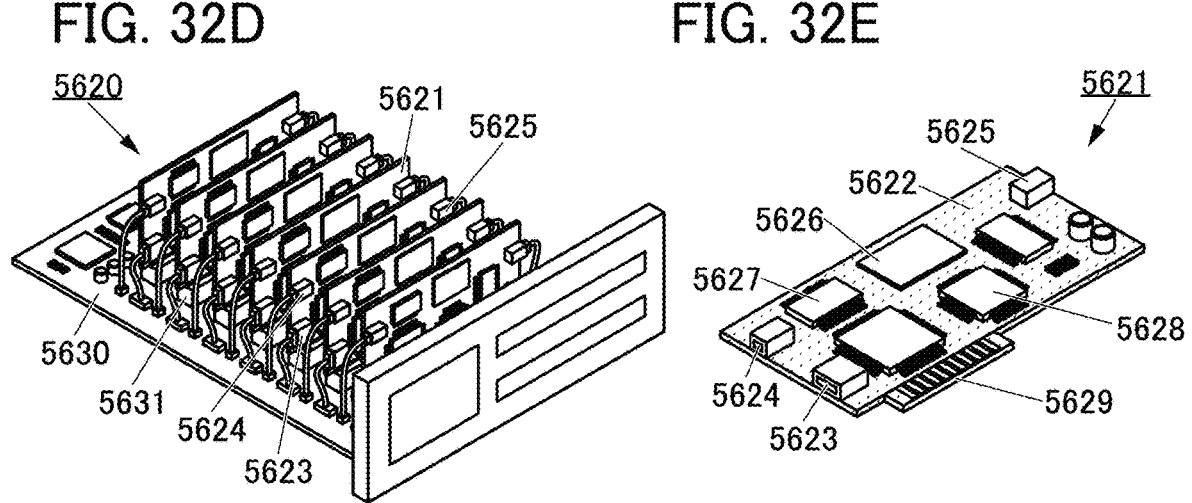

The computer 5620 can have a structure in a perspective view of FIG. 32D, for example. In FIG. 32D, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

The PC card 5621 illustrated in FIG. 32E is an example of a processing board provided with a CPU, a GPU, a memory device, and the like. The PC card 5621 includes a board 5622. The board 5622 includes the connection terminal 5623, the connection terminal 5624, and the connection terminal 5625, a semiconductor device 5626, a semiconductor device 5627, a semiconductor device 5628, and a connection terminal 5629. Although FIG. 32E illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. For another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, or the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA, a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 700 can be used, for example.

The large computer 5600 can also function as a parallel computer. When the large computer 5600 is used as a parallel computer, large-scale computation necessary for artificial intelligence learning and inference can be performed, for example.

[Space Equipment]

The semiconductor device of one embodiment of the present invention can be suitably used as space equipment such as equipment that processes and stores information.

The semiconductor device of one embodiment of the present invention can include an OS transistor. A change in electrical characteristics of the OS transistor due to radiation irradiation is small. That is, the OS transistor is highly resistant to radiation and thus can be suitably used in an environment where radiation can enter. For example, the OS transistor can be suitably used in outer space.

Figure 33:
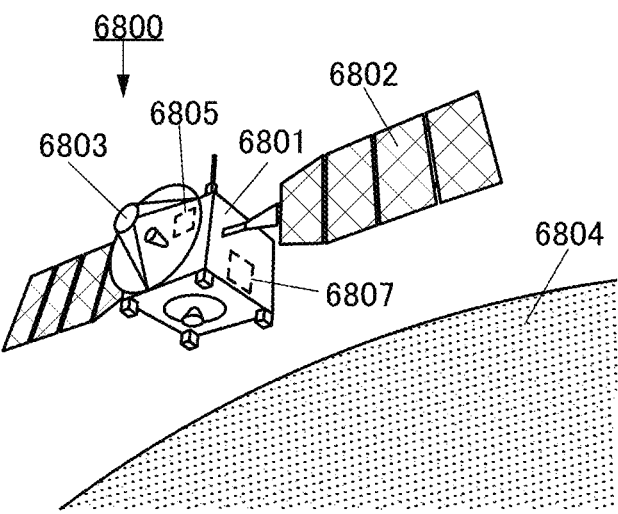
FIG. 33 is a diagram illustrating an example of a device for space.

FIG. 33 illustrates an artificial satellite 6800 as an example of space equipment. The artificial satellite 6800 includes a body 6801, a solar panel 6802, an antenna 6803, a secondary battery 6805, and a control device 6807. FIG. 33 illustrates a planet 6804 in outer space, for example. Note that outer space refers to, for example, space at an altitude greater than or equal to 100 km, and outer space in this specification may also include thermosphere, mesosphere, and stratosphere.

Although not illustrated in FIG. 33, a battery management system (also referred to as BMS) or a battery control circuit may be provided in the secondary battery 6805. The battery management system or the battery control circuit preferably includes an OS transistor, in which case power consumption is low and high reliability is achieved even in outer space.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beams, proton beams, heavy-ion beams, and meson beams.

When the solar panel 6802 is irradiated with sunlight, electric power required for an operation of the artificial satellite 6800 is generated. However, for example, in the situation where the solar panel is not irradiated with sunlight or the amount of sunlight with which the solar panel is irradiated is small, the amount of generated electric power is small. Accordingly, electric power required for an operation of the artificial satellite 6800 might not be generated. In order to operate the artificial satellite 6800 even with a small amount of generated electric power, the artificial satellite

6800 is preferably provided with the secondary battery 6805. Note that a solar panel is referred to as a solar cell module in some cases.

The artificial satellite 6800 can generate a signal. The signal is transmitted through the antenna 6803, and can be received by a ground-based receiver or another artificial satellite, for example. When the signal transmitted by the artificial satellite 6800 is received, the position of a receiver that receives the signal can be measured. Thus, the artificial satellite 6800 can constitute a satellite positioning system.

The control device 6807 has a function of controlling the artificial satellite 6800. One or more selected from a CPU, a GPU, and a memory device are used as the control device 6807, for example. Note that the semiconductor device of one embodiment of the present invention is suitably used for the control device 6807. A change in electrical characteristics due to radiation irradiation is smaller in an OS transistor than in a Si transistor. That is, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

Although the artificial satellite is described as an example of space equipment in this embodiment, one embodiment of the present invention is not limited thereto. The semiconductor device of one embodiment of the present invention can be suitably used for space equipment such as a spacecraft, a space capsule, or a space probe, for example.

As described above, an OS transistor has excellent effects of achieving a wide memory bandwidth and being highly resistant to radiation as compared with a Si transistor.

[Data Center]

The semiconductor device of one embodiment of the present invention can be suitably used for a storage system in a data center, for example. Long-term management of data, such as guarantee of data immutability, is required for the data center. The management of long-term data needs an increase in building size owing to installation of storages and servers for storing an enormous amount of data, stable electric power for data retention, cooling equipment necessary for data retention, and the like.

With the use of the semiconductor device of one embodiment of the present invention for the storage system used in the data center, electric power required for data retention can be reduced and the size of a semiconductor device retaining data can be downsized. Thus, downsizing of the storage system, downsizing of the power supply for retaining data, downscaling of the cooling equipment, and the like can be achieved, for example. This can reduce the space of the data center.

Since the semiconductor device of one embodiment of the present invention has low power consumption, heat generation from a circuit can be reduced. Accordingly, adverse effects of the heat generation on the circuit itself, the peripheral circuit, and the module can be reduced. Furthermore, the use of the semiconductor device of one embodiment of the present invention enables a data center that operates stably even in a high-temperature environment. Thus, the reliability of the data center can be increased.

Figure 34:
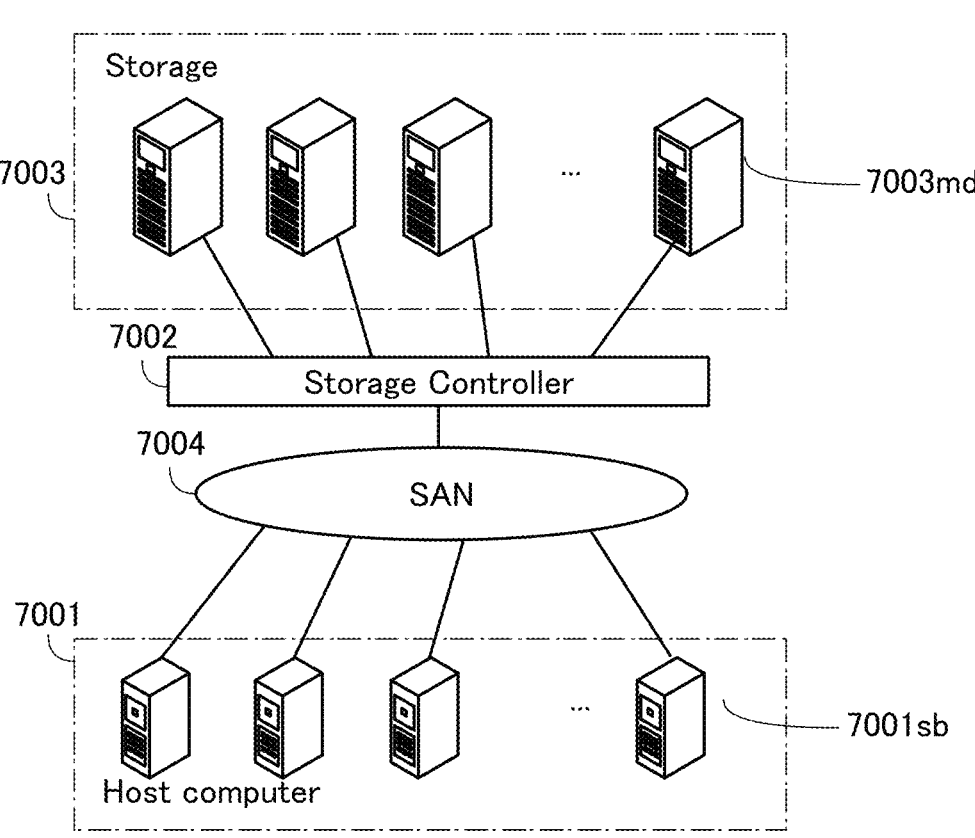
FIG. 34 is a diagram illustrating an example of a storage system applicable to a data center.

FIG. 34 illustrates a storage system that can be used in a data center. A storage system 7000 illustrated in FIG. 34 includes a plurality of servers 7001sb as a host 7001 (indicated as "Host Computer" in the diagram). The storage system 7000 includes a plurality of memory devices 7003md as a storage 7003 (indicated as "Storage" in the diagram). In the illustrated mode, the host 7001 and the storage 7003 are connected to each other through a storage area network 7004 (indicated as "SAN" in the diagram) and a storage control circuit 7002 (indicated as "Storage Controller" in the diagram).

The host 7001 corresponds to a computer that accesses data stored in the storage 7003. The host 7001 may be connected to another host 7001 through a network.

The data access speed, i.e., the time taken for storing and outputting data, of the storage 7003 is shortened by using a flash memory, but is still considerably longer than the data access speed of a DRAM (Dynamic Random Access Memory) that can be used as a cache memory in a storage. In the storage system, in order to solve the problem of low access speed of the storage 7003, a cache memory is normally provided in the storage to shorten data storage and output.

The above-described cache memory is used in the storage control circuit 7002 and the storage 7003. The data transmitted between the host 7001 and the storage 7003 is stored in the cache memories in the storage control circuit 7002 and the storage 7003 and then output to the host 7001 or the storage 7003.

The use of an OS transistor as a transistor for storing data in the cache memory to retain a potential based on data can reduce the frequency of refreshing, so that power consumption can be reduced. Furthermore, downsizing is possible by stacking memory cell arrays.

The use of the semiconductor device of one embodiment of the present invention for one or more selected from an electronic component, an electronic device, a large computer, space equipment, and a data center will produce an effect of reducing power consumption. Although demand for energy will increase with increasing performance and integration degree of semiconductor devices, the use of the semiconductor device of one embodiment of the present invention can thus reduce the emission amount of greenhouse gas typified by carbon dioxide ($CO_2$). The semiconductor device of one embodiment of the present invention can be effectively used as one of the global warming countermeasures because of its low power consumption.

Note that this embodiment can be combined with any of the other embodiments in this specification as appropriate. For example, the configurations, structures, methods, and the like described in this embodiment can be used in an appropriate combination with any of the configurations, structures, methods, and the like described in the other embodiments and the like.

REFERENCE NUMERALS

CDV: arithmetic circuit, CDVA: arithmetic circuit, circuit UNT[1], circuit UNT[2], circuit UNT[3], circuit UNT[4], circuit UNT[N], circuit UNT1[1], circuit UNT1[2], circuit UNT1[3], circuit UNT1[4], circuit UNT2[1], circuit UNT2[2], circuit UNT2[3], circuit UNT2[4], circuit UNTA[1], circuit UNTB[1], circuit UNT[t], MACA: arithmetic cell array, MEMA: memory cell array, WSD: circuit, XCS: circuit, WCS: circuit, ITRZ: circuit, WWD: circuit, RWD: circuit, CM: current generation circuit, RL: current generation circuit, RL3: converter circuit, SWC1: switching circuit, SWC2: switching circuit, CTi[1]: terminal, CTi[s]: terminal, CTo[1]: terminal, CTo[s]: terminal, RTi[1]: terminal, RTi[s]: terminal, RTo[1]: terminal, RTo[s]: terminal, T1a[1]: terminal, T1a[s]: terminal, T1b[1]: terminal, T1b[s]: terminal, T1c[1]: terminal, T1c[s]: terminal, T2a[1]: terminal, T2a[s]: terminal, T2b[1]: terminal, T2b[s]: terminal, T2c[1]: terminal, T2c[s]: terminal, JIT[1]: terminal, JIT[s]: terminal, JOT[1]: terminal, JOT[s]: terminal, OT[1]: terminal, OT[s]: terminal, ZT[1]: terminal, ZT[s]: terminal, FT[1]: terminal, FT[s]: terminal, U1: terminal, U2: terminal, IM[1, 1]: cell, IM[s, 1]: cell, IM[1, s]: cell, IM[s, s]: cell, MC[1, 1]: cell, MC[s, 1]: cell, MC[1, s]: cell, MC[s, s]: cell, WCSa[1]: circuit, WCSa[s]: circuit, XCSa[1]: circuit, XCSa[s]: circuit, ITRZa[1]: circuit, ITRZa[s]: circuit, SWCA: circuit, SWCC: circuit, SWCD: circuit, CG[1]: circuit, CG[s]: circuit, RCG[1]: circuit, RCG[s]: circuit, WSL[1]: wiring, WSL[s]: wiring, WCL[1]: wiring, WCL[s]: wiring, XCL[1]: wiring, XCL[s]: wiring, WWL[1]: wiring, WWL[s]: wiring, RWL[1]: wiring, RWL[s]: wiring, BL[1]: wiring, BL[s]: wiring, VE0: wiring, VE1: wiring, VE2: wiring, VE3: wiring, VDE: wiring, VSE: wiring, DW[1]: wiring, DW[2]: wiring, DW[M]: wiring, DX[1]: wiring, DX[2]: wiring, DX[L]: wiring, VTL: wiring, VTHL: wiring, SWLA: wiring, SWLC: wiring, SWLD: wiring, RSWL1: wiring, RSWL2: wiring, RSWL3: wiring, IM: cell, MC: cell, WSL: wiring, WCL: wiring, XCL: wiring, BL: wiring, WWL: wiring, RWL: wiring, IWT[1]: terminal, IWT[s]: terminal, IXT[1]: terminal, IXT[s]: terminal, F1: transistor, F1d: transistor, F2: transistor, F2d: transistor, F5: transistor, F5d: transistor, Tr7: transistor, Tr7m: transistor, Tr8: transistor, Tr8m: transistor, Tr9: transistor, Tr9m: transistor, Tr10: transistor, Tr10m: transistor, Tr11: transistor, Tr11m: transistor, Tr12: transistor, Tr12m: transistor, Tr13: transistor, Tr13m: transistor, Tr14: transistor, Tr14m: transistor, Tr15: transistor, Tr15m: transistor, Tr16: transistor, Tr16m: transistor, Tr17: transistor, Tr17m: transistor, C5: capacitor, C5d: capacitor, CI: constant current source, N[1, 1]: node, N[s, 1]: node, N[1, s]: node, N[s, s]: node, Nd[1]: node, Nd[s]: node, SA[1]: switch, SA[s]: switch, SA[k]: switch, SC[1]: switch, SC[s]: switch, SD[1]: switch, SD[s]: switch, SWW: switch, SWX: switch, OP1: operational amplifier, LE: load, PHRL: layer, OMML: layer, OMML1: layer, OMML2: layer, BS1: substrate, 311: substrate, 311A: substrate, 315: insulator, 316: conductor, 317: insulator, 318A: insulator, 319A: conductor, 320: insulator, 324: insulator, 326: insulator, 328: conductor, 330: conductor, 350: insulator, 352: insulator, 354: insulator, 356: conductor, 357: insulator, 360: insulator, 362: conductor, 364: insulator, 366: insulator, 368: conductor, 380: insulator, 382: insulator, 400: transistor, 700: electronic component, 702: printed circuit board, 704: circuit board, 710: semiconductor device, 711: mold, 712: land, 713: electrode pad, 714: wire, 715: driver circuit layer, 716: memory layer, 730: electronic component, 731: interposer, 732: package substrate, 735: semiconductor device, 5600: large computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: motherboard, 5631: slot, 6500: electronic device, 6501: housing, 6502: display portion, 6503: power button, 6504: button, 6505: speaker, 6506: microphone, 6507: camera, 6508: light source, 6509: control device, 6600: electronic device, 6611: housing, 6612: keyboard, 6613: pointing device, 6614: external connection port, 6615: display portion, 6616: control device, 6800: artificial satellite, 6801: body, 6802: solar panel, 6803: antenna, 6804: planet, 6805:

secondary battery, 6807: control device, 7000: storage system, 7001: host, 7001sb: server, 7002: storage control circuit, 7003: storage, 7003md: memory device, 7004: storage area network

The invention claimed is:

1. A semiconductor device comprising:

a first circuit, a second circuit, a third circuit, a fourth circuit, and a fifth circuit, wherein each of the first circuit, the second circuit, the third circuit, and the fourth circuit comprises a first cell, a second cell, a sixth circuit, a first current generation circuit, a second current generation circuit, a first input terminal, and a first output terminal, wherein the first current generation circuit comprises a second input terminal and a second output terminal, wherein the second current generation circuit comprises a third input terminal and a third output terminal, wherein the fifth circuit comprises a fourth input terminal and a fourth output terminal, wherein the first circuit comprises a fifth output terminal, wherein the first output terminal of the first circuit is electrically connected to the first input terminal of the second circuit, wherein the first output terminal of the second circuit is electrically connected to the first input terminal of the third circuit, wherein the first output terminal of the third circuit is electrically connected to the first input terminal of the fourth circuit, wherein the first output terminal of the fourth circuit is electrically connected to the first input terminal of the first circuit, wherein the fifth output terminal of the first circuit is electrically connected to the fourth input terminal of the fifth circuit, wherein in each of the first circuit, the second circuit, the third circuit, and the fourth circuit:

the first cell is electrically connected to the second input terminal of the first current generation circuit through a first wiring;

the first cell is electrically connected to the sixth circuit and the first input terminal through a second wiring;

the second cell is electrically connected to the second output terminal of the first current generation circuit and the third input terminal of the second current generation circuit through a third wiring;

the third output terminal of the second current generation circuit is electrically connected to the first output terminal;

the sixth circuit is configured to generate a first current and to output the first current to the second wiring;

the first cell is configured to retain a potential corresponding to first data;

the first cell is configured to generate a third current with an amount corresponding to a product of a value of the first data and a value corresponding to the first current flowing from the sixth circuit to the second wiring or a second current flowing from the first input terminal to the second wiring, and to output the third current to the first wiring;

the first current generation circuit is configured to output, as a current mirror circuit, to the second output terminal, a fourth current with an amount corresponding to the amount of the third current flowing through the second input terminal;

the second cell is configured to retain a first potential corresponding to the fourth current;

the second cell is configured to generate a fifth current corresponding to the first potential and to output the fifth current to the third wiring; and the second current generation circuit is configured to output, as an arithmetic circuit of a function system, to the third output terminal, a sixth current with an amount corresponding to an amount of the fifth current flowing through the third input terminal;

wherein in the first circuit, the second cell is electrically connected to the fifth output terminal through the third wiring, and wherein the fifth circuit is configured to output, to the fourth output terminal, a digital potential corresponding to an amount of a current flowing through the fourth input terminal.

2. The semiconductor device according to claim 1, wherein each of the first circuit, the second circuit, the third circuit, and the fourth circuit comprises a first switching circuit, wherein the first circuit comprises a second switching circuit, wherein the first switching circuit comprises a first terminal, a second terminal, and a third terminal, wherein the second switching circuit comprises a fourth terminal, a fifth terminal, and a sixth terminal, wherein in each of the first circuit, the second circuit, the third circuit, and the fourth circuit:

the first terminal of the first switching circuit is electrically connected to the second wiring;

the second terminal of the first switching circuit is electrically connected to the sixth circuit; and the third terminal of the first switching circuit is electrically connected to the first input terminal, and wherein in the first circuit:

the fourth terminal of the second switching circuit is electrically connected to the third wiring;

the fifth terminal of the second switching circuit is electrically connected to the third input terminal of the second current generation circuit; and the sixth terminal of the second switching circuit is electrically connected to the fifth output terminal.

3. The semiconductor device according to claim 2, wherein each of the first circuit, the second circuit, the third circuit, and the fourth circuit comprises a seventh circuit, and wherein in each of the first circuit, the second circuit, the third circuit, and the fourth circuit:

the seventh circuit is electrically connected to the first wiring; and the seventh circuit is configured to make a seventh current corresponding to the first data flow to the first cell.

4. The semiconductor device according to claim 3, further comprising:

a first substrate and a second substrate positioned below the first substrate, wherein the first circuit and the third circuit are positioned over the first substrate, wherein the second circuit and the fourth circuit are positioned over the second substrate, wherein the second circuit overlaps with a part of the first circuit and a part of the third circuit, and wherein the fourth circuit overlaps with a part of the first circuit and a part of the third circuit.

5. The semiconductor device according to claim 4,
wherein each of the first circuit, the second circuit, the third circuit, and the fourth circuit comprises a first layer and a second layer positioned above the first layer, and
wherein in each of the first circuit, the second circuit, the third circuit, and the fourth circuit:
    the first layer comprises the sixth circuit, the first current generation circuit, and the second current generation circuit; and
    the second layer comprises the first cell and the second cell.

6. The semiconductor device according to claim 5, further comprising:
a third cell,
wherein each of the first cell and the third cell comprises a first transistor, a second transistor, and a first capacitor,
wherein a channel formation region of each of the first transistor and the second transistor comprises a first oxide semiconductor,
wherein the first oxide semiconductor comprises one or more selected from indium, zinc, and an element M,
wherein the element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony,
wherein in each of the first cell and the second cell:
    one of a source and a drain of the first transistor is electrically connected to a gate of the second transistor;
    one of a source and a drain of the second transistor is electrically connected to the other of the source and the drain of the first transistor; and
    one of a pair of terminals of the first capacitor is electrically connected to the gate of the second transistor,
wherein in the first cell:
    the other of the source and the drain of the first transistor is electrically connected to the first wiring; and
    the other of the pair of terminals of the first capacitor is electrically connected to the second wiring, and
wherein in the third cell:
    the other of the source and the drain of the first transistor is electrically connected to the second wiring; and
    the other of the pair of terminals of the first capacitor is electrically connected to the second wiring.

7. The semiconductor device according to claim 6,
wherein the second cell comprises a third transistor, a fourth transistor, a fifth transistor, and a second capacitor,
wherein a channel formation region of each of the third transistor, the fourth transistor, and the fifth transistor comprises a second oxide semiconductor,
wherein the second oxide semiconductor comprises one or more selected from indium, zinc, and the element M, and
wherein in the second cell:
    one of a source and a drain of the third transistor is electrically connected to a gate of the fourth transistor;

one of a source and a drain of the fourth transistor is electrically connected to one of a source and a drain of the fifth transistor;
    the other of the source and the drain of the fifth transistor is electrically connected to the other of the source and the drain of the third transistor;
    one of a pair of terminals of the second capacitor is electrically connected to the gate of the fourth transistor; and
    the other of the source and the drain of the third transistor is electrically connected to the third wiring.

8. A semiconductor device comprising:
a first circuit, a second circuit, a third circuit, a fourth circuit, and a fifth circuit,
wherein each of the first circuit, the second circuit, the third circuit, and the fourth circuit comprises a first cell, a second cell, a sixth circuit, a first current generation circuit, a second current generation circuit, a first input terminal, and a first output terminal,
wherein the first current generation circuit comprises a second input terminal and a second output terminal,
wherein the second current generation circuit comprises a third input terminal and a third output terminal,
wherein the fifth circuit comprises a fourth input terminal and a fourth output terminal,
wherein the fourth circuit comprises a fifth output terminal,
wherein the first output terminal of the first circuit is electrically connected to the first input terminal of the second circuit,
wherein the first output terminal of the second circuit is electrically connected to the first input terminal of the third circuit,
wherein the first output terminal of the third circuit is electrically connected to the first input terminal of the fourth circuit,
wherein the fifth output terminal of the fourth circuit is electrically connected to the fourth input terminal of the fifth circuit,
wherein in each of the first circuit, the second circuit, the third circuit, and the fourth circuit:
    the first cell is electrically connected to the second input terminal of the first current generation circuit through a first wiring;
    the first cell is electrically connected to the sixth circuit and the first input terminal through a second wiring;
    the second cell is electrically connected to the second output terminal of the first current generation circuit and the third input terminal of the second current generation circuit through a third wiring;
    the third output terminal of the second current generation circuit is electrically connected to the first output terminal;
    the sixth circuit is configured to generate a first current and to output the first current to the second wiring;
    the first cell is configured to retain a potential corresponding to first data;
    the first cell is configured to generate a third current with an amount corresponding to a product of a value of the first data and a value corresponding to the first current flowing from the sixth circuit to the second wiring or a second current flowing from the first input terminal to the second wiring, and to output the third current to the first wiring;
    the first current generation circuit is configured to output, as a current mirror circuit, to the second output terminal, a fourth current with an amount corresponding to the amount of the third current flowing through the second input terminal;

the second cell is configured to retain a first potential corresponding to the fourth current;

the second cell is configured to generate a fifth current corresponding to the first potential and to output the fifth current to the third wiring; and the second current generation circuit is configured to output, as an arithmetic circuit of a function system, to the third output terminal, a sixth current with an amount corresponding to an amount of the fifth current flowing through the third input terminal;

wherein in the fourth circuit, the second cell is electrically connected to the fifth output terminal through the third wiring; and wherein the fifth circuit is configured to output, to the fourth output terminal, a digital potential corresponding to an amount of a current flowing through the fourth input terminal.

9. The semiconductor device according to claim 8, wherein each of the first circuit, the second circuit, the third circuit, and the fourth circuit comprises a first switching circuit, wherein the fourth circuit comprises a second switching circuit, wherein the first switching circuit comprises a first terminal, a second terminal, and a third terminal, wherein the second switching circuit comprises a fourth terminal, a fifth terminal, and a sixth terminal, wherein in each of the first circuit, the second circuit, the third circuit, and the fourth circuit:

the first terminal of the first switching circuit is electrically connected to the second wiring;

the second terminal of the first switching circuit is electrically connected to the sixth circuit; and the third terminal of the first switching circuit is electrically connected to the first input terminal, and wherein in the fourth circuit:

the fourth terminal of the second switching circuit is electrically connected to the third wiring;

the fifth terminal of the second switching circuit is electrically connected to the third input terminal of the second current generation circuit; and the sixth terminal of the second switching circuit is electrically connected to the fifth output terminal.

10. The semiconductor device according to claim 9, wherein each of the first circuit, the second circuit, the third circuit, and the fourth circuit comprises a seventh circuit, and wherein in each of the first circuit, the second circuit, the third circuit, and the fourth circuit:

the seventh circuit is electrically connected to the first wiring; and the seventh circuit is configured to make a seventh current corresponding to the first data flow to the first cell.

11. The semiconductor device according to claim 10, further comprising:

a first substrate, a second substrate positioned above the first substrate, a third substrate positioned above the second substrate, and a fourth substrate positioned above the third substrate, wherein the first circuit is positioned over the first substrate, wherein the second circuit is positioned over the second substrate, wherein the third circuit is positioned over the third substrate, wherein the fourth circuit is positioned over the fourth substrate, wherein a part of the second circuit overlaps with a part of the first circuit, wherein a part of the third circuit overlaps with a part of the second circuit, wherein a part of the fourth circuit overlaps with a part of the third circuit, and wherein a part of the first circuit overlaps with a part of the fourth circuit.

12. The semiconductor device according to claim 11, wherein each of the first circuit, the second circuit, the third circuit, and the fourth circuit comprises a first layer and a second layer positioned above the first layer, and wherein in each of the first circuit, the second circuit, the third circuit, and the fourth circuit:

the first layer comprises the sixth circuit, the first current generation circuit, and the second current generation circuit; and the second layer comprises the first cell and the second cell.

13. The semiconductor device according to claim 12, further comprising:

a third cell, wherein each of the first cell and the third cell comprises a first transistor, a second transistor, and a first capacitor, wherein a channel formation region of each of the first transistor and the second transistor comprises a first oxide semiconductor, wherein the first oxide semiconductor comprises one or more selected from indium, zinc, and an element M, wherein the element M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, magnesium, and antimony, wherein in each of the first cell and the second cell:

one of a source and a drain of the first transistor is electrically connected to a gate of the second transistor;

one of a source and a drain of the second transistor is electrically connected to the other of the source and the drain of the first transistor; and one of a pair of terminals of the first capacitor is electrically connected to the gate of the second transistor, wherein in the first cell:

the other of the source and the drain of the first transistor is electrically connected to the first wiring; and the other of the pair of terminals of the first capacitor is electrically connected to the second wiring; and wherein in the third cell:

the other of the source and the drain of the first transistor is electrically connected to the second wiring; and the other of the pair of terminals of the first capacitor is electrically connected to the second wiring.

14. The semiconductor device according to claim 13, wherein the second cell comprises a third transistor, a fourth transistor, a fifth transistor, and a second capacitor, wherein a channel formation region of each of the third transistor, the fourth transistor, and the fifth transistor comprises a second oxide semiconductor, wherein the second oxide semiconductor comprises one or more selected from indium, zinc, and the element M, and wherein in the second cell:

one of a source and a drain of the third transistor is electrically connected to a gate of the fourth transistor;

one of a source and a drain of the fourth transistor is electrically connected to one of a source and a drain of the fifth transistor;

the other of the source and the drain of the fifth transistor is electrically connected to the other of the source and the drain of the third transistor;

one of a pair of terminals of the second capacitor is electrically connected to the gate of the fourth transistor; and the other of the source and the drain of the third transistor is electrically connected to the third wiring.

15. An electronic device comprising:
the semiconductor device according to claim 1; and
a housing.

* * * * *